(12) United States Patent
Tamada et al.

(10) Patent No.: US 6,385,084 B1
(45) Date of Patent: May 7, 2002

(54) SEMICONDUCTOR MEMORY

(75) Inventors: Satoru Tamada; Kei Maejima, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/714,965

(22) Filed: Nov. 20, 2000

(30) Foreign Application Priority Data

Jun. 14, 2000 (JP) .......................................... P12-178288

(51) Int. Cl.[7] .............................................. G11C 16/04
(52) U.S. Cl. ............................ 365/185.03; 365/185.22; 365/185.33; 365/201
(58) Field of Search ....................... 365/185.03, 185.22, 365/185.33, 201

(56) References Cited

U.S. PATENT DOCUMENTS 5,231,605 A * 7/1993 Lee ............................. 365/201
5,959,882 A * 9/1999 Yoshida et al. ........ 365/185.03
6,026,014 A * 2/2000 Sato et al. ............. 365/185.03

FOREIGN PATENT DOCUMENTS

JP          11-96791          4/1999

* cited by examiner

Primary Examiner—Vu A. Le
Assistant Examiner—VanThu Nguyen
(74) Attorney, Agent, or Firm—Oblon, Spivak, McClelland, Maier & Neustadt, P.C.

(57) ABSTRACT

To provide a semiconductor memory capable of executing a read test at a high speed based on a comparatively complicated test pattern without increasing a circuit area. Every fifth node N1 of a latch L3 of a sense latch group 3 is connected to a gate of an NMOS transistor QLi (i=0 to 3) at 4 intervals and every fifth node N2 is connected to a gate of an NMOS transistor QRi at 4 intervals. The NMOS transistor QLi has a drain connected to a decision result line CHKiL and a source grounded. The NMOS transistor QRi has a drain connected to a decision result line CHKiR and a source grounded. An ALL deciding circuit 5A outputs, as a decision result ALL5, decision result signals ALL0L to ALL3L obtained from decision result lines CHK0L to CHK3L and decision result signals ALL0R to ALL3R obtained from decision result lines CHK0R to CHK3R.

13 Claims, 62 Drawing Sheets

F I G . 4
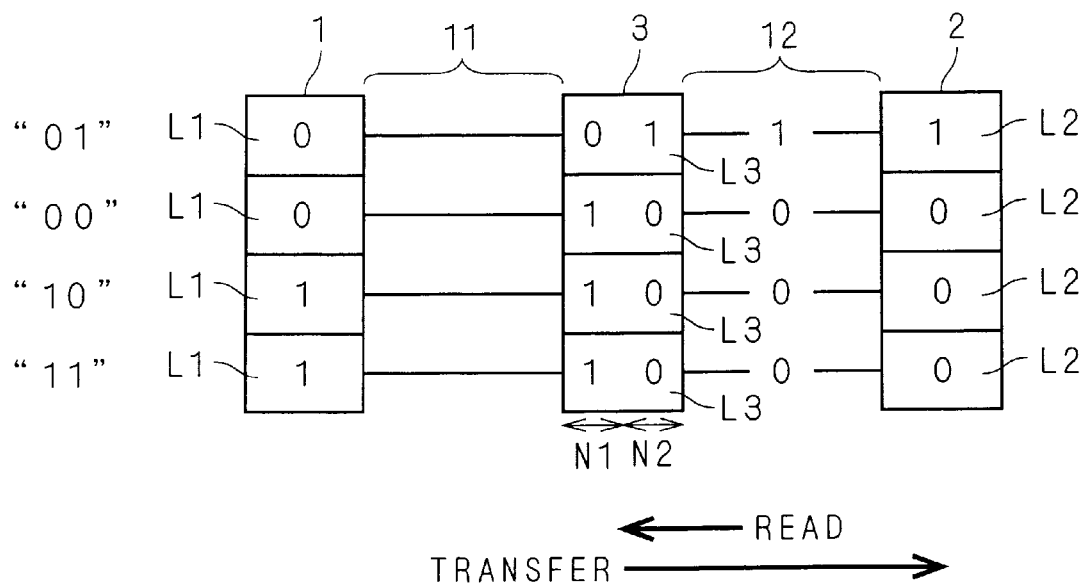
F I G . 5
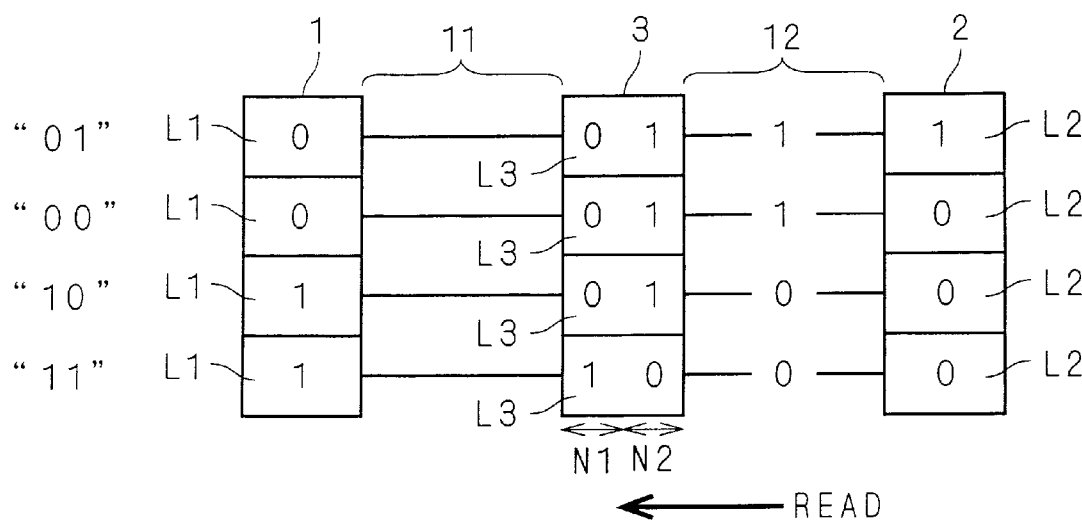

| READ DATA | | 11 | 10 | 00 | 01 |
|---|---|---|---|---|---|
| VALUE OF SENSE LATCH | READ1 | 0 | 0 | 1 | 1 |
| | READ2 | 0 | 0 | 0 | 1 |
| | READ3 | 0 | 1 | 1 | 1 |

F I G . 10
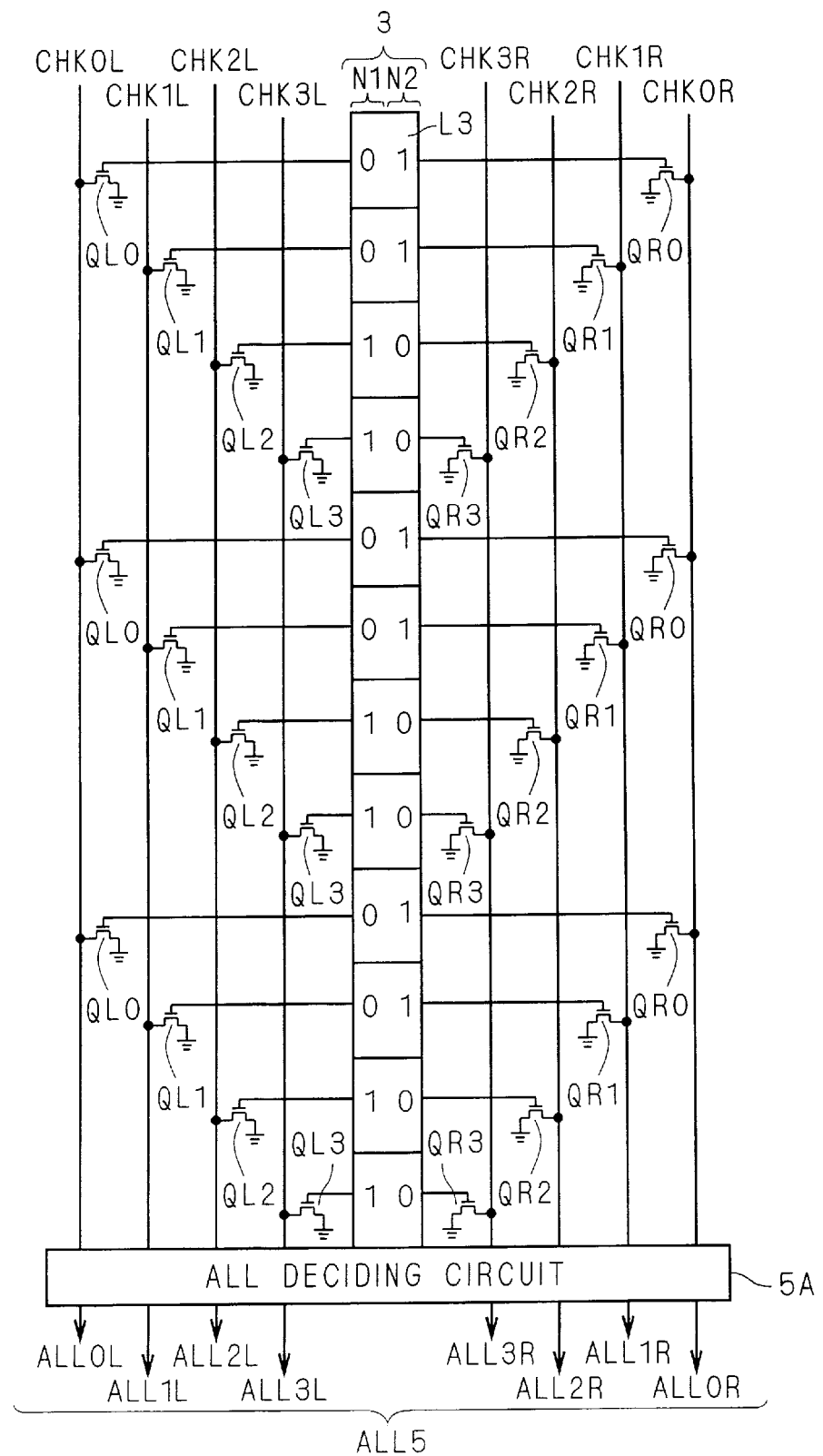

F I G . 1 1

| ALL0L (→I00) | H |
|---|---|
| ALL1L (→I01) | H |
| ALL2L (→I02) | L |
| ALL3L (→I03) | L |
| ALL0R (→I04) | L |
| ALL1R (→I05) | L |
| ALL2R (→I06) | H |
| ALL3R (→I07) | H |
| DATA OUTPUT | C3H |

F I G . 1 3

| | |
|---|---|
| ALL0L(→I00) | H |
| ALL1L(→I01) | L |
| ALL2L(→I02) | L |
| ALL3L(→I03) | L |
| ALL0R(→I04) | L |
| ALL1R(→I05) | H |
| ALL2R(→I06) | H |
| ALL3R(→I07) | H |
| DATA OUTPUT | E1H |

| | |
|---|---|
| ALL0L(→I00) | H |
| ALL1L(→I01) | H |
| ALL2L(→I02) | H |
| ALL3L(→I03) | L |
| ALL0R(→I04) | L |
| ALL1R(→I05) | L |
| ALL2R(→I06) | L |
| ALL3R(→I07) | H |
| DATA OUTPUT | 87H |

F I G. 17
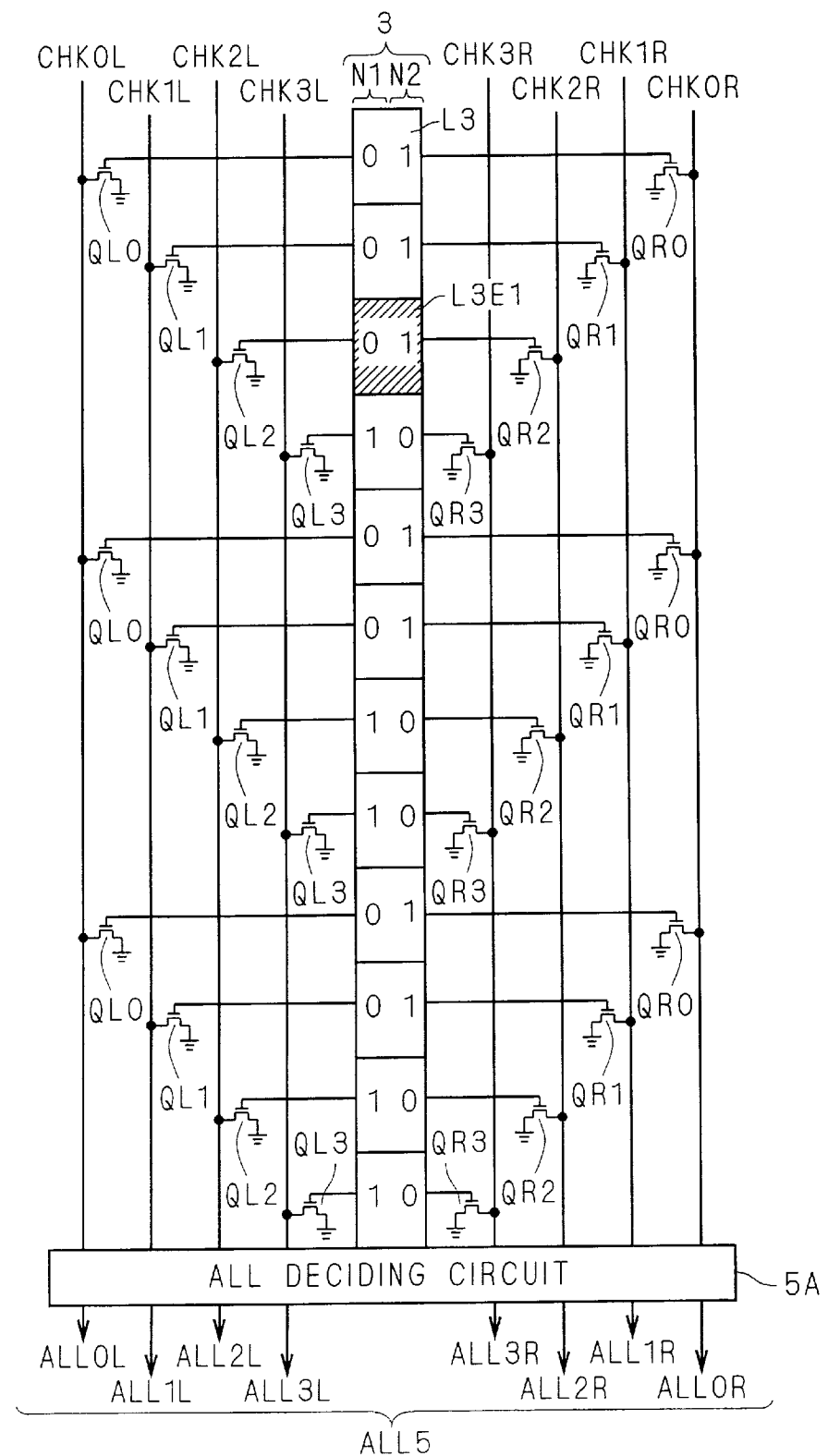

F I G . 1 8

| ALL0L (→I00) | H |
|---|---|
| ALL1L (→I01) | H |
| ALL2L (→I02) | L |
| ALL3L (→I03) | L |
| ALL0R (→I04) | L |
| ALL1R (→I05) | L |
| ALL2R (→I06) | L |
| ALL3R (→I07) | H |
| DATA OUTPUT | 83H |

F I G . 19
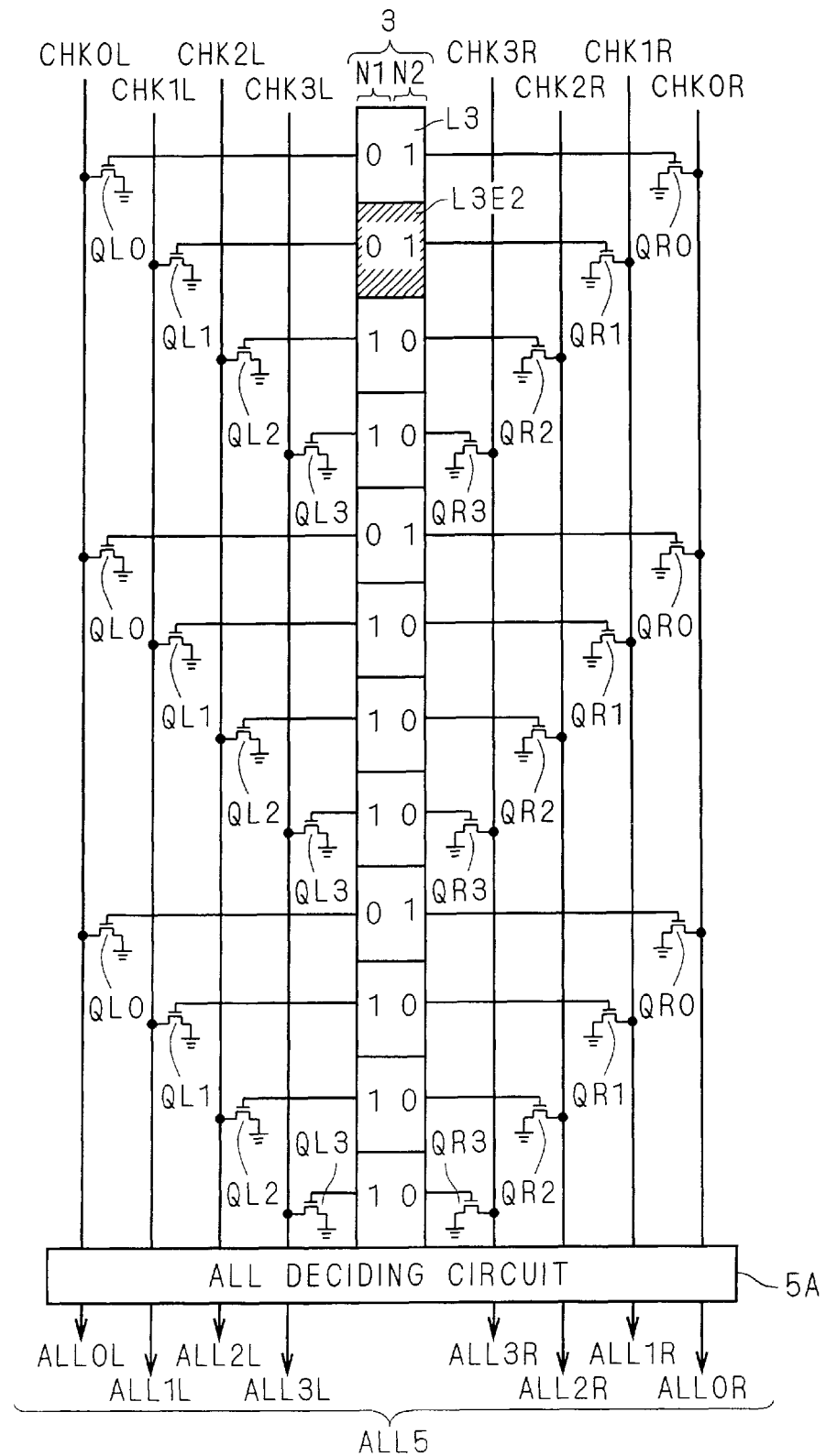

FIG. 20

| | |
|---|---|
| ALL0L (→I00) | H |
| ALL1L (→I01) | L |
| ALL2L (→I02) | L |
| ALL3L (→I03) | L |
| ALL0R (→I04) | L |
| ALL1R (→I05) | L |
| ALL2R (→I06) | H |
| ALL3R (→I07) | H |
| DATA OUTPUT | C1H |

F I G . 2 1
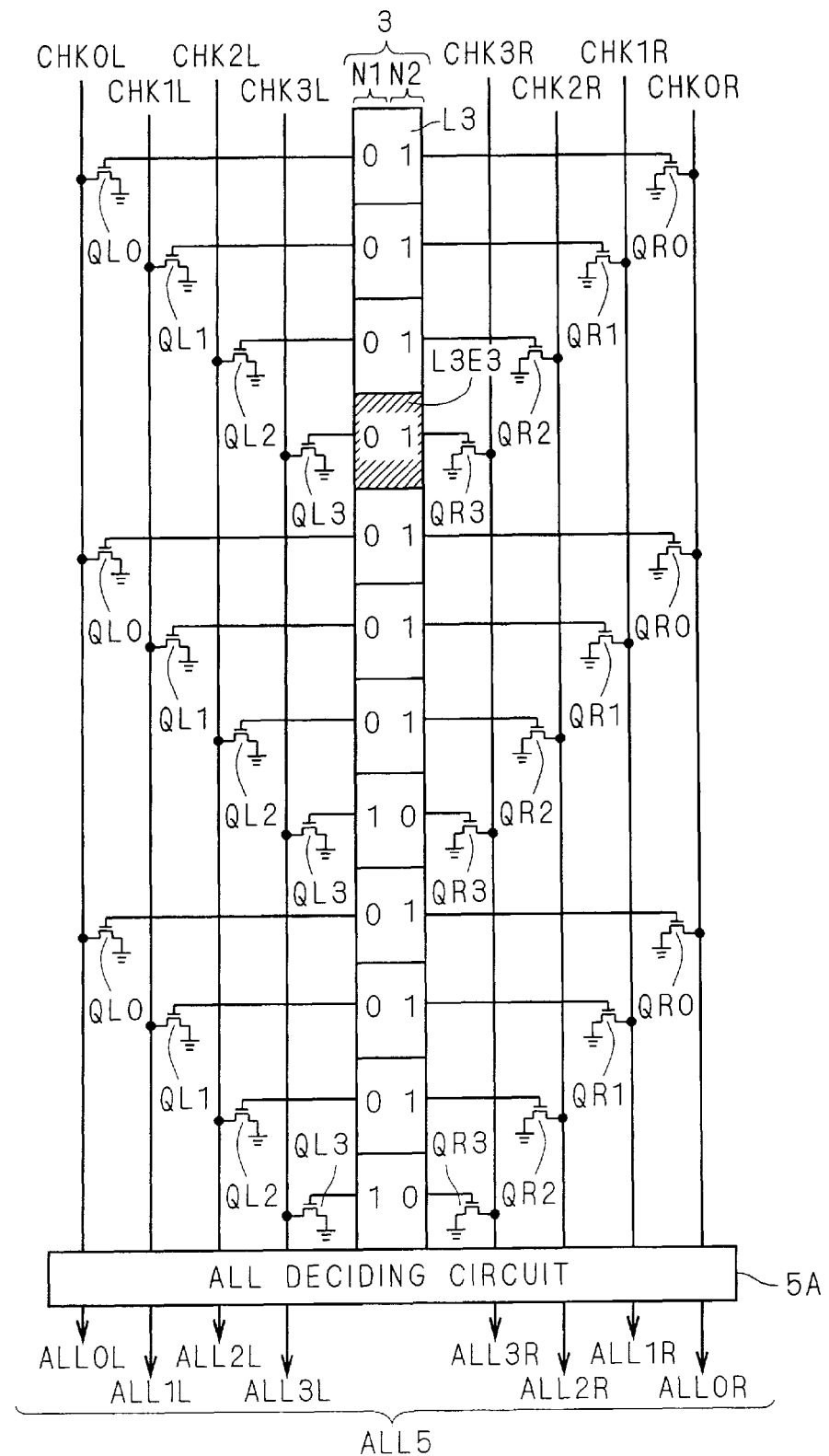

FIG. 22

| | |
|---|---|
| ALL0L(→I00) | H |
| ALL1L(→I01) | H |
| ALL2L(→I02) | H |
| ALL3L(→I03) | L |
| ALL0R(→I04) | L |
| ALL1R(→I05) | L |
| ALL2R(→I06) | L |
| ALL3R(→I07) | L |
| DATA OUTPUT | 07H |

FIG. 23

| | CHK4-A | CHK4-A | CHK4-A | CHK4-A |
|---|---|---|---|---|
| READ1 | C3H | 69H | 3CH | 96H |
| READ2 | E1H | 78H | B4H | D2H |
| READ3 | 87H | 4BH | 2DH | 1EH |

F I G . 2 8
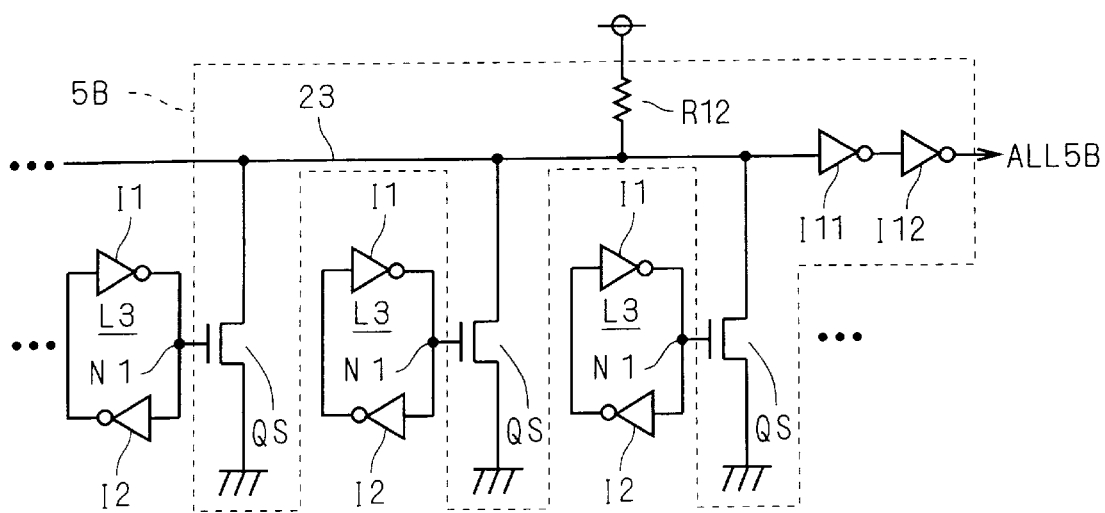

F I G . 2 9
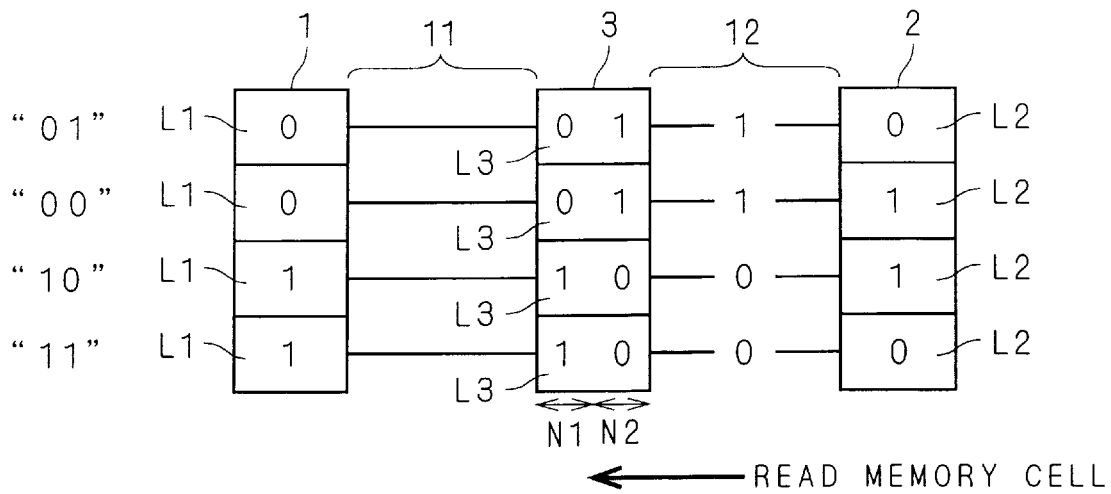
F I G . 3 0
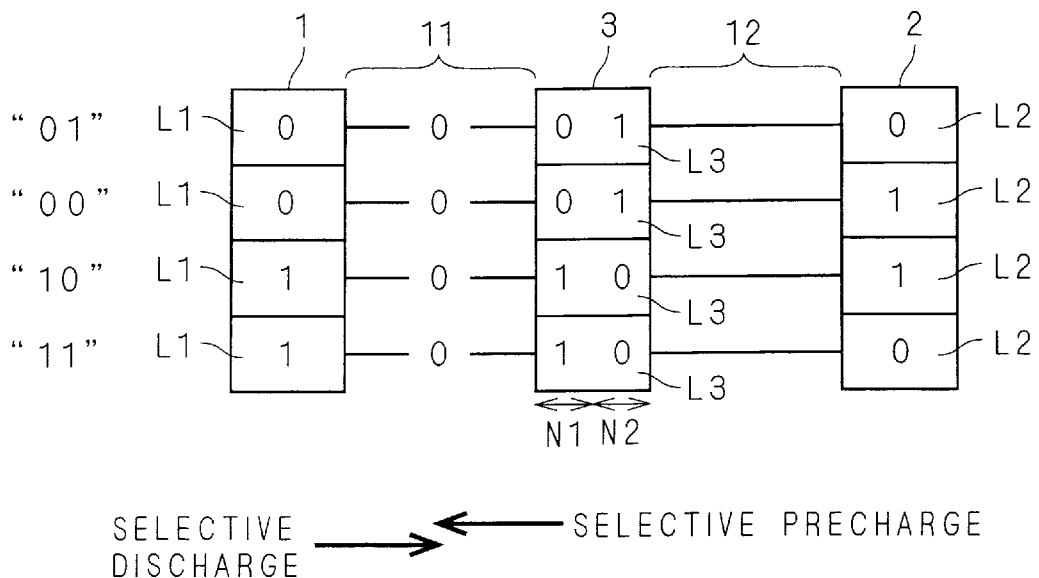

F I G . 3 7
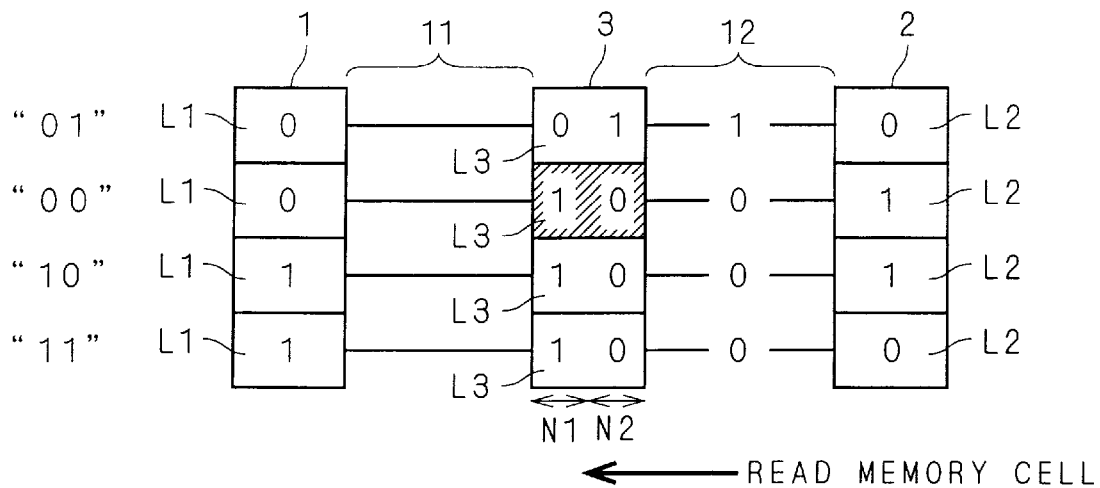
F I G . 3 8
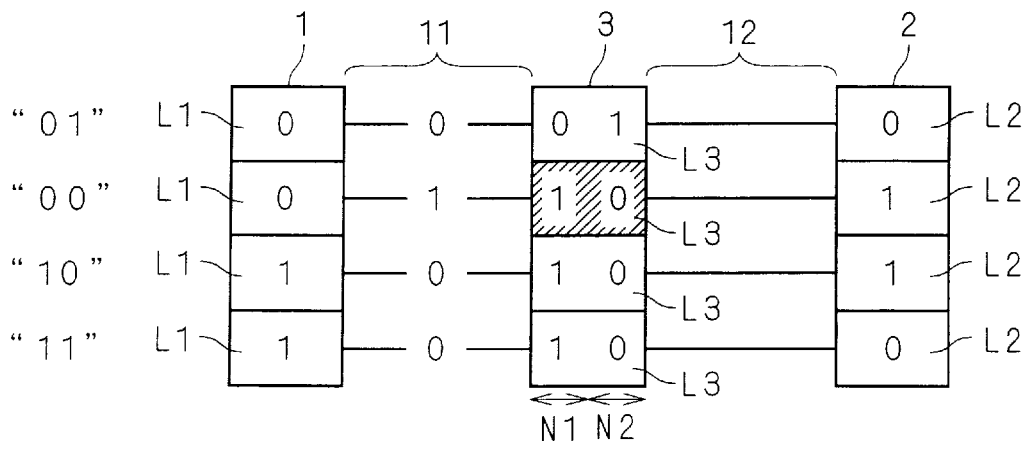

F I G . 4 1
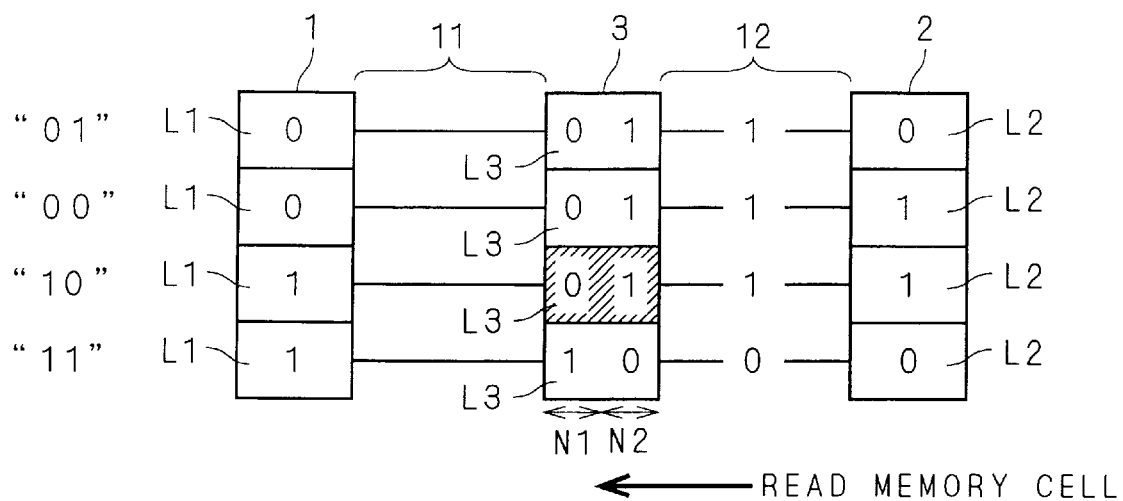
F I G . 4 2
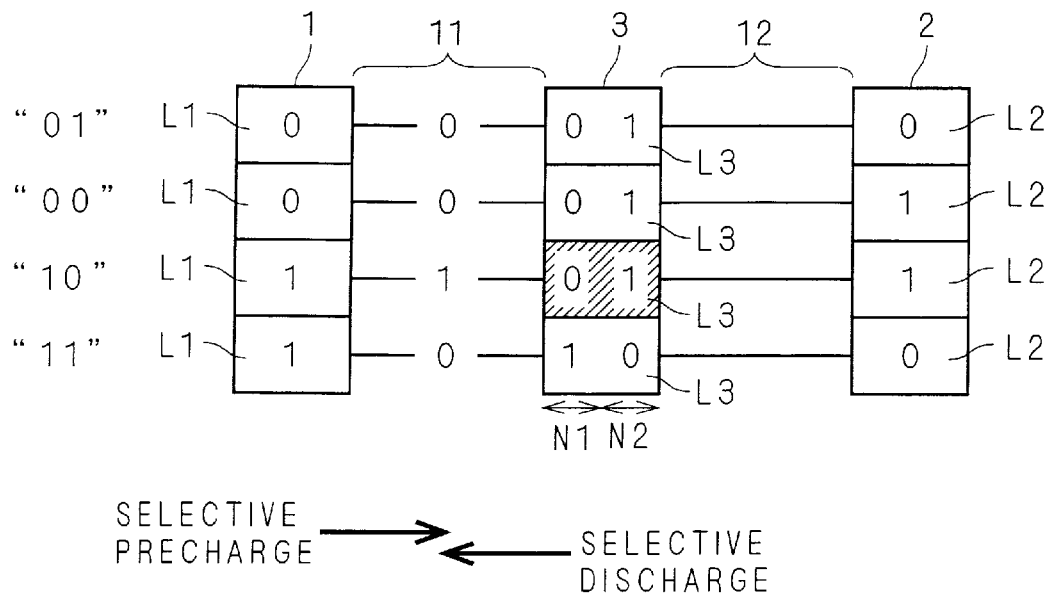

F I G . 4 5
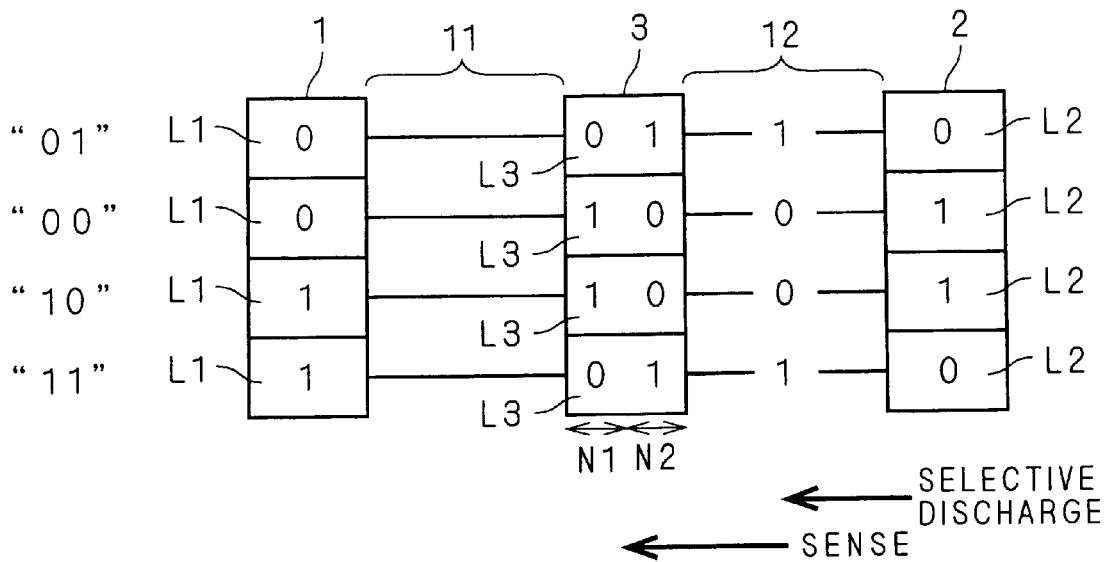
F I G . 4 6
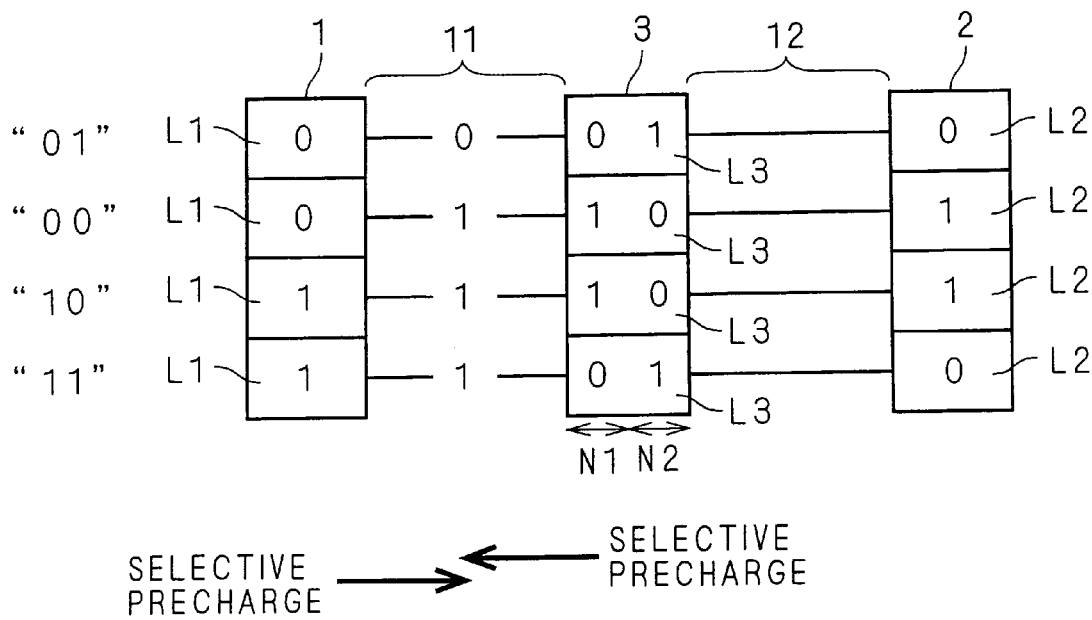

F I G . 47
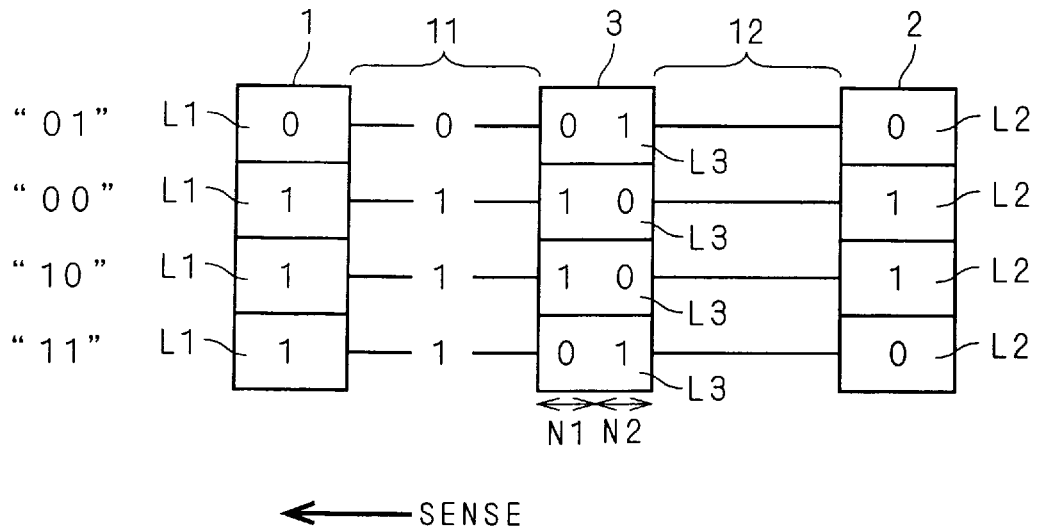
F I G . 48
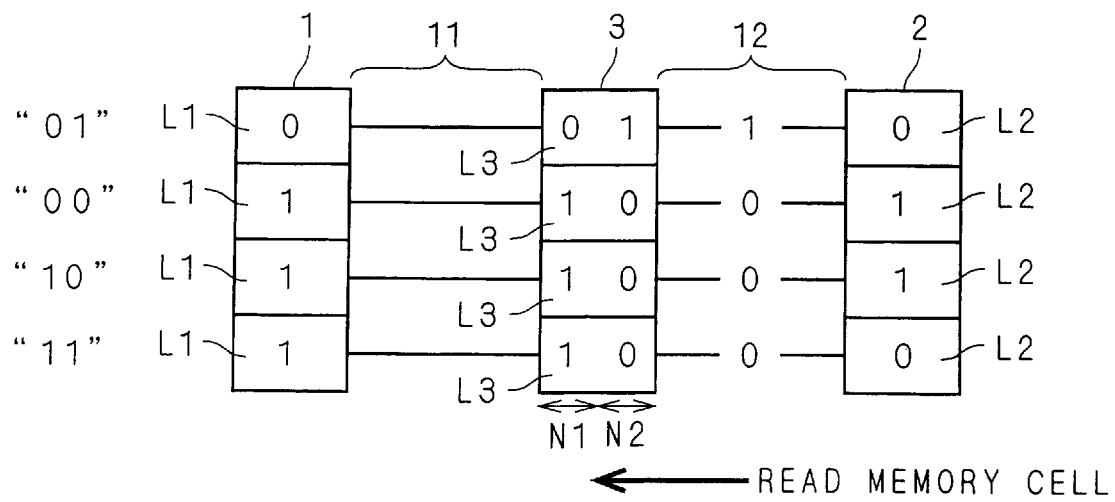

F I G . 49
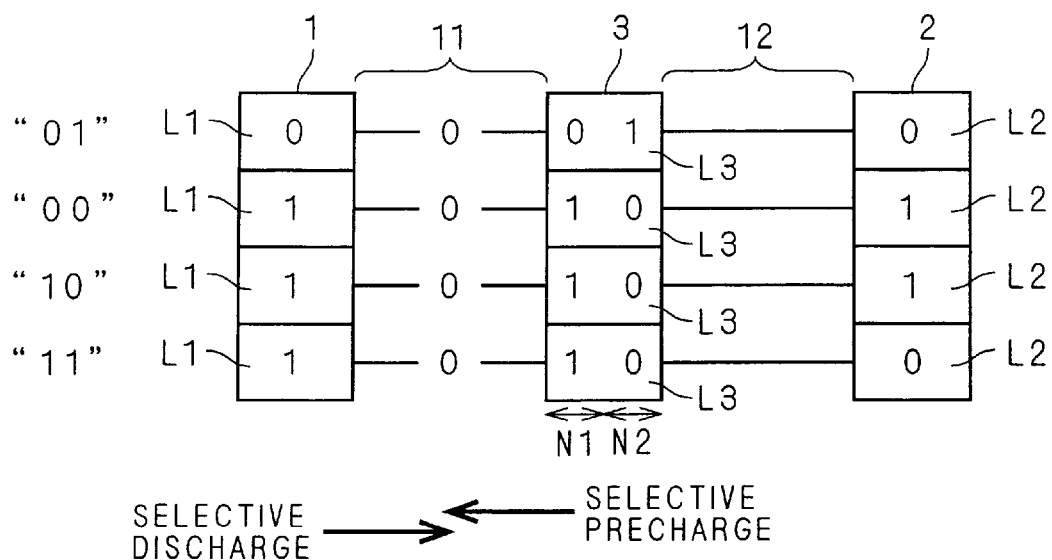
F I G . 50
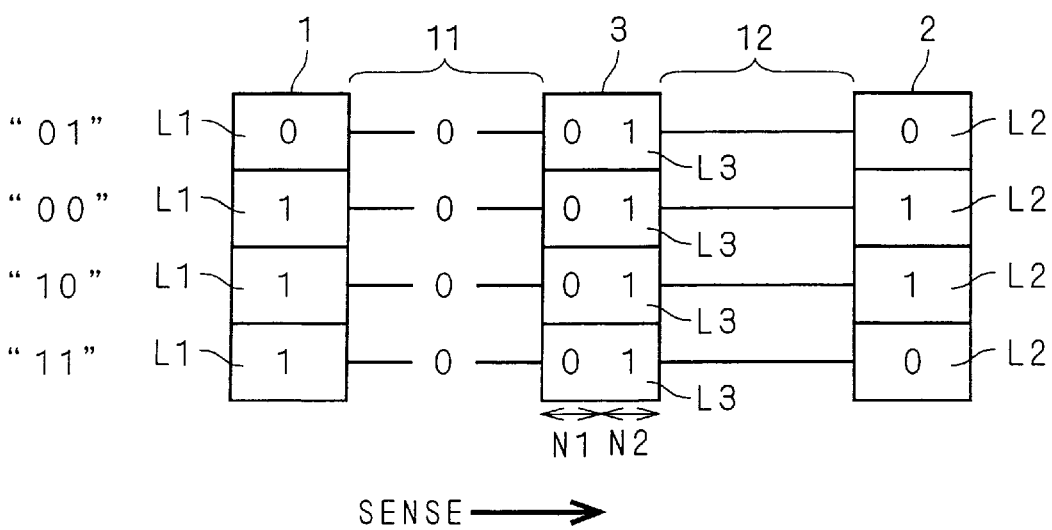

F I G . 5 1
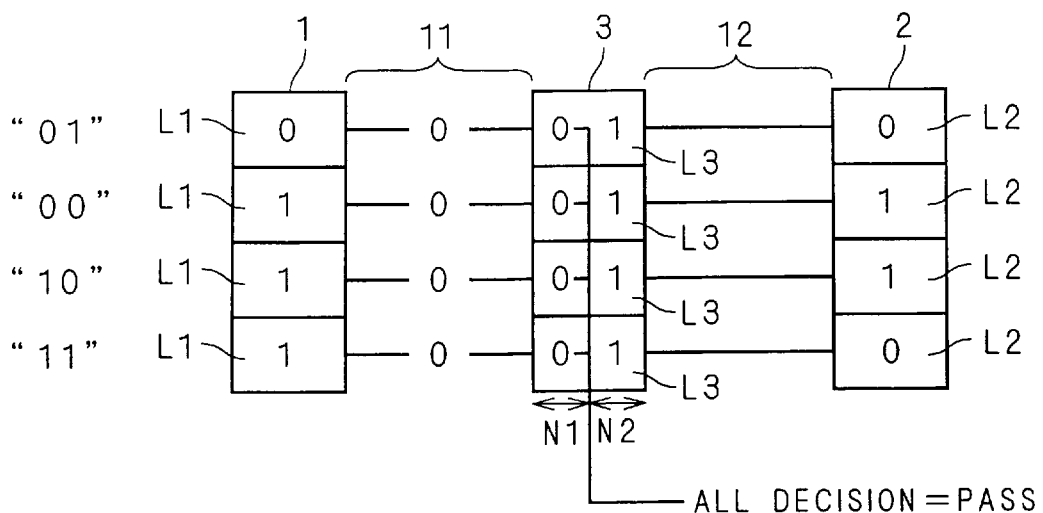
ALL DECISION = PASS
F I G . 5 2
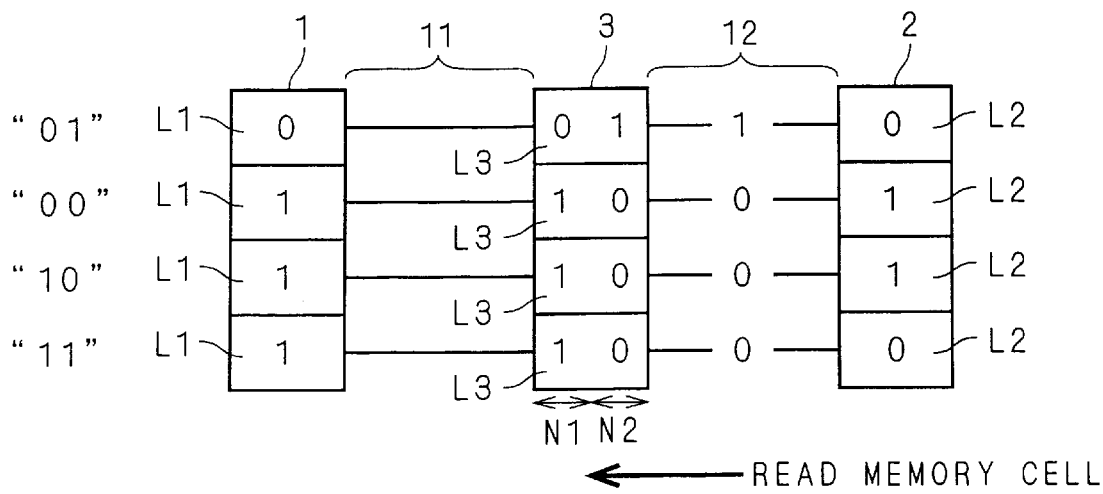
← READ MEMORY CELL F I G . 53
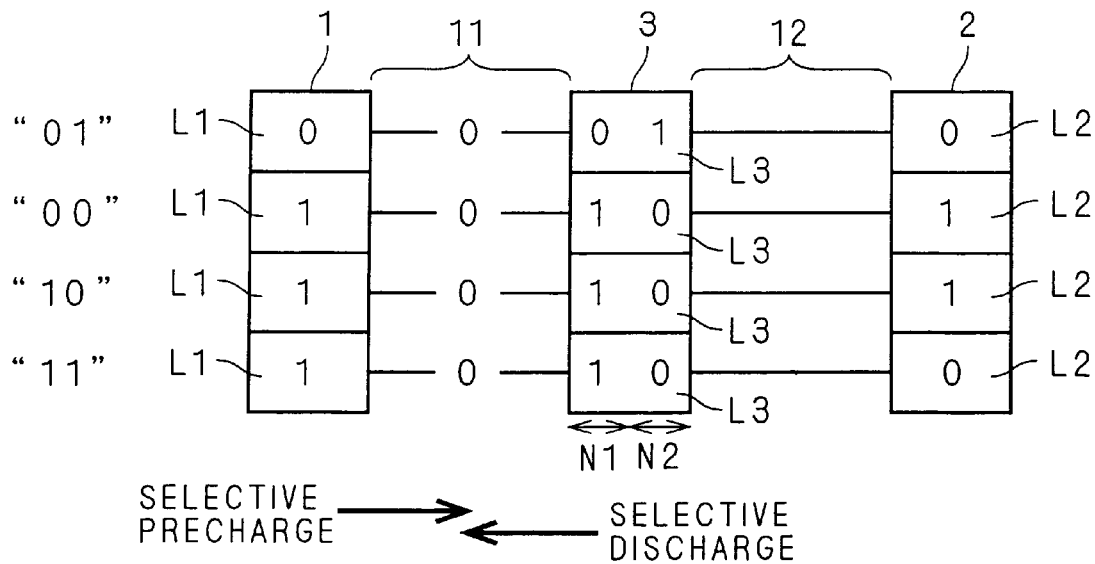
F I G . 54
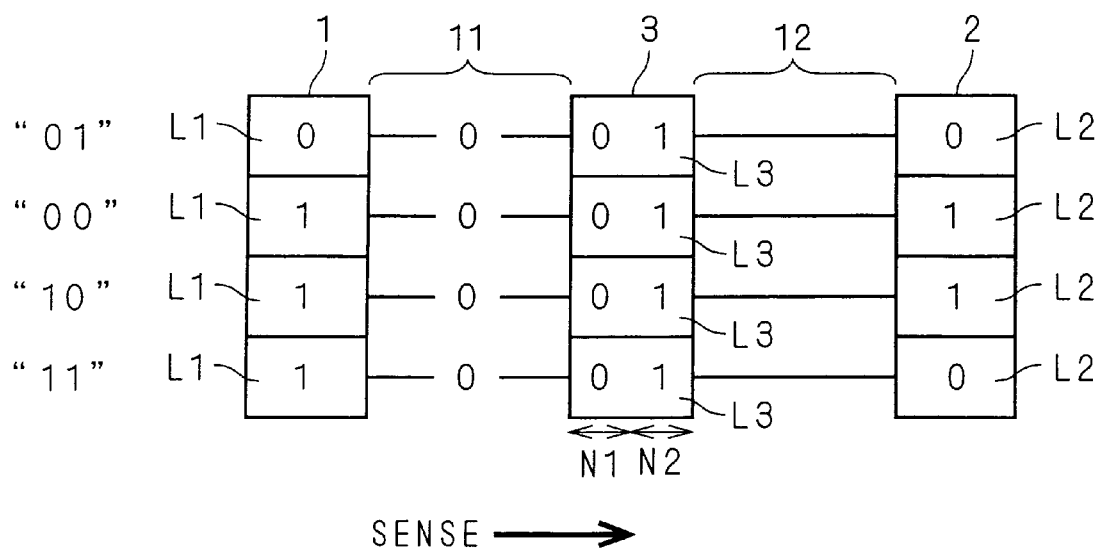

F I G . 5 5
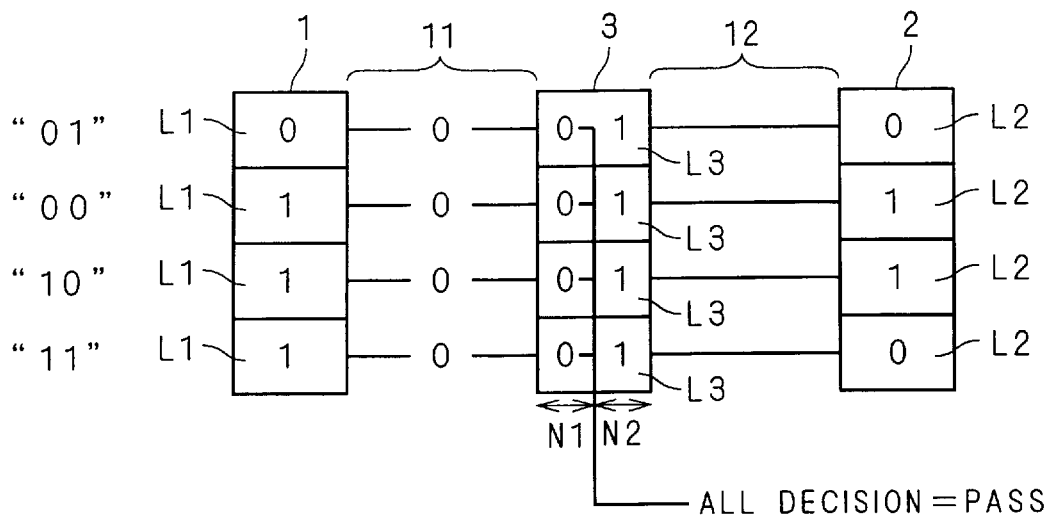
F I G . 5 6
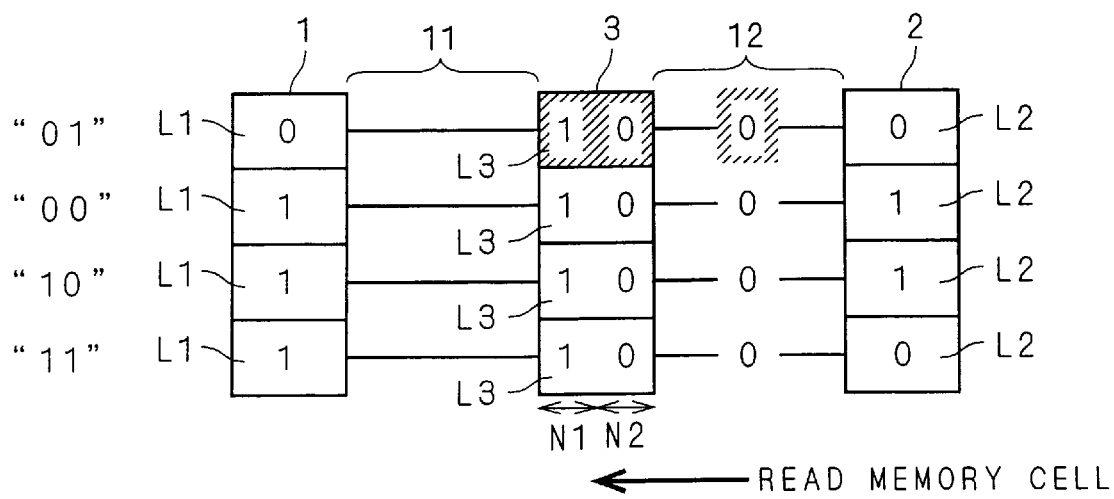

F I G . 5 9
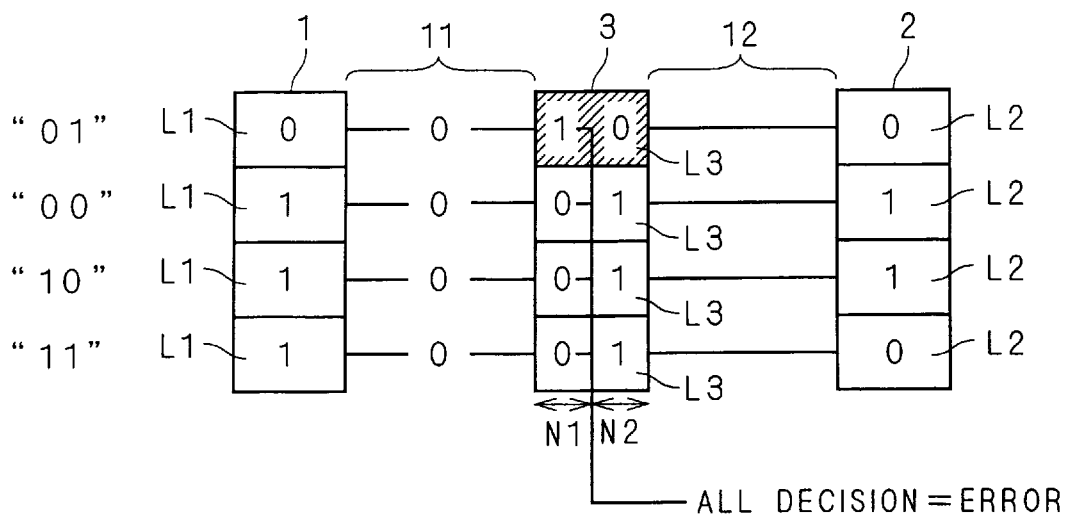
F I G . 6 0
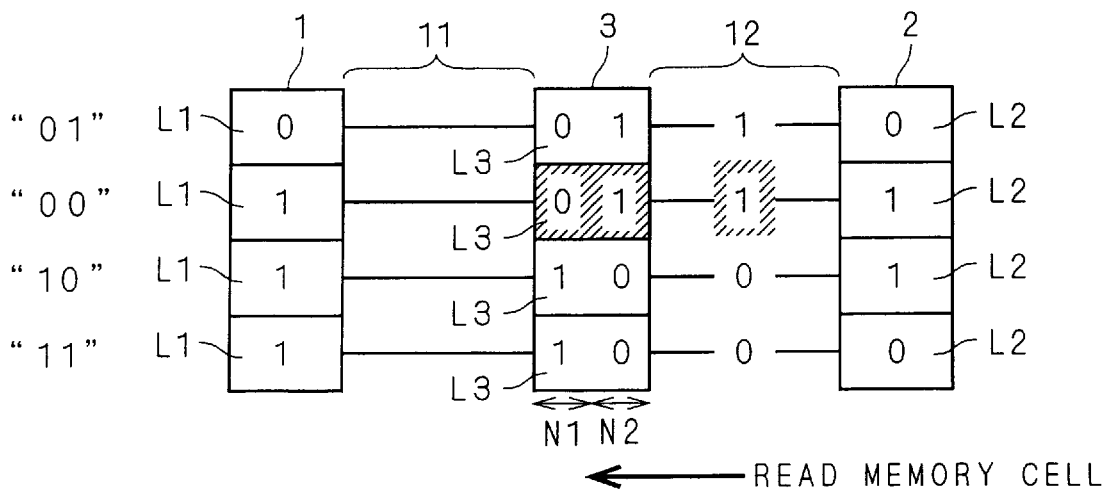

F I G . 6 7
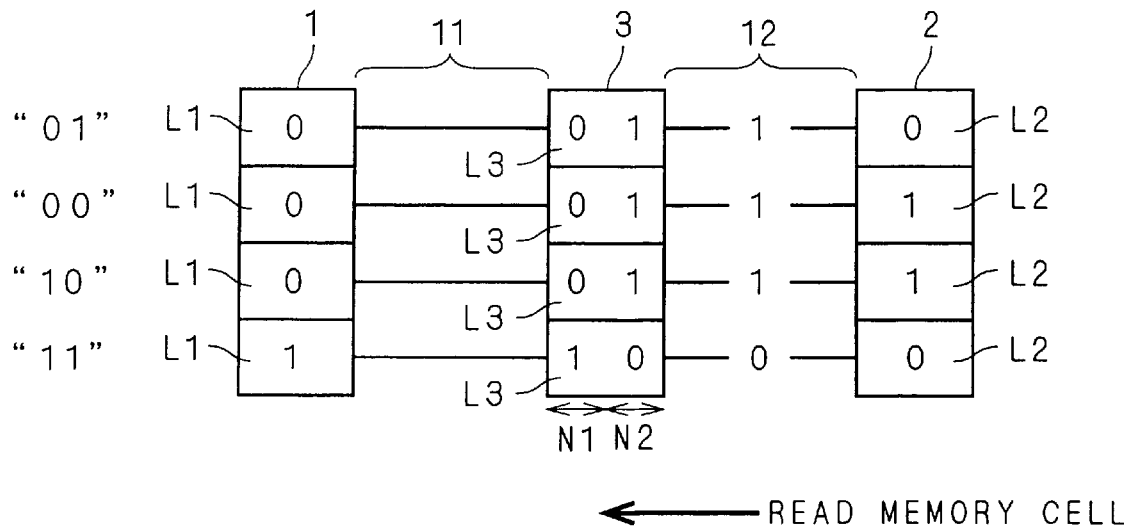
F I G . 6 8
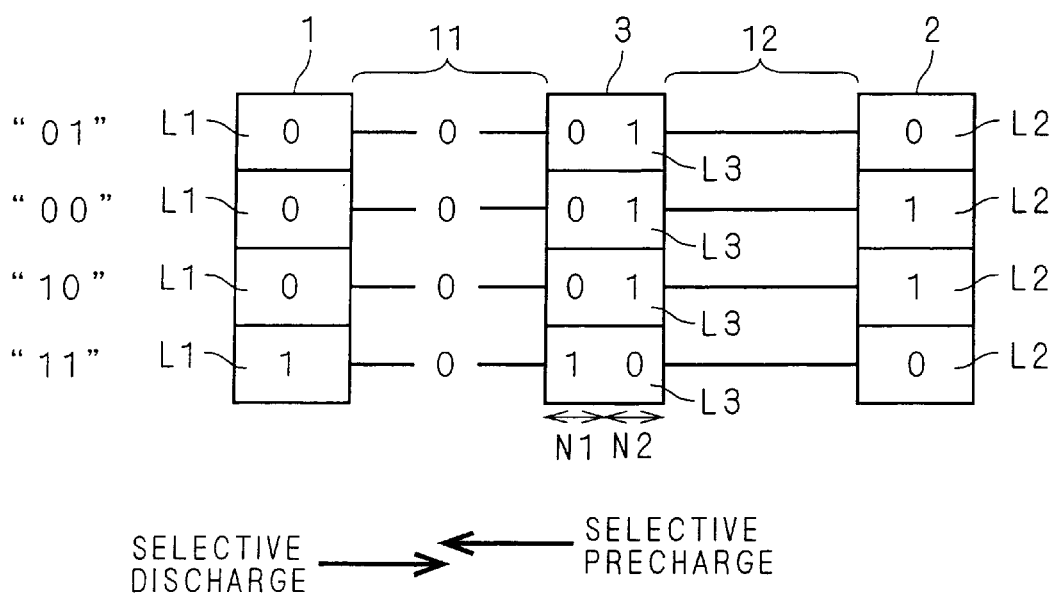

F I G . 6 9
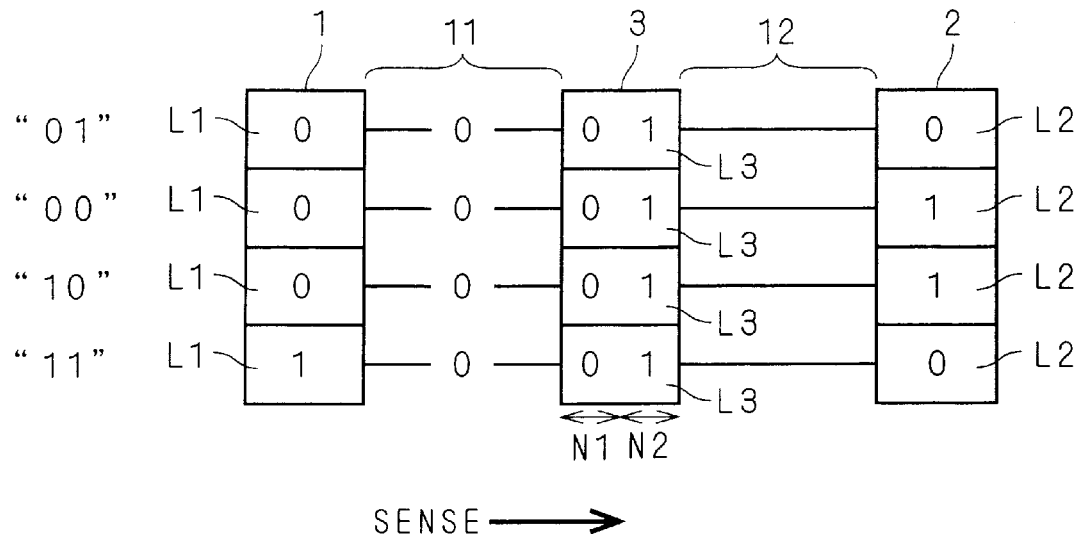
F I G . 7 0
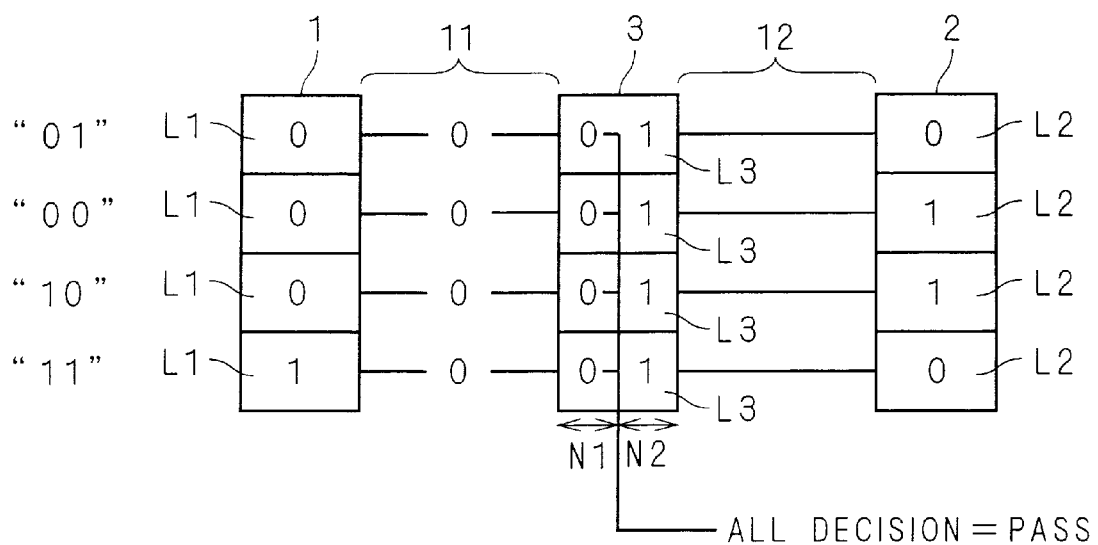

F I G . 71
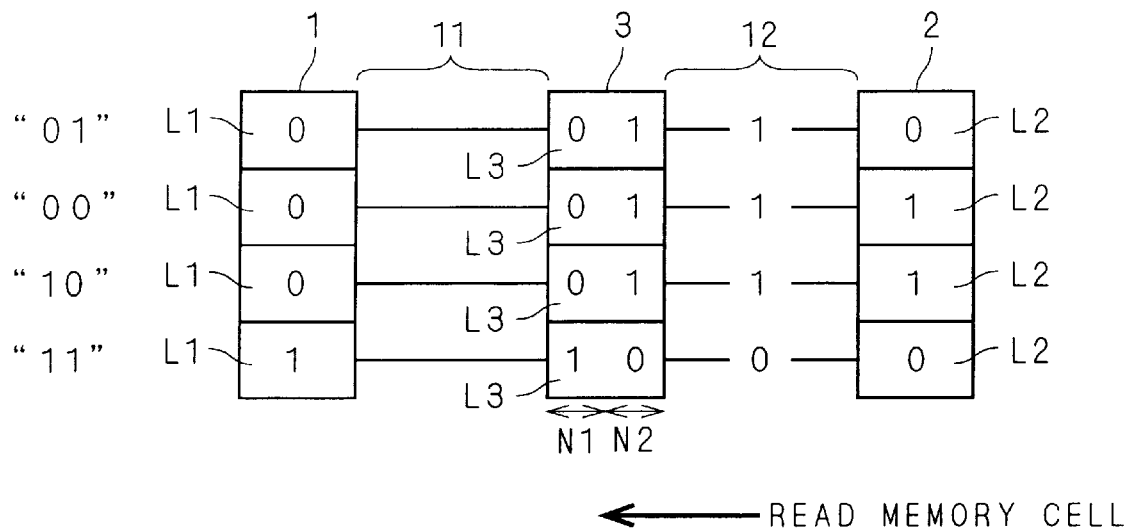
← READ MEMORY CELL
F I G . 72
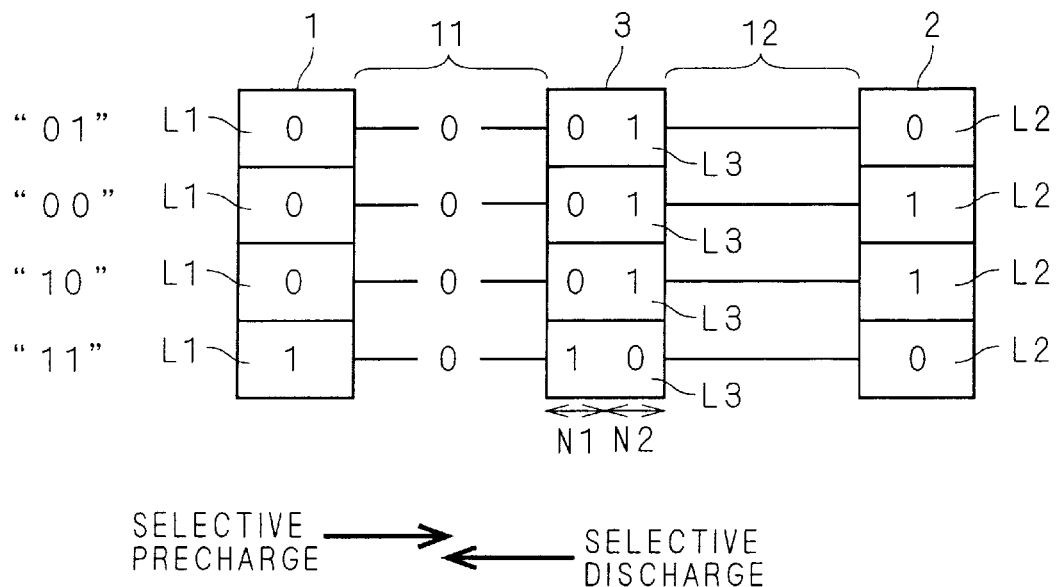
SELECTIVE PRECHARGE → ← SELECTIVE DISCHARGE

SENSE →

← READ MEMORY CELL

SELECTIVE DISCHARGE → ← SELECTIVE PRECHARGE

F I G . 7 7
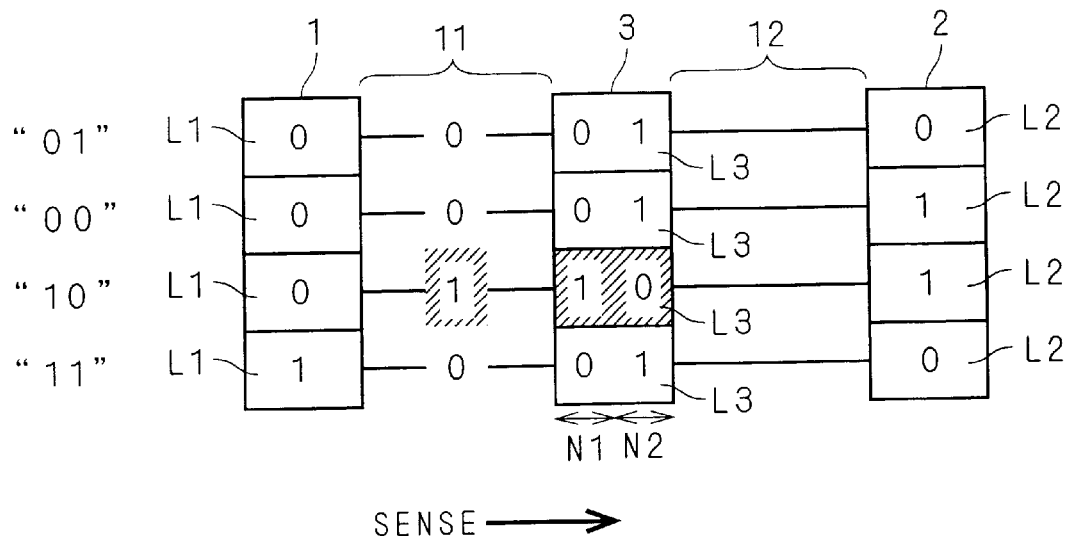
F I G . 7 8
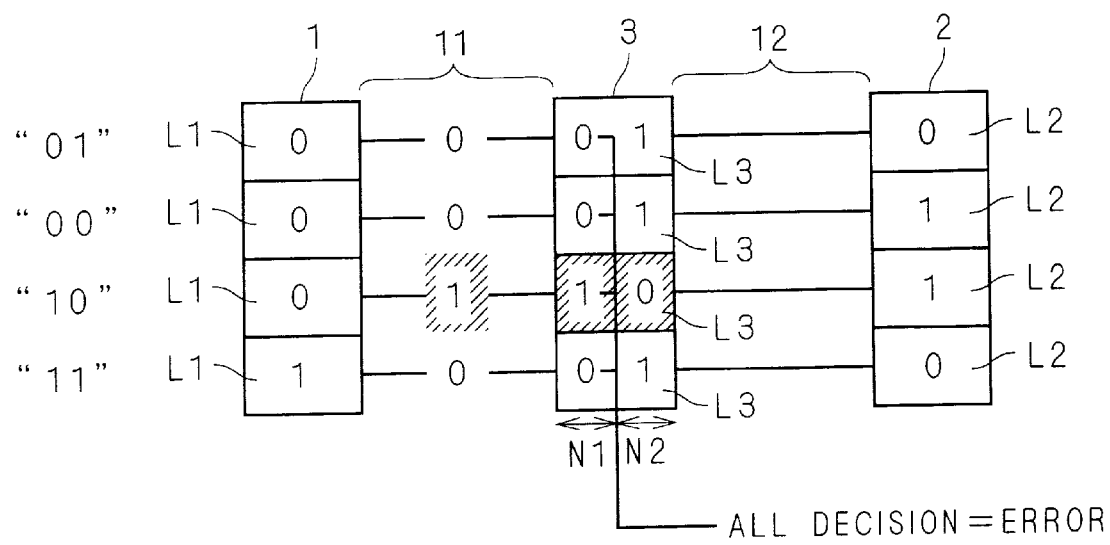

F I G . 8 1
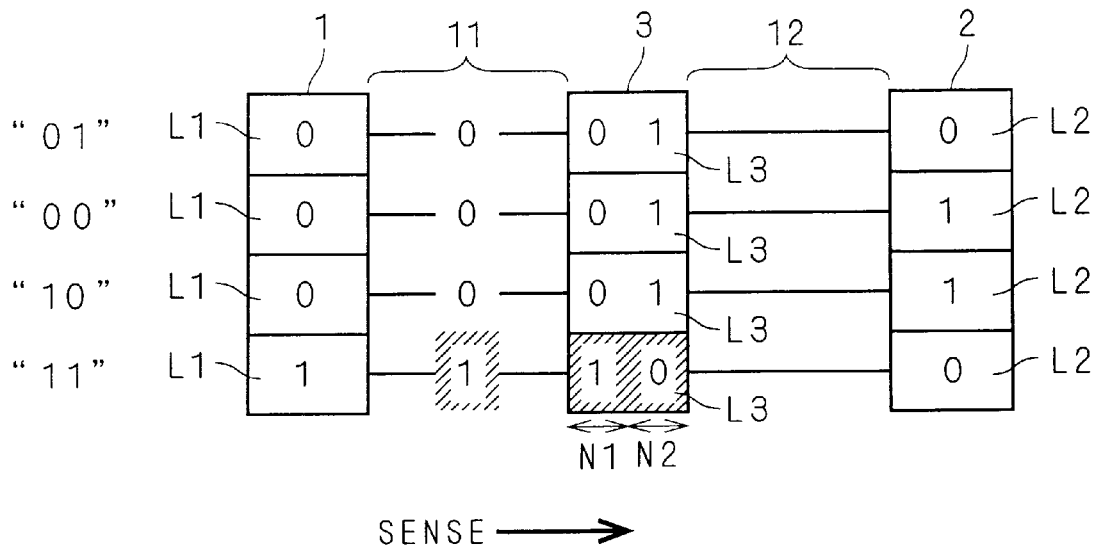
SENSE ⟶
F I G . 8 2
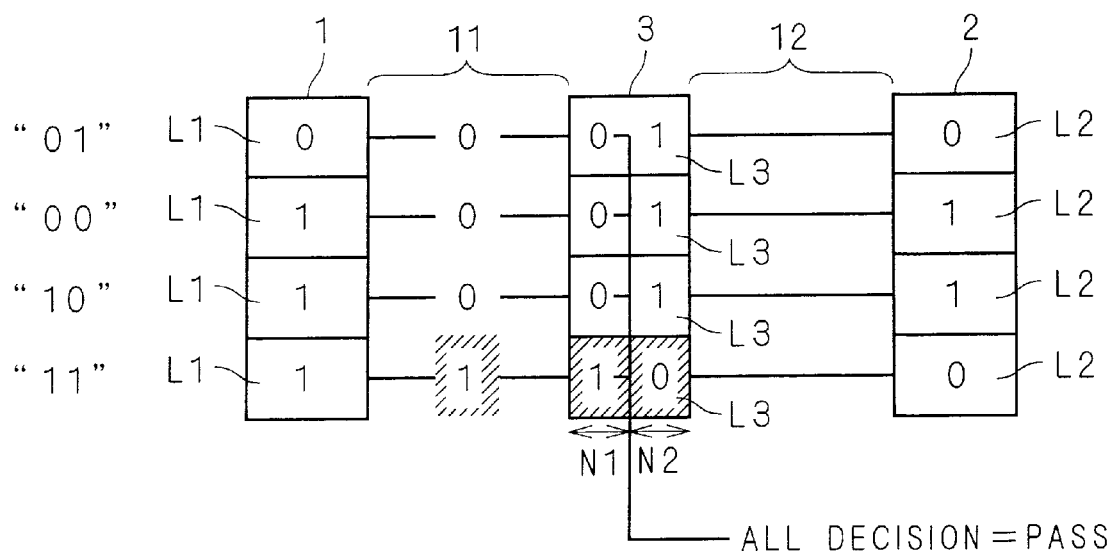

← SENSE

← SELECTIVE PRECHARGE

F I G . 8 5
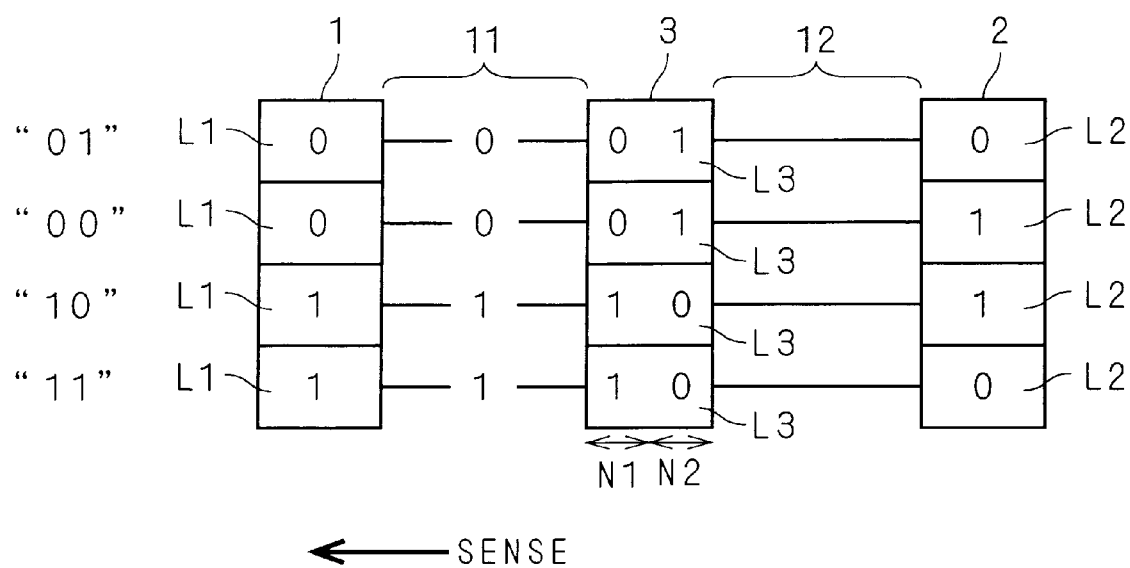

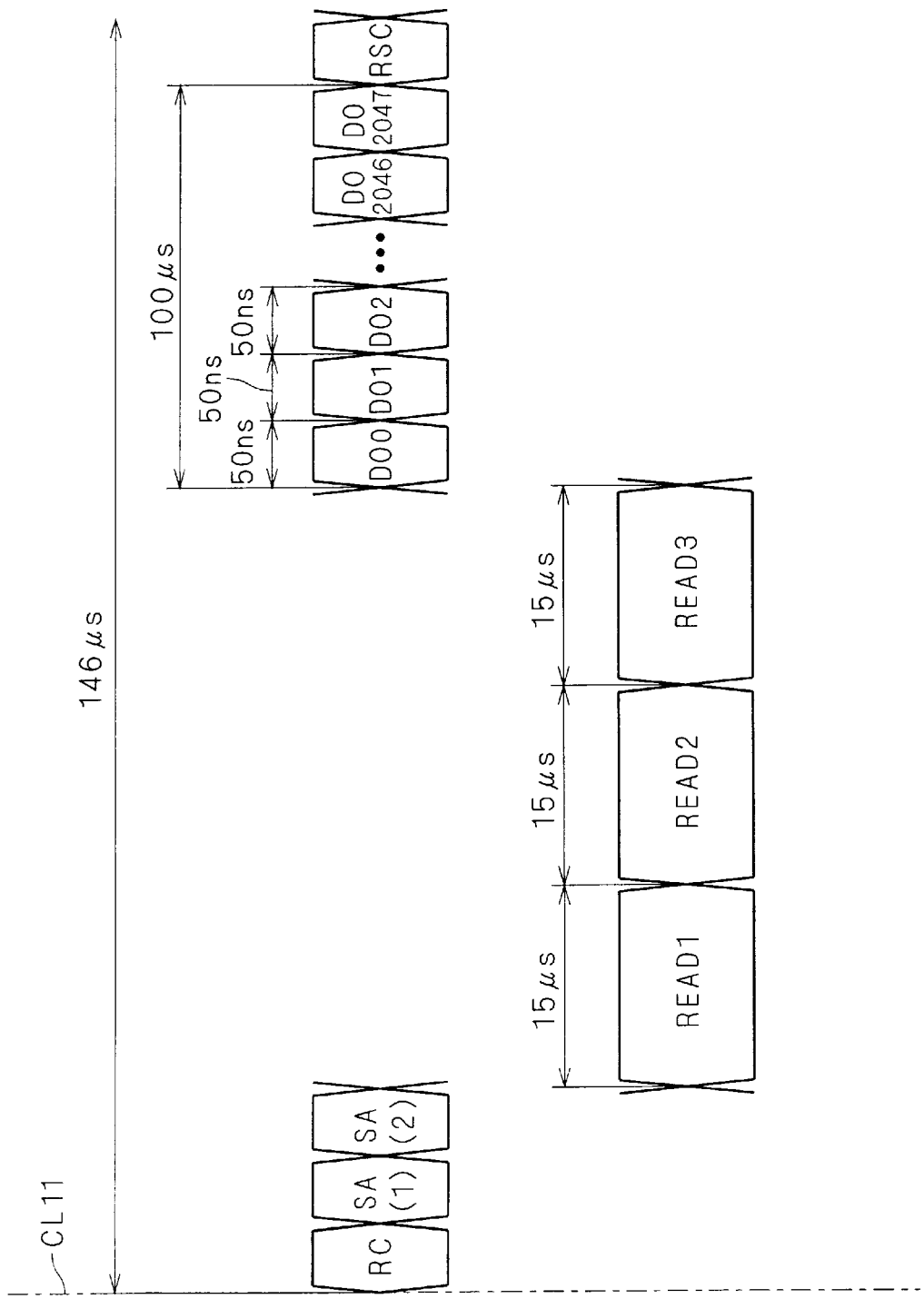
F I G. 90

F I G . 95
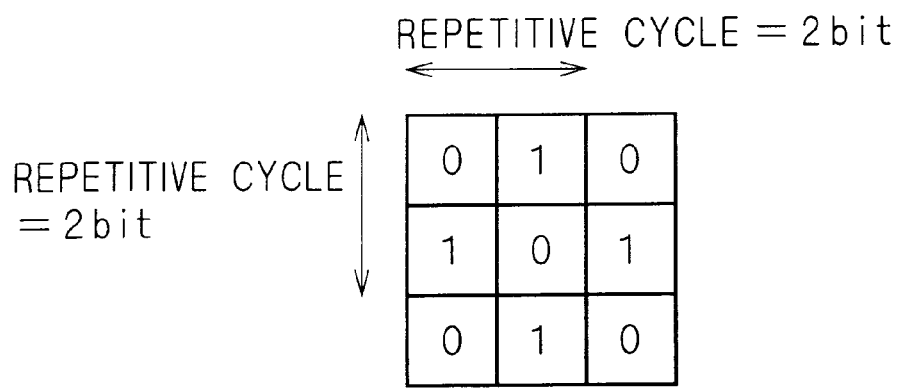
F I G . 96
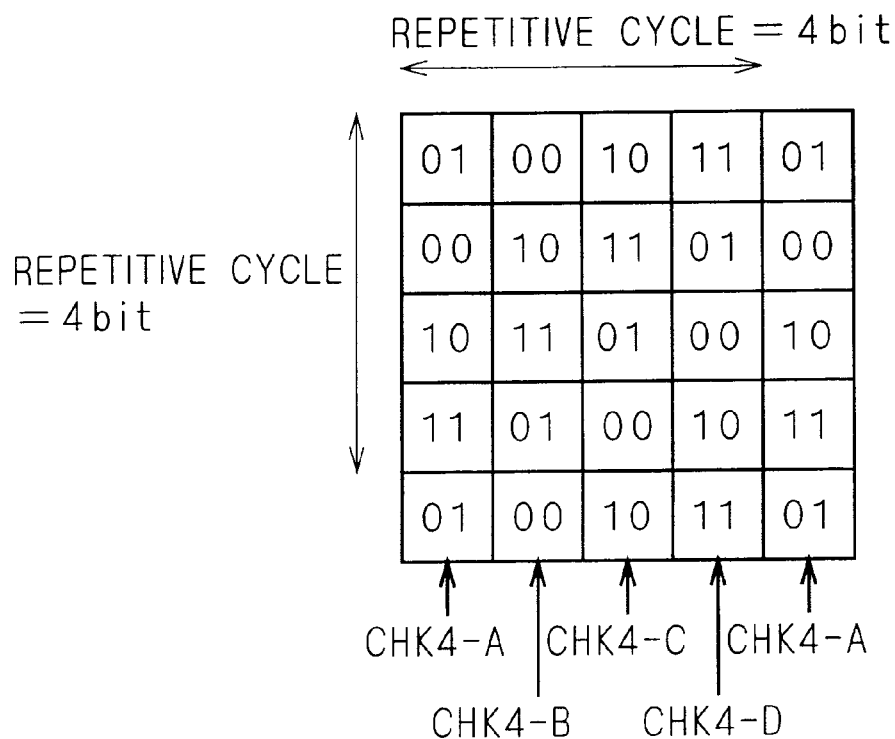

REPETITIVE CYCLE = 8bit

| 011 | 010 | 000 | 001 | 101 | 100 | 110 | 111 | 011 |
|---|---|---|---|---|---|---|---|---|
| 010 | 000 | 001 | 101 | 100 | 110 | 111 | 011 | 010 |
| 000 | 001 | 101 | 100 | 110 | 111 | 011 | 010 | 000 |
| 001 | 101 | 100 | 110 | 111 | 011 | 010 | 000 | 001 |
| 101 | 100 | 110 | 111 | 011 | 010 | 000 | 001 | 101 |
| 100 | 110 | 111 | 011 | 010 | 000 | 001 | 101 | 100 |
| 110 | 111 | 011 | 010 | 000 | 001 | 101 | 100 | 110 |
| 111 | 011 | 010 | 000 | 001 | 101 | 100 | 110 | 111 |
| 011 | 010 | 000 | 001 | 101 | 100 | 110 | 111 | 011 |

REPETITIVE CYCLE = 8bit

SEMICONDUCTOR MEMORY

BACKGROUND OF THE INVENTION

1. Field of the Invention

The present invention relates to a semiconductor memory capable of executing a read test for stored contents comparatively easily, and more particularly to a nonvolatile semiconductor memory such as an electrically writable/erasable flash memory.

2. Description of the Background Art

In general, the production cost of a memory implies the total of the cost required for a wafer process, an assembly and a test. The cost of the test depends on how many chips can be tested per unit time by means of one tester. In order to reduce the test cost to produce a more inexpensive memory, accordingly, it is required that the prolongation of a test time caused by an increase in a storage capacity of the memory should be minimized even if the storage capacity of the memory is increased twofold to fourfold with an increase in the capacity.

In order to shorten a test time of the memory, the following should be implemented:
(1) a reduction in an operation time required for write, read or the like;
(2) development of a test pattern having a higher defect detecting capability; and
(3) development of a test mode capable of carrying out write/read at a higher speed.

Referring to (1), an increase in a speed of production has been required. Therefore, the test time tends to be shortened comparatively easily without a special contrivance through an enhancement in transistor performance by microfabrication and a reduction in a load capacity.

Referring to (2), there are various test patterns having high defect detecting capabilities. Typically, a checker board pattern can be taken as an example.

FIG. 95 is a diagram illustrating an example of the checker board pattern. FIG. 95 shows a checker board pattern having one bit/cell (binary-value).

As shown in FIG. 95, a checker board pattern CHK2 is a test pattern having a repetitive cycle of 2 bits in which adjacent bits always have a relationship of "0" and "1". The checker board pattern CHK2 can detect open (disconnection) and a short circuit of a word line, open and a short circuit of a bit line, and a defective short circuit of floating gates in a nonvolatile semiconductor memory represented by a flash memory.

FIG. 96 is a diagram illustrating a checker board pattern CHK4 having 2 bits/cell (quaternary-value). As shown in FIG. 96, 2-bit patterns CHK4-A to CHK4-D are repeated every 4-bit repetitive cycle in order to correspond to the quaternary-value (2 bits/cell) to be multiple-valued storage through application of the checker board pattern CHK2 shown in FIG. 95.

FIG. 97 is a diagram illustrating a checker board pattern CHK8 having 3 bits/cell (octal-value). As shown in FIG. 97, a 3-bit pattern is repeated every 8-bit repetitive cycle in order to correspond to the octal-value (3 bits/cell) to be multiple-valued storage.

In the checker board pattern CHK4 and the checker board pattern CHK8, it is possible to detect a defective mode of the checker board pattern CHK2, and furthermore, to detect that all multiple-valued data can be written and read or not in the same word line and the same bit line.

Referring to (3), there have been various methods. In general, if a test mode is incorporated into a chip, a chip area tends to be increased due to an incorporated circuit. Consequently, a cost required for a wafer process is increased. Accordingly, in the case in which the test mode is to be incorporated into the chip, it is necessary to note that the total production cost should be minimized.

Next, the trend of a product of a flash memory and that of development will be described.

As an alternative to an EPROM (electrically writable nonvolatile semiconductor memory), a flash memory has spread for code storage. In recent years, a flash memory for mass data storage has spread more increasingly than the flash memory for code storage. In the case in which the flash memory for data storage carries out writing and reading randomly, it operates at a lower speed than that of the flash memory for code storage. However, in the case in which the flash memory for data storage carries out writing and reading sequentially, it can operate at a higher speed than that of the flash memory for code storage. The flash memory for data storage has had a larger capacity to exceed a DRAM through microfabrication of a processing pattern and a multiple-valued technique for storing multibit data in one memory cell.

Next, a test time for the flash memory will be described.

The flash memory for code storage has such a structure that a reading operation can be carried out at a much higher speed than a writing operation. Therefore, a time required for a read test can be almost ignored with respect to the whole test time. However, the flash memory for data storage carries out the writing operation at a higher speed and has a larger capacity than the flash memory for code storage. Therefore, the time required for the read test cannot be disregarded with respect to the whole test time.

For example, a 256 Mbit flash memory has a 16 Ksector structure in which a 2 Kbyte write/read unit (hereinafter referred to as a "sector") is present for 16K. Approximately 50 $\mu$s is required for a reading head every sector (hereinafter referred to as a "1st access") and 50 ns is required for subsequent data transfer every byte.

Accordingly, approximately 2.5 s ((50 $\mu$s+50 ns×2 Kbyte)·16 Ksector) is required for carrying out a read test in the whole area of the 256 Mbit flash memory.

In a probing check stage of a wafer state, furthermore, it is hard to carry out a read test with a 2nd access 50 ns of a product specification due to a resistance and a capacitance of a probe needle and a resistance and a capacitance of a probe card, and a test time is further increased.

In general, the flash memory has an automatic writing/erasing function. The automatic writing function implies a function of repeating a write pulse applying operation and an operation (hereinafter referred to as a "verify operation") for deciding whether desirable data are written (or erased) to (or from) an object memory cell for writing in accordance with a logic circuit (hereinafter referred to as a "control circuit") provided in an EEPROM, ending the repetition of the write pulse applying operation and the verify operation when it is decided that all the object memory cells store the desirable data and outputting a signal for giving, to the outside of the EEPROM, a notice that the writing operation (or the erasing operation) has been completed.

In order to decide whether "the contents stored in all the object memory cells are the desirable data", an all latch deciding circuit (hereinafter referred to as an "ALL deciding circuit") is provided. The ALL deciding circuit serves to decide that all sense latches in a sense latch group provided for storing the result of read of the memory cell are "1" or "0".

FIG. 98 is a block diagram schematically showing a conventional ALL deciding circuit and a periphery thereof.

In this specification, it is assumed that the case in which "1" is written to the memory cell is set to "write" and the case in which "0" is written to the memory cell is set to "erase". Referring to FIG. 98, description will be given in which a left memory cell group 31 is referred to as an L mat 31 and a right memory cell group 32 is referred to as an R mat 32.

As shown in FIG. 98, a sense latch group 33 is provided between the L mat 31 and the R mat 32. The sense latch group 33 transmits and receives data in a sector unit to and from the L mat 31 or the R mat 32. The latch data of the sense latch group 33 are output to an ALL deciding circuit 34.

The ALL deciding circuit 34 receives control signals LorR, 0or1 and ENABLE from an external control CPU 35 and outputs a decision result ALL34 to the control CPU 35. "0"/"1" of the LorR designates reading from the L mat 31/R mat 32, "0"/"1" of the 0or1 designates write verify/erase verify, and "0"/"1" of the ENABLE designates inactivity/activity of the ALL deciding circuit 34.

FIGS. 99 to 102 are diagrams illustrating an operation principle of a conventional ALL deciding circuit, in which the ALL deciding circuit has a function of deciding that all sense latches are "0".

As shown in FIGS. 99 to 102, the sense latch group 33 is provided between the L mat 31 and the R mat 32, and nodes N11 and N12 of each latch L33 of the sense latch group 33 are connected to the L mat 31 and the R mat 32 in one memory cell unit, respectively. The node N11 and the node N12 in the latch L33 are constituted to have a logical inverting relationship. A data latch group 36 is provided on the opposite side of the sense latch group 33 with the L mat 31 interposed therebetween, and a data latch group 37 is provided on the opposite side of the sense latch group 33 with the R mat 32 interposed therebetween.

First of all, the ENABLE is set to "1" for initialization and the ALL deciding circuit 34 is thus brought into an active state.

As shown in FIG. 99, when the write verify for the L mat 31 is to be carried out, LorR="0" (L) and 0or1="1" are set so that data read from the L mat 31 are latched onto each latch L33 of the sense latch group 33. If "1" is normally written to the L mat 31, the nodes N11 of all the latches L33 of the sense latch group 33 are set to "1" and the nodes N12 are set to "0".

Accordingly, it is possible to execute the L mat write verify by deciding the state of the nodes N12 of all the latches L33 in the sense latch group 33 (whether all of them are "0") through the ALL deciding circuit (R side sense latch decision).

As shown in FIG. 100, similarly, when the erase verify for the L mat 31 is to be carried out, LorR="0" and 0or1="0" are set. If "0" is normally written to the L mat 31, the nodes N11 of all the latches L33 in the sense latch group 33 are set to "0" and the nodes N12 are set to "1".

Accordingly, it is possible to execute the L mat erase verify by deciding the state of the nodes N11 of all the latches L33 in the sense latch group 33 through the ALL deciding circuit (L side sense latch decision).

As shown in FIG. 101, when the write verify for the R mat 32 is to be carried out, LorR="1" (R) and 0or1="1" are set so that data read from the R mat 32 are latched onto each latch L33 of the sense latch group 33. If "1" is normally written to the R mat 32, the nodes N12 of all the latches L33 of the sense latch group 33 are set to "1" and the nodes N11 are set to "0".

Accordingly, it is possible to execute the R mat write verify by deciding the state of the nodes N11 of all the latches L33 in the sense latch group 33 through the ALL deciding circuit (L side sense latch decision).

As shown in FIG. 102, similarly, when the erase verify for the R mat 32 is to be carried out, LorR="1" and 0or1="0" are set. If "0" is normally written to the R mat 32, the nodes N12 of all the latches 33 in the sense latch group 33 are set to "0" and the nodes N11 are set to "1".

Accordingly, it is possible to execute the R mat erase verify by deciding the state of the nodes N12 of all the latches L33 in the sense latch group 33 through the ALL deciding circuit (R side sense latch decision).

The ALL deciding circuit carries out the R or L side sense latch decision based on a logical expression of $\{(LorR) \text{ X OR } (0or1)\}$. It is sufficient that the R side sense latch decision is carried out with "1" and the L side sense latch decision is carried out with "0".

Based on the result of the decision of the ALL deciding circuit for deciding whether all the memory cells in the sector are "0", thus, it is possible to execute the write verify and erase verify operations without outputting read data for each bit from data input/output pins.

In this case, a time of approximately 150 $\mu$s (50 $\mu$s+50 ns·2 Kbyte) required for normal reading per sector can be shortened to 50 $\mu$s+$\alpha$ ($\alpha$<1 $\mu$s). Therefore, the read test time can be shortened to approximately one-third.

In this case, however, it is premised that all the write data in the sectors are identical. For this reason, there has been a problem in that the write data cannot be used for test reading through the checker board pattern CHK2, CHK4, CHK8 or the like which has a high defect detecting capability.

SUMMARY OF THE INVENTION

A first aspect of the present invention is directed to a semiconductor memory comprising a plurality of memory cells, each of which can store N-valued (N$\geq$2) information, a data reading device for reading a predetermined number of read data from a predetermined number of memory cells out of said plurality of memory cells during a reading operation for a test, and a deciding device for classifying the predetermined number of read data into K (K$\geq$2) groups and outputting a decision result based on whether all the read data in the respective K groups are identical during the reading operation for a test.

A second aspect of the present invention is directed to the semiconductor memory according to the first aspect of the present invention, wherein the K includes N, the memory cells include memory cells arranged in a matrix defined by first and second directions, the predetermined number of memory cells include memory cells provided in the same position in the second direction and provided in series in the first direction, and the deciding device classifies the predetermined number of read data such that the predetermined number of memory cells are classified into the same groups at N intervals in the second direction.

A third aspect of the present invention is directed to the semiconductor memory according to the second aspect of the present invention, wherein the N-value includes a $2^m$-value (m$\geq$1).

A fourth aspect of the present invention is directed to the semiconductor memory according to any of the first to third aspects of the present invention, the deciding device includes a sense storing device for sensing and storing the predetermined number of read data, and a decision result output device for deciding whether all the read data in the respective K groups are identical based on stored contents of the sense storing device and for outputting a result of the decision.

A fifth aspect of the present invention is directed to the semiconductor memory according to any of the first to fourth aspects of the present invention, wherein the N-value includes a multiple-value to be ternary or more, the reading operation for a test includes first to Lth (L≧2) partial reading operations for a test which have different reading conditions and the read data include first to Lth 1-bit read data, the data reading device reads the predetermined number of first to Lth 1-bit read data during execution of the first to Lth partial reading operations for a test, the result of decision includes first to Lth partial decision results, and the deciding device outputs an ith (i=1 to L) partial decision result based on whether all ith 1-bit read data in the respective K groups are identical during an ith partial reading operation for a test.

A sixth aspect of the present invention is directed to a semiconductor memory comprising a plurality of memory cells, each of which can store N-valued (N≧2) information, a data reading device for reading a predetermined number of read data from a predetermined number of memory cells out of said plurality of memory cells during a reading operation for a test, an expectation storing device for storing a predetermined number of expectation data, and a deciding device for outputting a result of decision based on a result of comparison of the predetermined number of read data with the predetermined number of expectation data during the reading operation for a test.

A seventh aspect of the present invention is directed to the semiconductor memory according to the sixth aspect of the present invention, the deciding device includes a sense storing device for sensing and storing the predetermined number of read data, and a decision result output device for outputting the result of decision based on a result of comparison of stored contents of the sense storing device with stored contents of the expectation storing device.

An eighth aspect of the present invention is directed to the semiconductor memory according to the seventh aspect of the present invention, wherein the N-value includes a multiple-value to be ternary or more, the reading operation for a test includes first to Lth (L≧2) partial reading operations for a test which have different reading conditions, the read data include first to Lth 1-bit read data and the expectation data include first to Lth 1-bit expectation data, the data reading device reads the predetermined number of first to Lth 1-bit read data every execution of the first to Lth partial reading operations for a test respectively, the result of decision includes first to Lth partial decision results, the deciding device outputs an ith (i=1 to L) partial decision result based on a result of comparison of the predetermined number of ith 1-bit read data with the predetermined number of ith 1-bit expectation data during the ith partial reading operation for a test, and the predetermined number of second to Lth 1-bit expectation data are obtained by changing the predetermined number of first to (L−1)th 1-bit expectation data based on the stored contents of the expectation storing device and the sense storing device, respectively.

A ninth aspect of the present invention is directed to the semiconductor memory according to any of the sixth to eighth aspects of the present invention, wherein the expectation storing device includes a data storing device for temporarily storing data when transmitting and receiving data between the memory cells and an outside.

As described above, according to the first aspect of the present invention, a comparatively complicated test pattern having the same value set to the K groups is written to the memory cells and the reading operation for a test is then executed to obtain the result of decision. Consequently, the read test for the memory cells can be carried out at a high speed.

Moreover, it is sufficient that the deciding device has the function of deciding whether all the read data in the respective K groups are identical. Therefore, the circuit area of the semiconductor memory is rarely increased due to the provision of the deciding device therein.

According to the second aspect of the present invention, a predetermined number of memory cells are classified into the same group at the N intervals in the second direction. Therefore, it is possible to carry out the read test in which the checker board pattern having the N-value is set to be a test pattern.

According to the third aspect of the present invention, it is possible to carry out a read test in which a checker board pattern having a repetitive cycle of m bits is set to be the test pattern.

According to the fourth aspect of the present invention, a predetermined number of read data are sensed and stored in the sense storing device. Consequently, it is possible to obtain a result of decision with high precision.

According to the fifth aspect of the present invention, the result of decision comprising the first to Lth partial decision results is obtained. Consequently, it is possible to carry out the read test in a multiple-valued storage state for the memory cell without hindrance.

According to the sixth aspect of the present invention, a predetermined number of expectation data are stored from the outside into the expectation storing device. Consequently, it is possible to carry out a read test based on an optional test pattern. Moreover, in the case in which the predetermined number of expectation data are utilized in common between the predetermined number of data read plural times, it is preferable that the predetermined number of expectation data should be stored in the expectation storing device at a first time. Therefore, a time required for storing the predetermined number of expectation data in the expectation storing device can be omitted during the reading operation of the predetermined number of read data at and after a second time. Correspondingly, the read test can be carried out at a high speed.

Moreover, it is preferable that the deciding device should have the function of outputting the result of decision based on the result of comparison of the predetermined number of read data with the predetermined number of expectation data. Therefore, the circuit area of the semiconductor memory is rarely increased due to the deciding device constituted therein.

According to the seventh aspect of the present invention, the predetermined number of read data are sensed and stored in the sense storing device. Consequently, it is possible to obtain a result of decision with high precision.

According to the eighth aspect of the present invention, the result of decision comprising the first to Lth partial decision results is obtained. Consequently, it is possible to carry out the read test in a multiple-valued storage state for the memory cell without hindrance. In this case, the predetermined number of second to Lth 1-bit expectation data are obtained by changing the predetermined number of first to (L−1)th 1-bit expectation data based on the contents stored in the expectation storing device and the sense storing device, respectively. Therefore, it is sufficient that only the predetermined number of first 1-bit expectation data should be stored in the expectation storing device.

According to the ninth aspect of the present invention, the expectation storing device does not need to be added specially for expectation data storage.

An object of the present invention is to provide a semiconductor memory capable of executing a read test at a high speed based on a comparatively complicated test pattern without increasing a circuit area. These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 7 are diagrams illustrating a reading principle according to the first embodiment, FIGS. 10 to 15 are diagrams illustrating a principle of a reading operation for a test, FIG. 16 is a circuit diagram showing the details of a part of an ALL deciding circuit 5A, FIGS. 17 to 22 are diagrams illustrating an example of reading error detection in the reading operation for a test, FIG. 23 is a diagram showing a data output expectation obtained during operations of the first to third read READ1 to READ3 for each bit pattern of a checker board pattern CHK4, FIG. 28 is a circuit diagram showing a structure of an ALL deciding circuit 5B to be used for the second embodiment, FIG. 29 is a diagram showing a principle of the reading operation for a test in the flash memory according to the second embodiment, FIGS. 30 to 85 are diagrams showing the principle of the reading operation for a test, FIGS. 89 and 90 are timing charts showing the contents of a normal reading operation, FIG. 95 is a diagram illustrating a binary-valued checker board pattern, FIG. 96 is a diagram illustrating a quaternary-valued checker board pattern.

DESCRIPTION OF THE PREFERRED EMBODIMENTS

First Embodiment
<Whole Structure>

Figure 1:
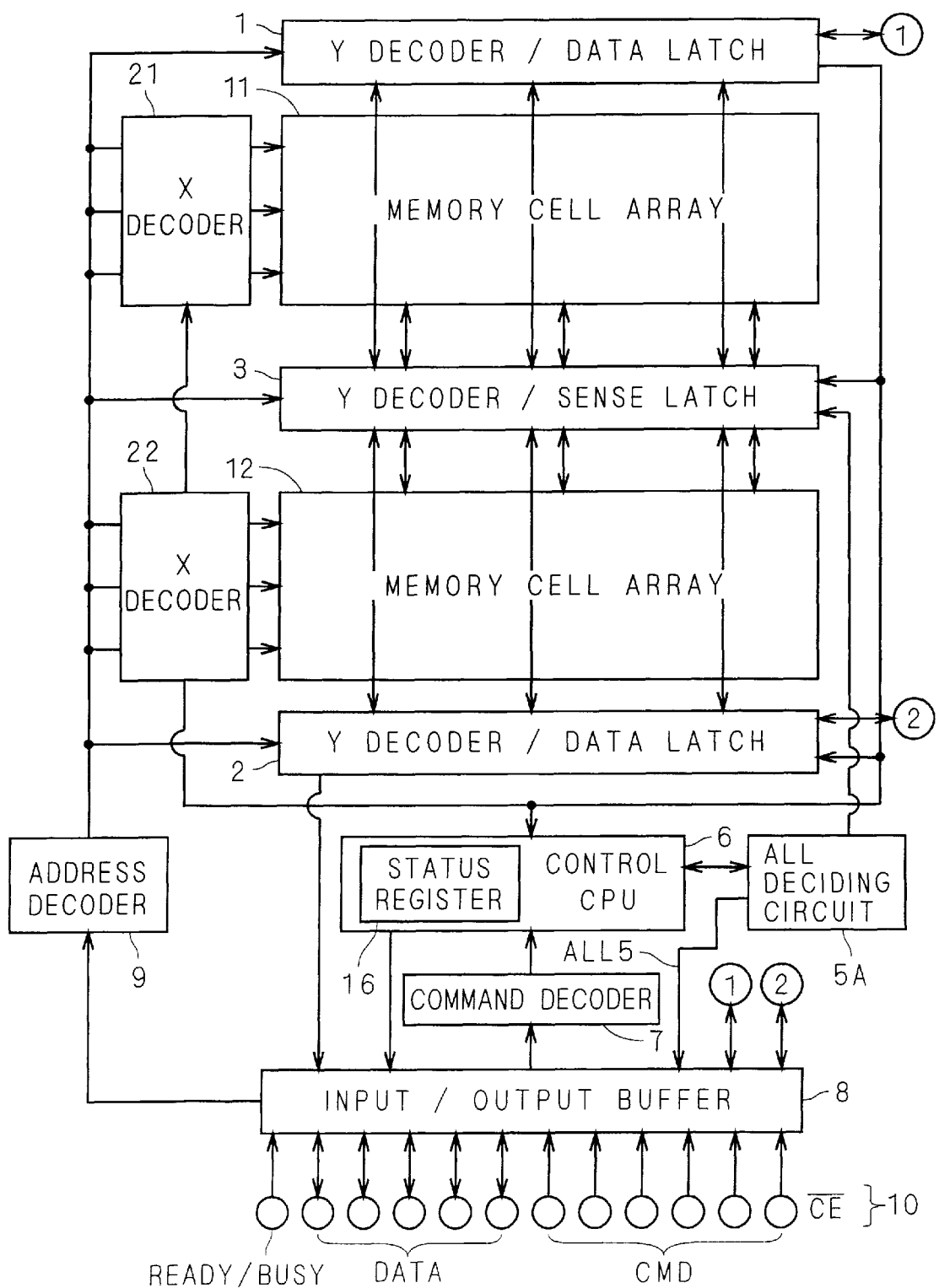
FIG. 1 is a block diagram showing a whole structure of a flash memory according to a first embodiment of the present invention.

FIG. 1 is a block diagram showing a whole structure of a flash memory according to a first embodiment of the present invention. The present invention is characterized by a reading operation. Therefore, a portion related to the reading operation will mainly be described below.

As shown in FIG. 1, a Y decoder sense latch group 3 (hereinafter referred to as a "sense latch group 3") is provided between memory cell arrays 11 and 12. The memory cell arrays 11 and 12 are constituted by a plurality of memory cells having a flash memory structure which are arranged in a matrix, respectively.

A Y decoder data latch group 1 (hereinafter referred to as a "data latch group 1") is provided in a formation region on the opposite side of the sense latch group 3 with respect to the memory cell array 11, and a Y decoder data latch group 2 (hereinafter referred to as a "data latch group 2") is provided in a formation region on the opposite side of the sense latch group 3 with respect to the memory cell array 12.

The memory cell arrays 11 and 12 are constituted by a plurality of memory cells which are arranged in a matrix defined by X and Y directions, respectively. A plurality of word lines are provided in the X direction and a plurality of bit lines are provided in the Y direction.

In the memory cell arrays 11 and 12, the word line is selected by X decoders 21 and 22 respectively, and data can be transmitted and received between a memory cell in a sector unit which is connected to the selected word line and the sense latch group 3. A predetermined number of memory cells in a sector unit which are provided in the same position in the Y direction and are connected in series in the X direction are selected in the memory cell arrays 11 and 12.

The sense latch group 3 can transmit and receive data between the data latch groups 1 and 2 and the memory cell arrays 11 and 12. Accordingly, the sense latch group 3 can sense and latch data read from the memory cell in a sector unit which is selected from the memory cell array 11 or 12 during reading and can transfer the same data to the data latch group 1 or the data latch group 2. While the Y decode function of the sense latch group 3 serves to relieve a defective memory, it is less related to the present invention and description thereof will be omitted.

The data latch groups 1 and 2 can transmit and receive the data in a sector unit to and from the sense latch group 3 respectively, and selectively output the latched data based on their Y decoding results to an input/output buffer 8 or the sense latch group 3. Accordingly, the data latch groups 1 and 2 selectively output the data obtained from the sense latch group 3 during reading to the input/output buffer 8 based on the Y decoding results.

An ALL deciding circuit 5A executes a verify decision processing which will be described below in detail based on the latch data of the sense latch group 3 under the control of a control CPU 6, thereby obtaining a result of the verify and outputting a decision result ALL5 to the control CPU 6 and the input/output buffer 8.

The X decoders 21 and 22 select a word line from the memory cell arrays 11 and 12 based on the decoding result of an X address obtained from an address decoder 9.

The address decoder 9 serves to decode an address obtained through the input/output buffer 8, to output an X address to the X decoders 21 and 22 and to output a Y address to Y decode portions in the data latch groups 1 and 2 and the sense latch group 3.

A command decoder 7 serves to decode a command obtained through the input/output buffer 8 and to output the result of the decoding operation to the control CPU 6.

The control CPU 6 serves to control the X decoders 21 and 22, the data latch groups 1 and 2, the sense latch group 3 and the ALL deciding circuit 5A based on the result of the decoding operation of the command decoder 7 or the decision result ALL5 of the ALL deciding circuit 5A. Moreover, the control CPU 6 can also store information based on the decision result ALL5 in a status register 16 and output the information to the outside through the input/output buffer 8.

The input/output buffer 8 serves to transmit and receive data to and from an external input/output pin group 10. The external input/output pin group 10 includes an input/output pin or the like which transmits and receives a chip enable signal bar CE, a READY/BUSY signal indicative of the presence of the completion of the verify operation or the like, a data signal DATA, a control signal CMD and the like. The input/output buffer 8 can also output the decision result ALL5 to the outside by utilizing a part of the external input/output pin group 10.

<Normal Reading Operation>

A plurality of memory cells in the memory cell arrays 11 and 12 of the flash memory according to the first embodiment shown in FIG. 1 can carry out quaternary-valued storage, respectively. First to third read READ1 to READ3 to be three-time partial reading operations are executed so that a normal reading operation is carried out.

Figure 2:
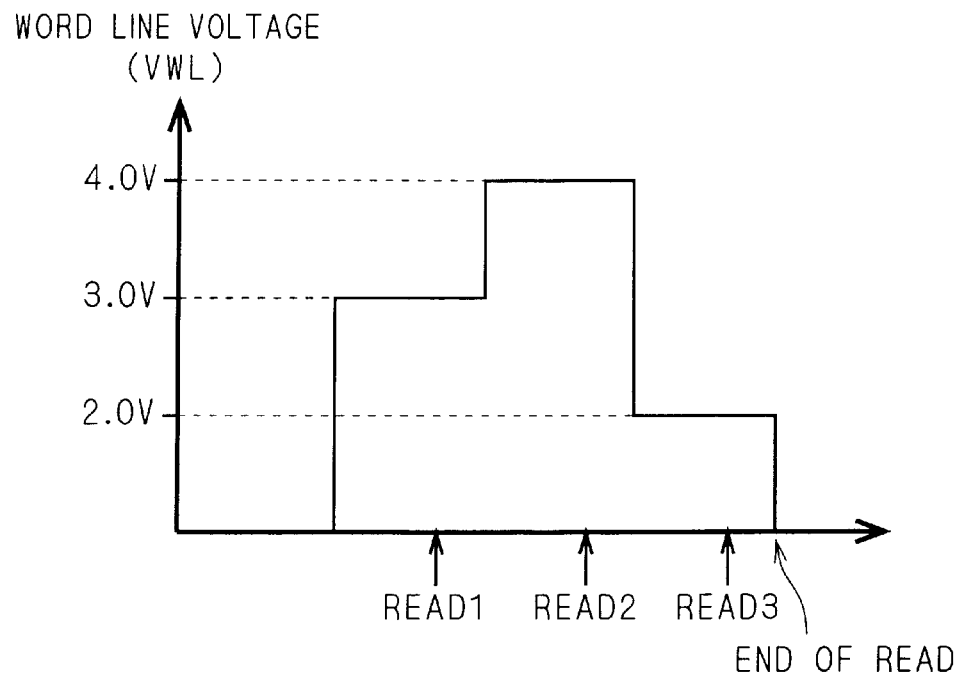
FIG. 2 is a chart showing a reading method of the flash memory according to the first embodiment.

FIG. 2 is a chart showing a reading method of the flash memory according to the first embodiment. As shown in FIG. 2, a word line voltage VWL is set to 3.0 V to select a word line in the first read READ1, a word line voltage VWL is set to 4.0 V to select a word line in the second read READ2, and a word line voltage VWL is set to 2.0 V to select a word line in the third read READ3.

FIGS. 3 to 7 are diagrams illustrating a reading principle according to the first embodiment. In FIGS. 3 to 7, the data latch groups 1 and 2 and the sense latch group 3 have respective four 1-bit storage latches L1, L3 and L2.

The latches L1 and L3 are provided corresponding to a bit line on the memory cell array 11, and the latches L2 and L3 are provided corresponding to a bit line on the memory cell array 12. For convenience of explanation, the four latches L1, the four latches L3 and the four latches L2 are shown. Actually, there are latches corresponding to the number of bit lines in a sector unit.

Figure 3:
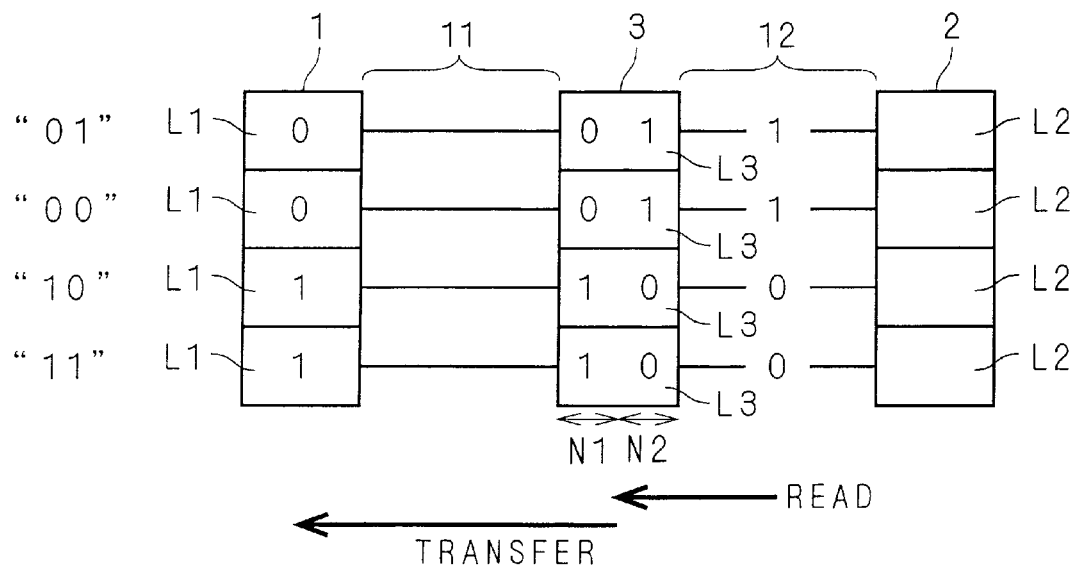

As shown in FIGS. 3 to 5, it is assumed that four selection memory cells corresponding to the latches L1, L3 and L2 of the data latch group 1, the sense latch group 3 and the data latch group 2 are written with "01", "00", "10" and "11" from a top of the drawing, respectively. Moreover, a left node N1 of the latch L3 of the sense latch group 3 is connected to the latch L1, and a right node N2 is connected to the latch L2. A numeral on the left of the latch L3 denotes a state of the node N1 and a numeral on the right denotes a state of the node N2.

First of all, the first read READ1 is carried out and 1-bit read data ("1", "1", "0", "0") obtained from the selection memory cell in the memory cell array 12 onto the bit line are sensed and latched through the sense latch group 3 as shown in FIG. 3. Subsequently, the latch data of the sense latch group 3 are transferred to the data latch group 1 (transfer processing). In this case, ("0", "0", "1", "1") obtained by inverting ("1", "1", "0", "0") are latched onto the data latch group 1.

Next, the second read READ2 is carried out and 1-bit read data ("1", "0", "0", "0") obtained from the selection memory cell in the memory cell array 12 are sensed and latched through the sense latch group 3 as shown in FIG. 4. Subsequently, the latch data of the sense latch group 3 are transferred to the data latch group 1 (transfer processing).

Then, the third read READ3 is carried out and 1-bit read data ("1", "1", "1", "0") are latched through the sense latch group 3 as shown in FIG. 5.

Thereafter, the latch data of the sense latch group 3 are transferred onto the bit line of the memory cell array 12 (transfer processing), and the inverted data of the latch data of the data latch group 2 are transferred onto the bit line of the memory cell array 12 (inversion transfer processing). Thus, an arithmetic processing is executed.

Figure 6:
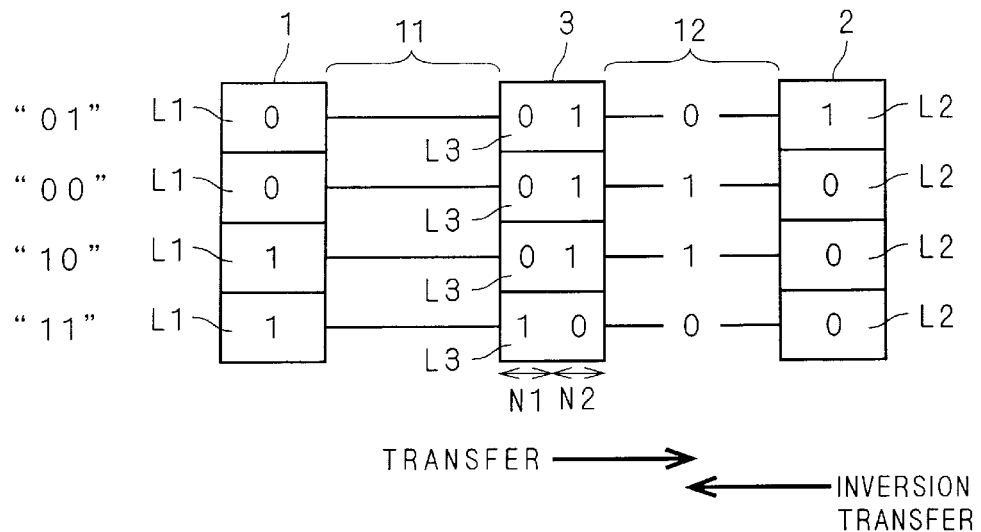
Figure 7:
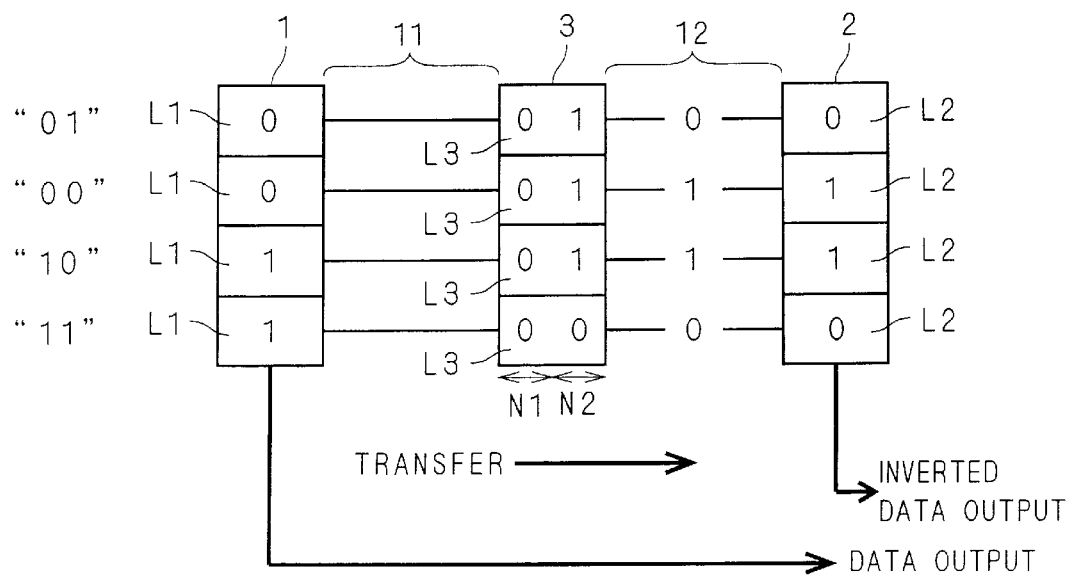

As a result, only the bit line to which "1" is transferred from both the sense latch group 3 and the data latch group 1 is set to "1" and other bit lines are set to "0" as shown in FIG. 6.

Then, the data on the bit line of the memory cell array 12 are transferred to the data latch group 2. Consequently, the data on the bit line are latched onto the data latch group 2.

Subsequently, an output processing of outputting the latch data of the data latch group 1 and the inverted data of the latch data of the data latch group 2 respectively is executed. Consequently, 2-bit quaternary-valued data ("01", "00", "10", "11") having the latch data of the data latch group 1 as a high order bit and the inverted data of the latch data of the data latch group 2 as a low order bit can be output.

While FIGS. 10 to 19 show the operation for reading data from the memory cell array 12, the roles of the data latch group 1 and the data latch group 2 can be reversed to carry out the reading operation so that an operation for reading data from the memory cell array 11 can be executed.

Figures 8, 9:
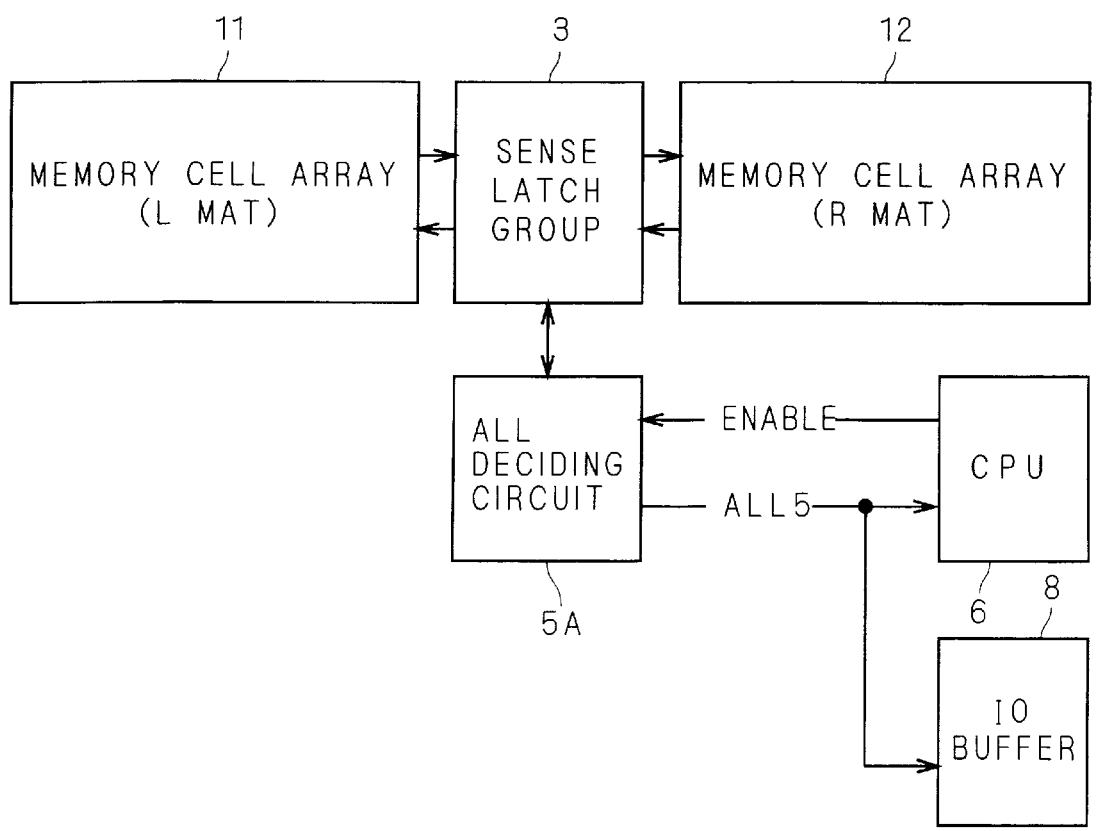
FIG. 8 is a diagram illustrating a value to be latched onto a sense latch group 3 through execution of first and third read READ1 to READ3.
FIG. 9 is a circuit diagram showing an ALL deciding circuit and a periphery thereof according to the first embodiment.

FIG. 8 is a diagram showing a value to be latched onto the sense latch group 3 by the execution of the first to third read READ1 to READ3. As shown in FIG. 8, the data stored in the selection memory cell are latched with "0", "0" and "0" during the execution of the first to third read READ1 to READ3 if they are "11", the data stored in the selection memory cell are latched with "0", "0" and "1" during the execution of the first to third read READ1 to READ3 if they are "10", the data stored in the selection memory cell are latched with "1", "0" and "1" during the execution of the first to third read READ1 to READ3 if they are "00", and the data stored in the selection memory cell are latched with "1", "1" and "1" during the execution of the first to third read READ1 to READ3 if they are "01", <Reading Operation for Test>

FIG. 9 is a circuit diagram showing the ALL deciding circuit and a periphery thereof according to the first embodiment. As shown in FIG. 9, the sense latch group 3 is provided between the memory cell array (L mat) 11 and the memory cell array (R mat) 12. The sense latch group 3 transmits and receives data to and from the memory cell array 11 or the memory cell array 12. The latch data of the sense latch group 3 are output to the ALL deciding circuit 5A.

The ALL deciding circuit 5A receives a control signal ENABLE from the external control CPU 6 and outputs the decision result ALL5 to the control CPU 6 and the input/output buffer 8. "0"/"1" of the ENABLE designates inactivity/activity of the ALL deciding circuit 5A.

FIGS. 10 to 15 are diagrams illustrating a principle of the reading operation for a test. As shown in FIGS. 10 to 15, gates of NMOS transistors QL0 to QL3 are connected corresponding to nodes N1 of the four latches L3 provided in series adjacently in the sense latch group 3, and gates of NMOS transistors QR0 to QR3 are connected corresponding to nodes N2 of the four latches L3.

Corresponding to the latch data of the sense latch group 3, decision result lines CHK0L to CHK3L are provided on the node N1 side and decision result lines CHK0R to CHK3R are provided on the node N2 side. Drains of a plurality of (three in the drawing) NMOS transistors QL0 to QL3 are connected to the decision result lines CHK0L to CHK3L in common respectively, and drains of a plurality of (three in the drawing) NMOS transistors QR0 to QR3 are connected to the decision result lines CHK0R to CHK3R in common respectively. Sources of the NMOS transistors QL0 to QL3 and QR0 to QR3 are grounded.

More specifically, every fifth node N1 of the latch L3 of the sense latch group 3 is connected to a gate of an NMOS transistor QLi (i=0 to 3) at 4 intervals and every fifth node N2 is connected to a gate of an NMOS transistor QRi at 4 intervals. The NMOS transistor QLi has a drain connected to a decision result line CHKiL and a source grounded. The NMOS transistor QRi has a drain connected to a decision result line CHKiR and a source grounded.

The ALL deciding circuit 5A outputs, as the decision result ALL5, decision result signals ALL0L to ALL3L obtained from the decision result lines CHK0L to CHK3L and decision result signals ALL0R to ALL3R obtained from the decision result lines CHK0R to CHK3R.

Figures 15, 16:
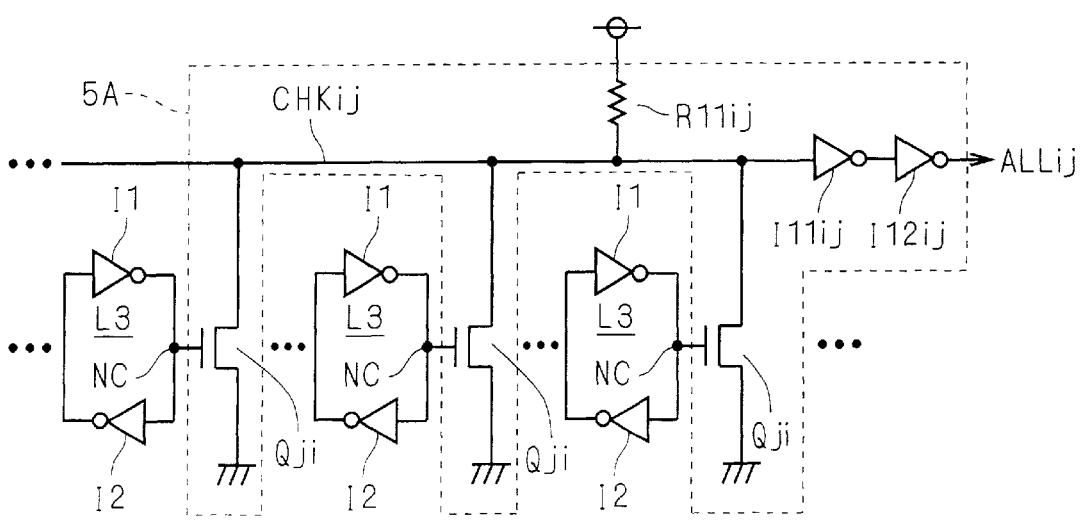

FIG. 16 is a circuit diagram showing the details of a part of the ALL deciding circuit 5A. As shown in FIG. 16, the ALL deciding circuit 5A is constituted by a resistor R11$ij$ (i=0 to 3, j=RorL), a decision result line CHKij, inverters I11$ij$ and I12$ij$, and an NMOS transistor Qji.

As described above, every fifth selection transistor Qji is provided at 4 intervals for a plurality of latches L3 of the sense latch group 3. The selection transistor Qji has a gate connected to a node NC (N1 with j=L, N2 with j=R) of the corresponding latch L3, a drain connected to the decision result line CHKij and a source grounded.

The decision result line CHKij is connected to a power supply through the resistor R11$ij$, and a signal obtained from the decision result line CHKij is output as a decision result ALLij through the inverters I11$ij$ and I12$ij$ connected in series.

The ALL deciding circuit 5A having such a structure can decide whether all the nodes NC of the latches L3 corresponding to the selection transistor Qji are "0" based on the condition that the decision result ALLij is "H" if all the values of the node NC of the latch L3 corresponding to the selection transistor Qji are "0" and is "L" if at least one of the values is "1".

The decision result ALL5 comprising the decision result ALLij obtained from eight decision result lines CHKij is given to the input/output buffer 8, and is finally output, to the outside, as an external signal obtained from input/output signal lines IO0 to IO7 of the input/output buffer 8.

The reading operation for a test using the ALL deciding circuit 5A is also executed by the first to third read READ1 to READ3 to be partial reading operations in the same manner as the normal reading operation described above.

Referring to the examples of FIGS. 10 to 15, description will be given to the reading operation for a test in which the bit pattern CHK4-A of the checker board pattern CHK4 shown in FIG. 96 is a read expectation. In other words, description will be given to the reading operation for a test in which expectation data of a memory cell corresponding to the latch L3 having the node N1 (N2) connected to the gates of the NMOS transistors QL0 to QL3 (QR0 to QR3) are set to "01", "00", "10" and "11", respectively.

First of all, when the first read READ1 is carried out, latch data to be ("1", "1", "0", "0") corresponding to {CHK0L to CHK3L (CHK0R to CHK3R)} are stored in the latch L3 of the sense latch group 3 during a normal operation as shown in FIG. 10. If description is not specifically given, the latch data of the latch L3 imply a value on the node N2 side.

As a result, the contents of the decision result ALL5 are obtained as shown in FIG. 11, and C3H is output as a data output. More specifically, if a data output indicative of C3H is sent from the input/output buffer 8 during the execution of the first read READ1, it is decided that the operation is normal.

Figure 12:
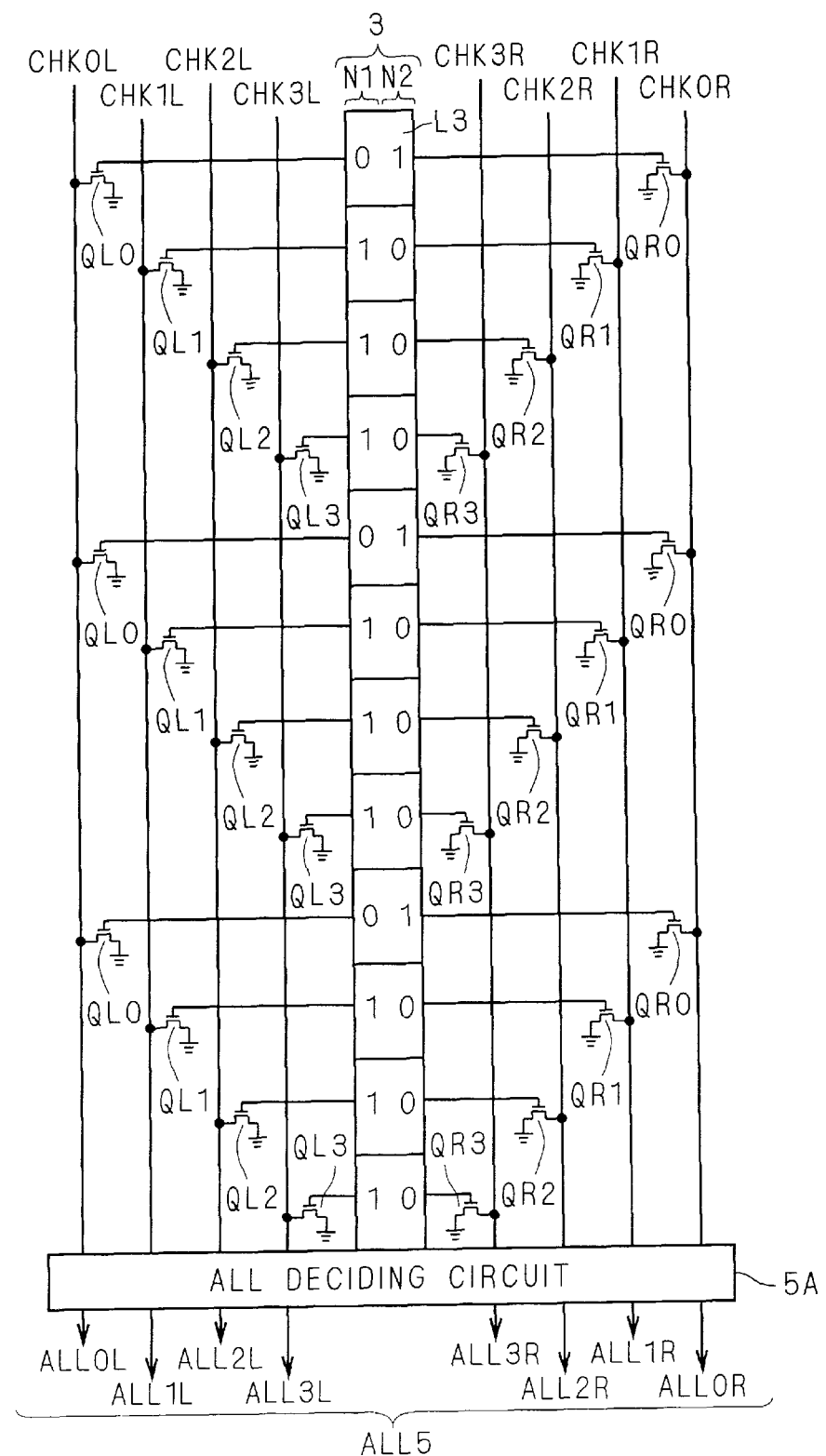

Next, when the second read READ2 is carried out, latch data to be ("1", "0", "0", "0") corresponding to {CHK0L to CHK3L} are stored in the latch L3 of the sense latch group 3 during the normal operation as shown in FIG. 12.

As a result, the contents of the decision result ALL5 are obtained as shown in FIG. 13, and E1H is output as a data output. More specifically, if a data output indicative of E1H is sent from the input/output buffer 8 during the execution of the second read READ2, it is decided that the operation is normal.

Figure 14:
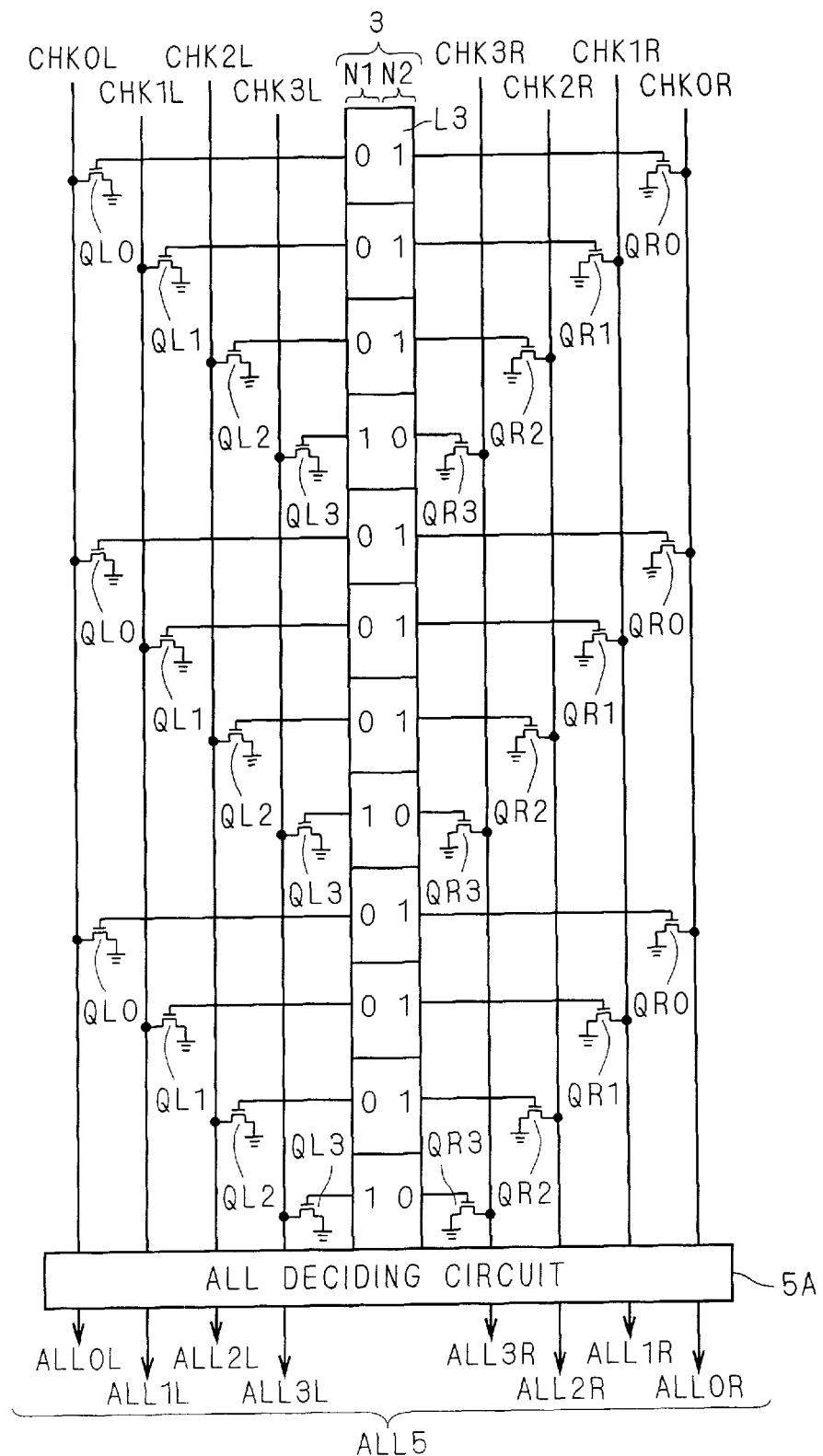

Then, when the third read READ3 is carried out, latch data to be ("1", "1", "1", "0") corresponding to {CHK0L to CHK3L} are stored in the latch L3 of the sense latch group 3 during the normal operation as shown in FIG. 14.

As a result, the contents of the decision result ALL5 are obtained as shown in FIG. 15, and 87H is output as a data output. More specifically, if a data output indicative of 87H is sent from the input/output buffer 8 during the execution of the third read READ3, it is decided that the operation is normal. During the reading operation for a test, the data read from the memory cell arrays 11 and 12 are sensed and latched by the sense latch group 3. Therefore, decision precision of the ALL deciding circuit 5A can be enhanced.

FIGS. 17 to 22 are diagrams illustrating an example of reading error detection in the reading operation for a test.

First of all, in the case in which "1" is erroneously latched onto a latch L3E1 of the sense latch group 3 as a result of the execution of the first read READ1 as shown in FIG. 17, the contents of the decision result ALL5 are obtained as shown in FIG. 18 and 83H is output as a data output. More specifically, a data output indicative of 83H is sent from the input/output buffer 8 during the execution of the first read READ1 and it is decided that a reading error is made because the data output is different from a normal value C3H.

Next, in the case in which "1" is erroneously latched onto a latch L3E2 of the sense latch group 3 as a result of the execution of the second read READ2 as shown in FIG. 19, the contents of the decision result ALL5 are obtained as shown in FIG. 20 and C1H is output as a data output. More specifically, a data output indicative of C1H is sent from the input/output buffer 8 during the execution of the second read READ2 and it is decided that a reading error is made because the data output is different from a normal value E1H.

Then, in the case in which "1" is erroneously latched onto a latch L3E3 of the sense latch group 3 as a result of the execution of the third read READ3 as shown in FIG. 21, the contents of the decision result ALL5 are obtained as shown in FIG. 22 and 07H is output as a data output. More specifically, a data output indicative of 07H is sent from the input/output buffer 8 during the execution of the third read READ3 and it is decided that a reading error is made because the data output is different from a normal value E8H.

Thus, when reading failures are generated, at least one of three data outputs sent during the execution of the first to third read READ1 to READ3 to be the partial reading operations in the reading operation for a test is different from a normal value. Therefore, the decision result ALL5 of the ALL deciding circuit 5A is output to the outside corresponding to the first to third read READ1 to READ3. Thus, the reading operation for a test can be executed.

While an example of the read test for the bit pattern CHK4-A of the checker board pattern CHK4 is shown in FIGS. 10 to 22, the reading operation for a test can be executed for bit patterns CHK4-B to CHK4-D of the checker board pattern CHK4 in the same manner.

FIG. 23 shows a data output expectation obtained during the first to third read READ1 to READ3 for each bit pattern of the checker board pattern CHK4. With reference to FIG. 23, the data output expectation is compared with a data output value obtained during the first to third read READ1 to READ3 in each of the bit patterns CHK4-A to CHK4-D. Consequently, the reading operation for a test of the checker board pattern CHK4 can be executed.

Thus, the flash memory according to the first embodiment can carry out a reading operation for a test as to whether the quaternary-valued checker board pattern CHK4 having a repetitive cycle of 4 bits can be correctly read out by only outputting the decision result ALL5 to the outside without directly outputting the data of the selected memory cell to the outside.

Moreover, the ALL deciding circuit 5A is constituted by decision result lines CHK0L to CHK3L and CHK0R to CHK3R, NMOS transistors QL0 to QL3 and QR0 to QR3, inverters I110L to I113L, inverters I110R to I113R, and resistors R110L to R113L and R110R to R113R. Therefore, a chip area of the flash memory is rarely increased due to the provision of the ALL deciding circuit 5A.

Figure 24:
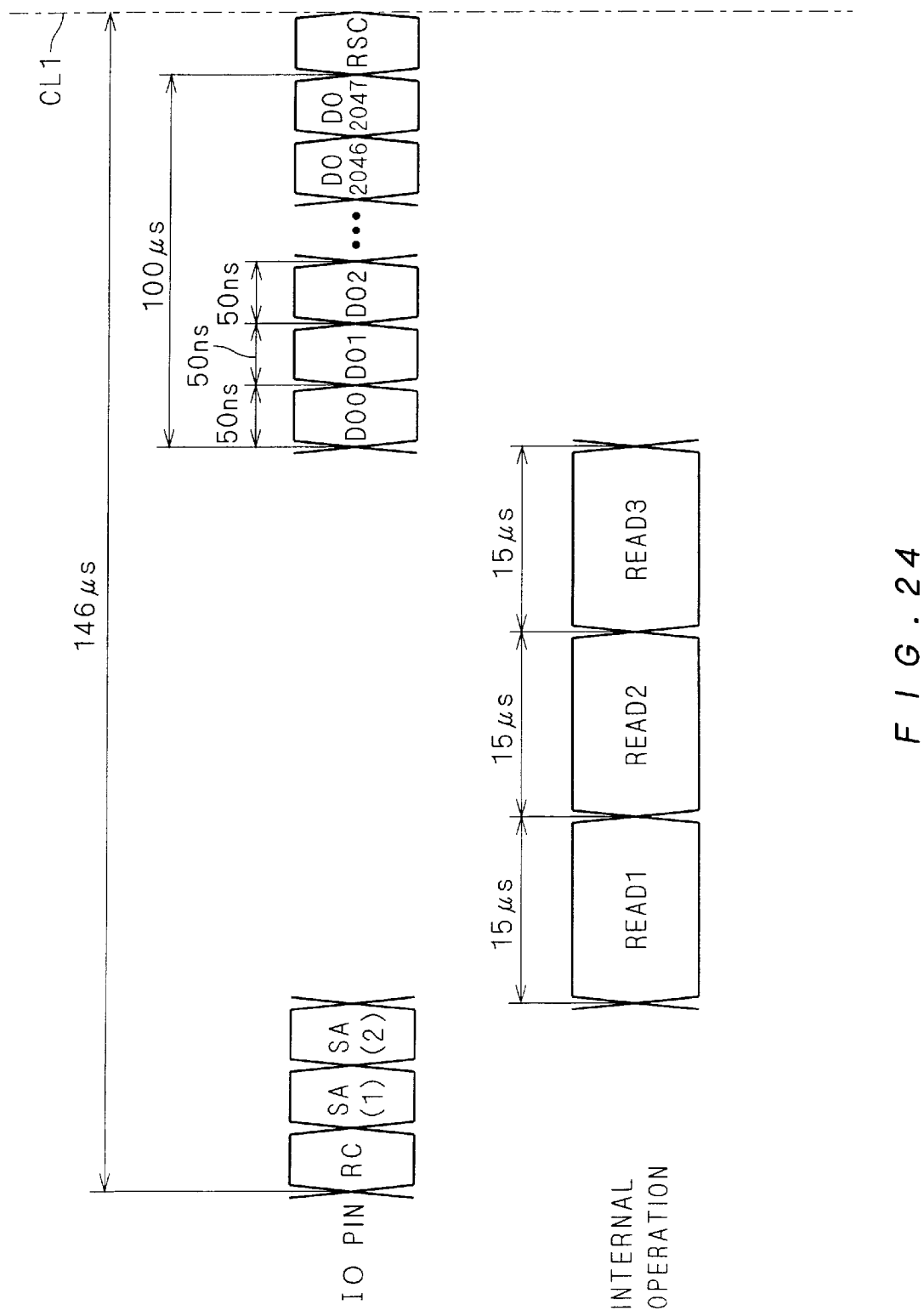
FIGS. 24 and 25 are timing charts showing a conventional reading operation for a test.
Figure 25:
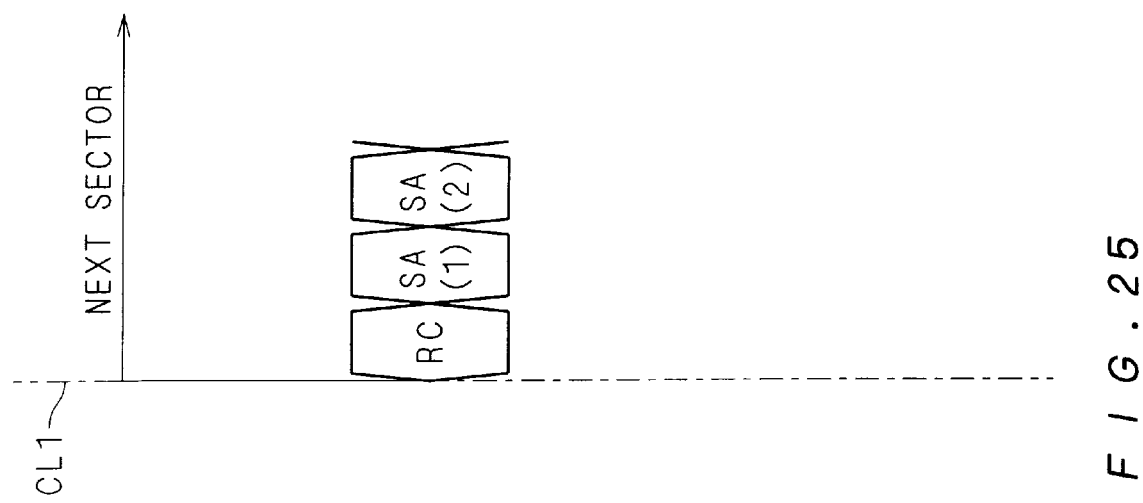
Figure 26:
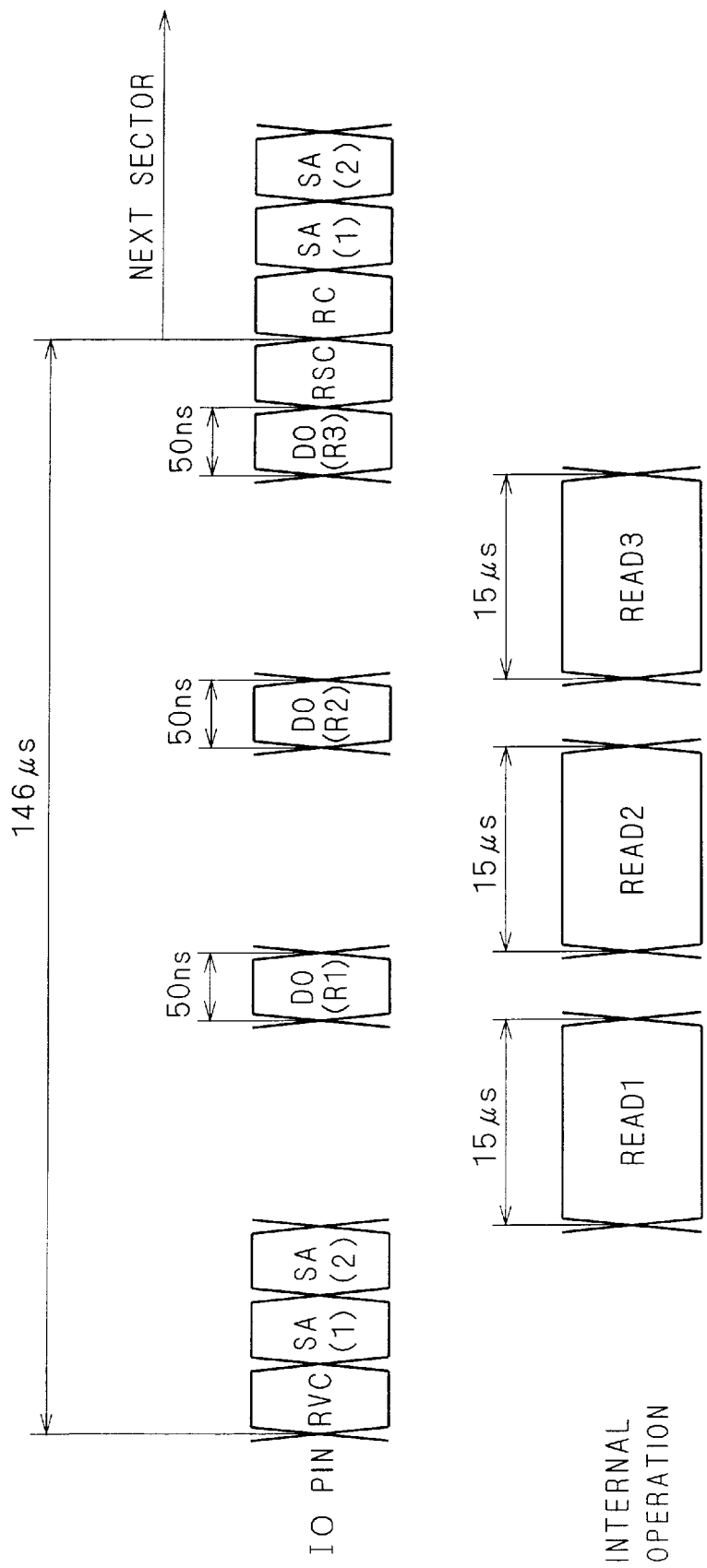
FIG. 26 is a timing chart showing a reading operation for a test according to the first embodiment.

FIGS. 24 and 25 are timing charts showing a conventional reading operation for a test which is carried out through the normal reading operation. FIG. 26 is a timing chart showing the reading operation for a test according to the first embodiment.

In FIGS. 24, 25 and 26, RC denotes a read command, RVC denotes a read verify command, SA(1) and SA(2) denote address inputs, DO0 to DO2047 denote data outputs for 1 sector (2 Kbytes), DO (R1) to DO (R3) denote decision result outputs obtained after the first to third read READ1 to READ3, and RSC denotes a reset command.

As shown in FIGS. 24 and 25, all the 2 Kbyte data obtained after the execution of the first to third read READ1 to READ3 as internal operations are externally sent as data outputs from the IO pin. Therefore, a time required for the reading operation for a test is 146 μs per sector.

On the other hand, when the reading operation for a test of the flash memory according to the first embodiment is executed as shown in FIG. 26, it is sufficient that 1 byte data DO (R1) to DO (R3) obtained after the execution of the first to third read READ1 to READ3 are externally output three times in total. Therefore, the time required for the reading operation for a test can be shortened to approximately one-third of a conventional time, that is, 46 μs per sector.

Second Embodiment

Figure 27:
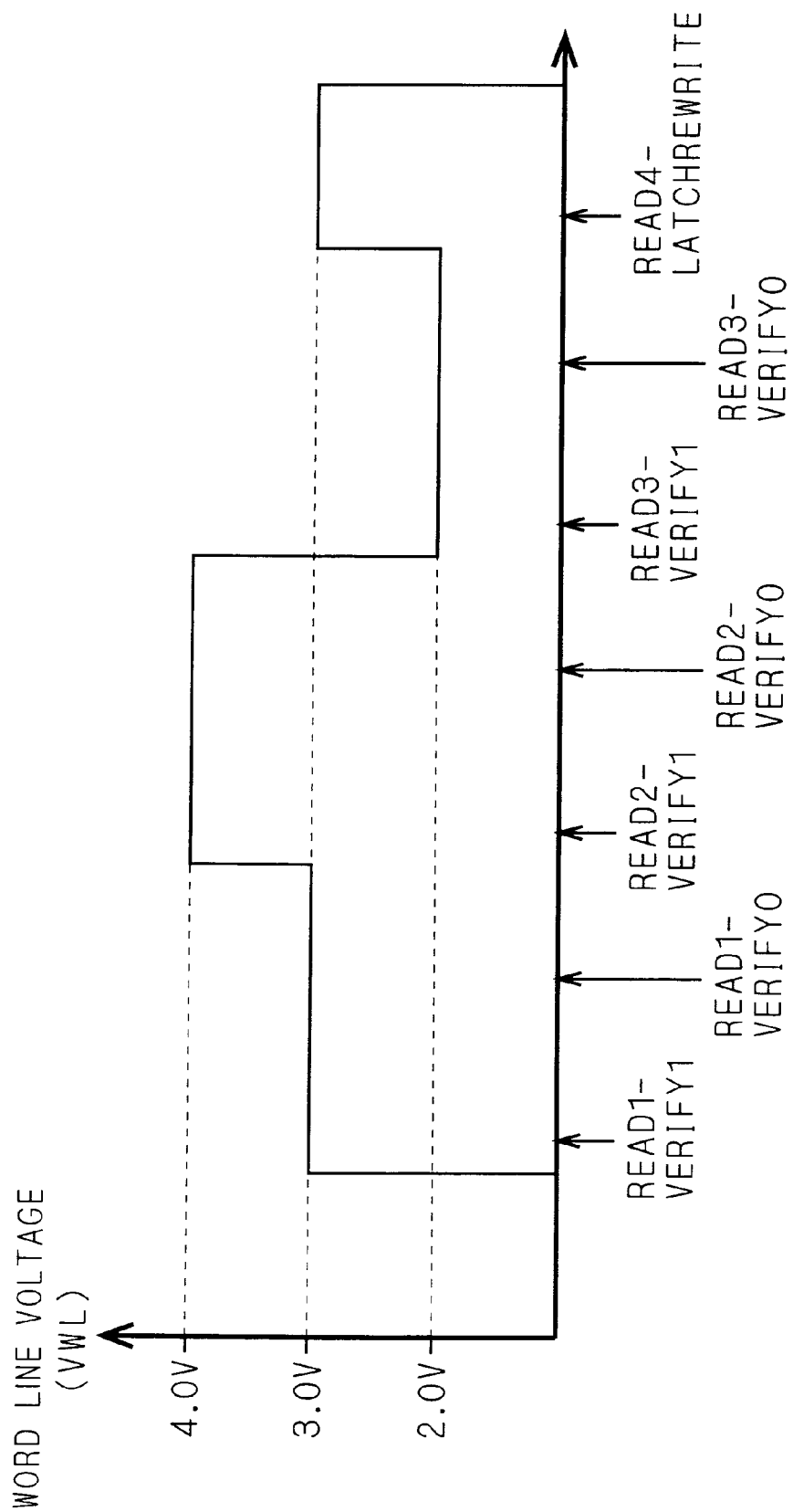
FIG. 27 is a chart showing a reading operation method for a test of a flash memory according to a second embodiment.

FIG. 27 is a chart showing a method of carrying out a reading operation for a test of a flash memory according to a second embodiment. As shown in FIG. 27, a read verify operation READ1-VERIFY1, a read verify operation READ1-VERIFY0, a read verify operation READ2-VERIFY1, a read verify operation READ2-VERIFY0, a read verify operation READ3-VERIFY1, a read verify operation READ3-VERIFY0, and a read latch rewrite operation READ4-LATCHREWRITE are executed in order. In the read verify operation READ1-VERIFY1, the read verify operation READ1-VERIFY0 and the read latch rewrite operation READ4-LATCHREWRITE, a word line voltage VWL is set to 3.0 V and a word line is selected. In the read verify operation READ2-VERIFY1 and the read verify operation READ2-VERIFY0, the word line voltage VWL is set to 4.0 V and a word line is selected. In the read verify operation READ3-VERIFY1 and the read verify operation READ3-VERIFY0, the word line voltage VWL is set to 2.0 V and a word line is selected.

FIG. 28 is a circuit diagram showing a structure of an ALL deciding circuit 5B to be used in the second embodiment. The ALL deciding circuit 5B is constituted by a resistor R12, a common signal line 23, inverters I11 and I12, and a plurality of selection transistors QS having an NMOS structure.

The selection transistors QS are provided corresponding to all latches L3 of a sense latch group 3, and have gates connected to nodes N1 of the corresponding latches L3, drains connected to the common signal line 23 and sources grounded.

The common signal line 23 is connected to a power supply through the resistor R12, and a signal obtained from the common signal line 23 is output as a decision result ALL5B through the inverters I11 and I12 connected in series.

In the ALL deciding circuit 5B having such a structure, the decision result ALL5B is set to "L" when all the values of the nodes N1 of the latches 3 of the sense latch group 3 are "0", and at least one of the selection transistors QS is brought into an ON state so that the decision result ALL5B is set to "H" when at least one of the values is "1". Thus, the ALL deciding circuit 5B can decide whether the nodes N1 of all the latches L3 of the sense latch group 3 are "0".

Other hardware structures of the flash memory according to the second embodiment are the same as the structure according to the first embodiment shown in FIG. 1 except that the ALL deciding circuit 5A is replaced with the ALL deciding circuit 5B.

FIGS. 29 to 85 are diagrams showing a principle of a reading operation for a test. In these drawings, a data latch group 1, a sense latch group 3 and a data latch group 2 have four latches L1, four latches L3 and four latches L2 for 1-bit read data storage, respectively.

The latches L1 and L3 are provided corresponding to a bit line on a memory cell array 11, and the latches L2 and L3 are provided corresponding to a bit line on a memory cell array 12. For convenience of explanation, the four latches L1, the four latches L3 and the four latches L2 are shown. Actually, there are latches corresponding to the number of bit lines in a sector unit.

In these drawings, it is assumed that expectation data are set to quaternary-valued selection memory cells corresponding to the latches L1, L3 and L2 of the data latch group 1, the sense latch group 3 and the data latch group 2 in order of "01", "00", "10" and "11" from the top, respectively. More specifically, ("0", "0", "1", "1") to be high order bits of the expectation data are latched onto the data latch group 1, and ("0", "1", "1", "0") to be inverted values of low order bits of the expectation data are stored in the data latch group 2.

Moreover, the left node N1 of the latch L3 of the sense latch group 3 is connected to the latch L1 and the right node N2 is connected to the latch L2. A numeral on the left of the latch L3 denotes a state of the node N1 and a numeral on the right denotes a state of the node N2. The latch data of the latch L2 imply the contents of the latch on the node N2 side.

With reference to these drawings, description will be given to the reading operation for a test according to the second embodiment.

First of all, the read verify operation READ1-VERIFY1 is executed to carry out read verify of 1-bit read data (latch data of the two latches L3 from the top of the sense latch group 3) corresponding to the expectation data "01" and "00" after the first read READ1.

First of all, the first read READ1 is carried out to latch data ("1", "1", "0", "0") read from the memory cell array 12 onto the sense latch group 3 as shown in FIG. 29.

Next, the following sequence is executed to exclude bits of expectations "10" and "11" (latch data of the two latches L3 from the bottom of the sense latch group 3) from ALL decision.

After all the bit lines of the memory cell array 11 are discharged (set to "0"), the bit line of the memory cell array 11 is selectively precharged based on the latch data of the sense latch group 3 (only a bit line corresponding to the latch data "1" is set to "1" and others are maintained as they are). Then, the bit line of the memory cell array 11 is selectively discharged based on the latch data of the data latch group 1 (only the bit line corresponding to the latch data "1" is set to "0" and others are maintained as they are). As a result, all the bit lines of the memory cell array 11 are set to "0" as shown in FIG. 30.

Figure 31:
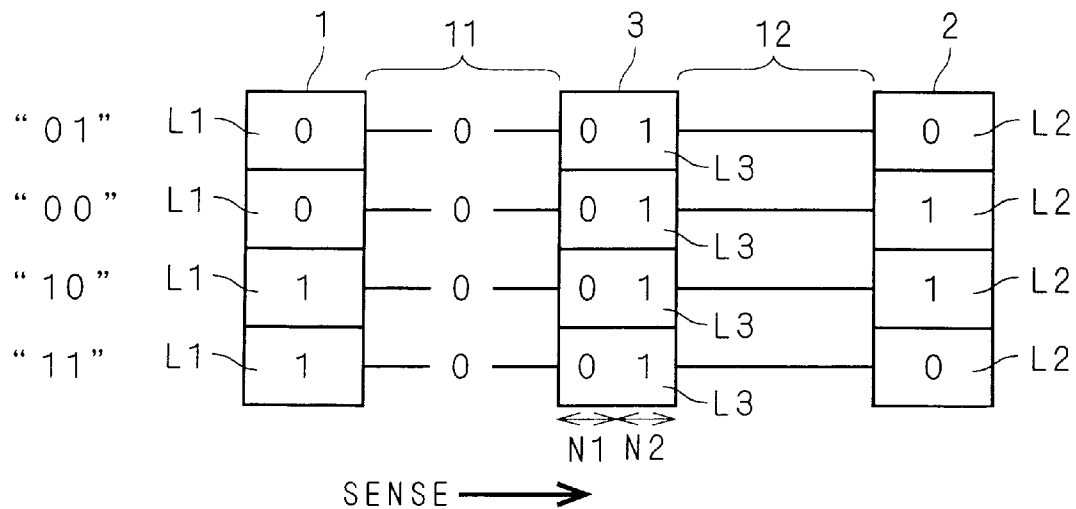

Subsequently, the data on the bit line of the memory cell array 11 are sensed and latched again through the sense latch group 3. As shown in FIG. 31, consequently, only the latch data "1" in the data latch group 1 are transferred to the latch data of the sense latch group 3 (node N2 side) and all the latch data of the sense latch group 3 are set to "1".

Figure 32:
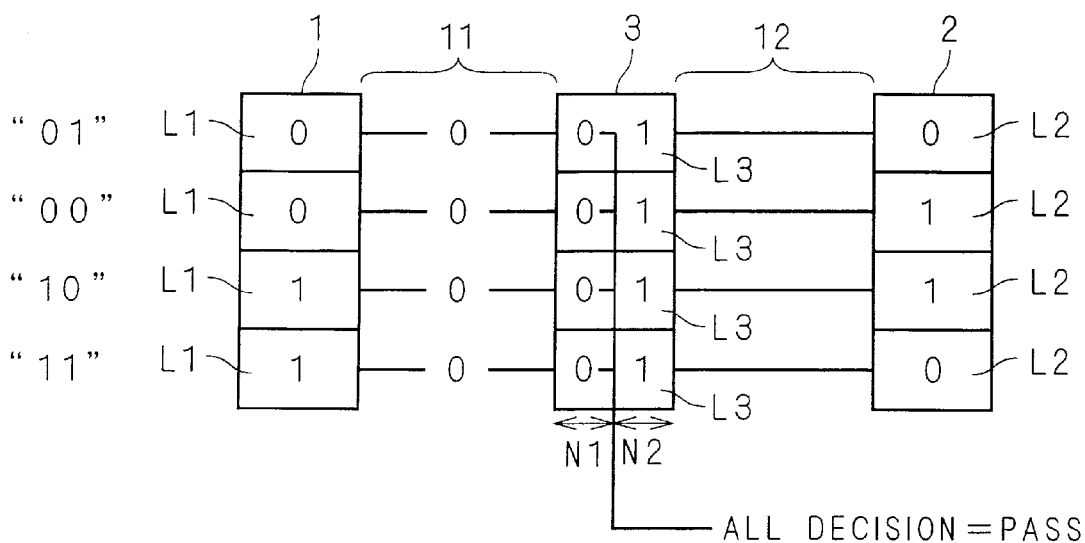

As shown in FIG. 32, thereafter, whether all the values of the node N1 of the latch L3 of the sense latch group 3 are "0" is decided based on the decision result ALL5B of the ALL deciding circuit 5B. Consequently, the read verify operation READ1-VERIFY1 to be read verify for the bits of the expectations "01" and "00" is completed.

Figure 86:
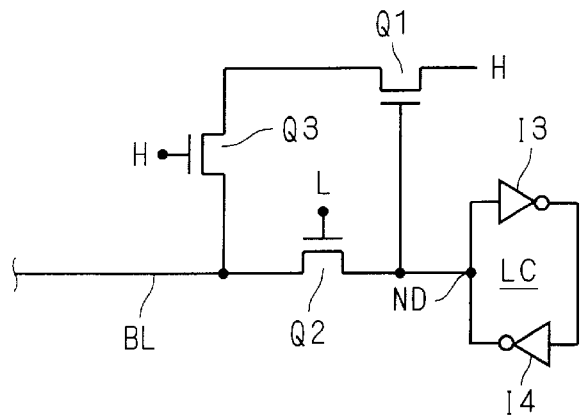
FIG. 86 is a circuit diagram illustrating a selective precharging operation.
Figure 87:
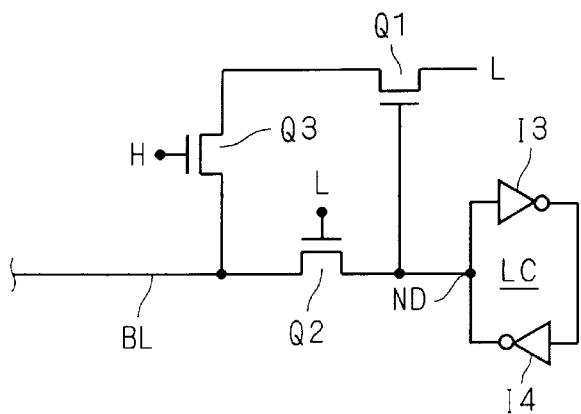
FIG. 87 is a circuit diagram illustrating a selective discharging operation.
Figure 88:
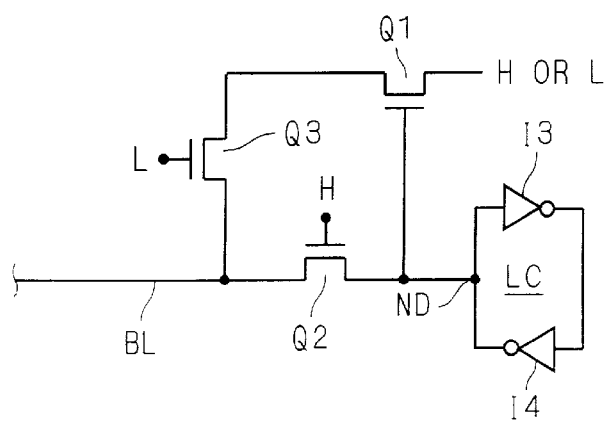
FIG. 88 is a circuit diagram illustrating a sense operation to be carried out through a latch.

FIG. 86 is a circuit diagram illustrating the selective precharging operation. FIG. 87 is a circuit diagram illustrating the selective discharging operation. FIG. 88 is a circuit diagram illustrating a sense operation to be carried out through a latch. As shown in these drawings, NMOS transistors Q1 to Q3 are provided for each bit line BL corresponding to a node ND (a node where the latch data of the latch L1 are obtained, a node where the latch data of the latch L2 are obtained, a node N1 or a node N2 of the latch L3) of a latch LC (any of the latches L1 to L3).

The NMOS transistor Q1 has a gate connected to the node ND and one of electrodes of the NMOS transistor Q2, and has one of electrodes to receive a control signal and the other electrode connected to the bit line BL through the NMOS transistor Q3. The NMOS transistor Q2 has a gate to receive a control signal and the other electrode connected to the bit line BL.

As shown in FIG. 86, the selective precharging operation is carried out by giving a control signal for setting one of the electrodes of the NMOS transistor Q1 to "H", the gate of the NMOS transistor Q2 to "L" and the gate of the NMOS transistor Q3 to "H". Accordingly, if the latch data obtained from the node ND of the latch LC are "1" ("H"), the NMOS transistor Q1 is brought into an ON state and "H" is set to the bit line BL. If the latch data are "0" ("L"), the bit line BL holds a value set previously.

As shown in FIG. 87, the selective discharging operation is carried out by giving a control signal for setting one of the electrodes of the NMOS transistor Q1 to "L", the gate of the NMOS transistor Q2 to "L" and the gate of the NMOS transistor Q3 to "H". Accordingly, if the latch data obtained from the node ND of the latch LC are "1" ("H"), the NMOS transistor Q1 is brought into the ON state and "L" is set to the bit line BL. If the latch data are "0" ("L"), the bit line BL holds a value set previously.

As shown in FIG. 88, the sense operation is carried out by giving a control signal for optionally setting one of the electrodes of the NMOS transistor Q1, the gate of the NMOS transistor Q2 to "H" and the gate of the NMOS transistor Q3 to "L". Accordingly, after an electric potential of the bit line BL is sensed by the latch LC through the node ND, it is latched as latch data.

Returning to FIGS. 33 to 36, the read verify operation READ1-VERIFY0 is executed subsequently to the read verify operation READ1-VERIFY1 so that the read verify for the bits of the expectations "10" and "11" is carried out (the latch data of the two latches L3 from the bottom of the sense latch group 3).

Figure 33:
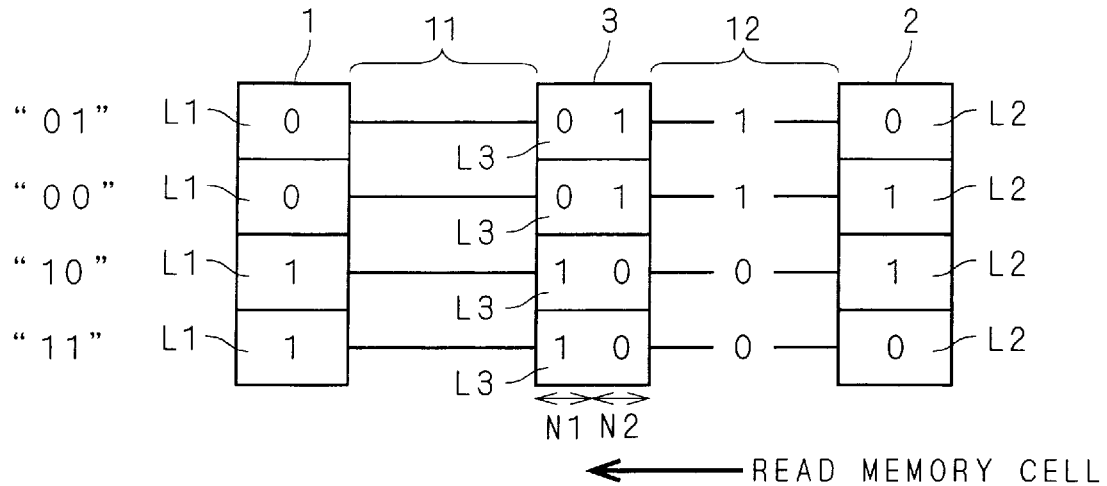

First of all, the first read READ1 is carried out to latch data ("1", "1", "0", "0") read from the memory cell array 12 onto the sense latch group 3 as shown in FIG. 33.

Next, the following sequence is executed to exclude bits of expectations "00" and "01" (the latch data of the two latches L3 from the top of the sense latch group 3) from ALL decision.

Figure 34:
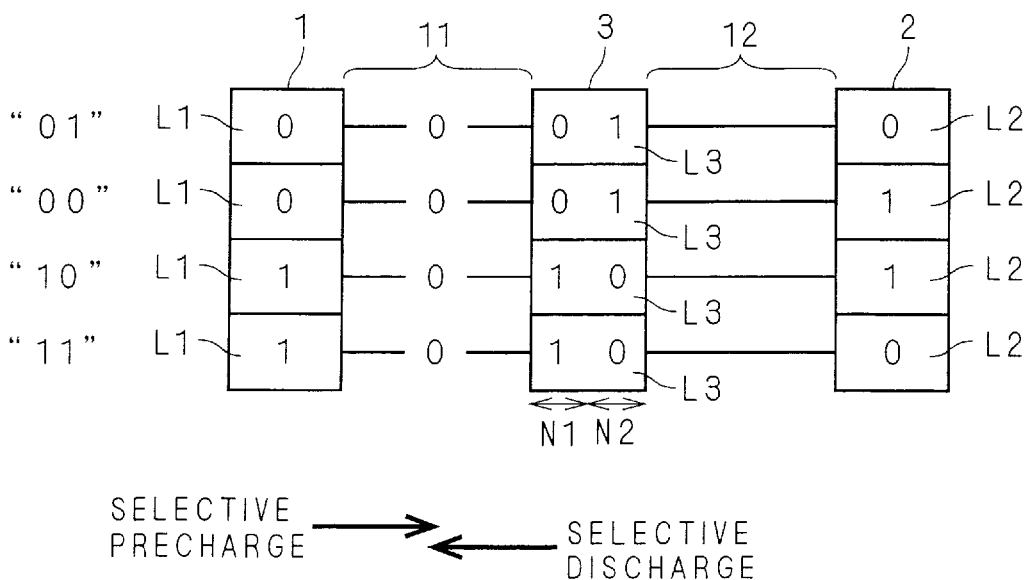

After all the bit lines of the memory cell array 11 are discharged, the bit line of the memory cell array 11 is selectively precharged based on the latch data of the data latch group 1. Then, the bit line of the memory cell array 11 is selectively discharged based on the latch data of the sense latch group 3. As a result, all the bit lines of the memory cell array 11 are set to "0" as shown in FIG. 34.

Figure 35:
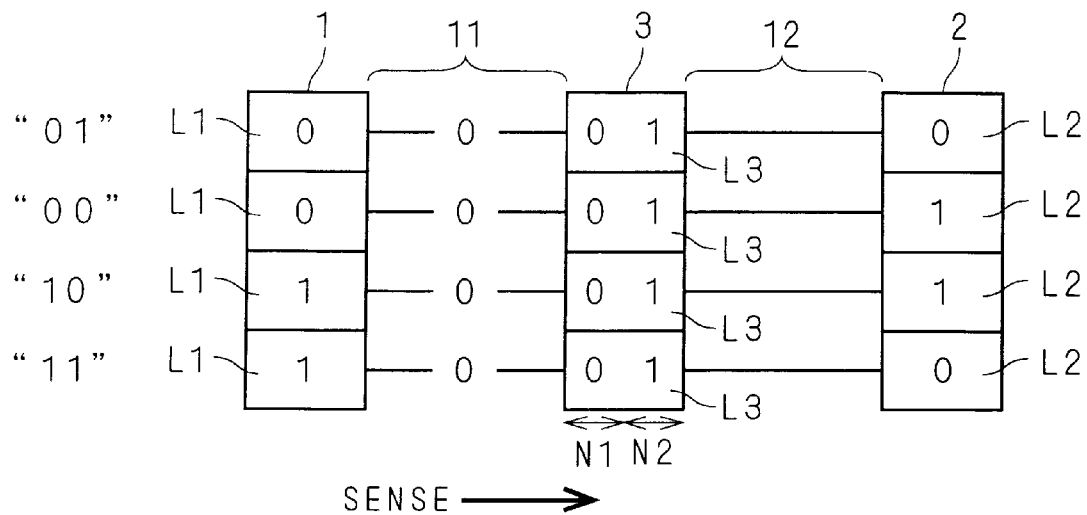

Then, the data on the bit line of the memory cell array 11 are sensed through the sense latch group 3. As shown in FIG. 35, consequently, all the latch data of the sense latch group 3 are set to "1".

Figure 36:
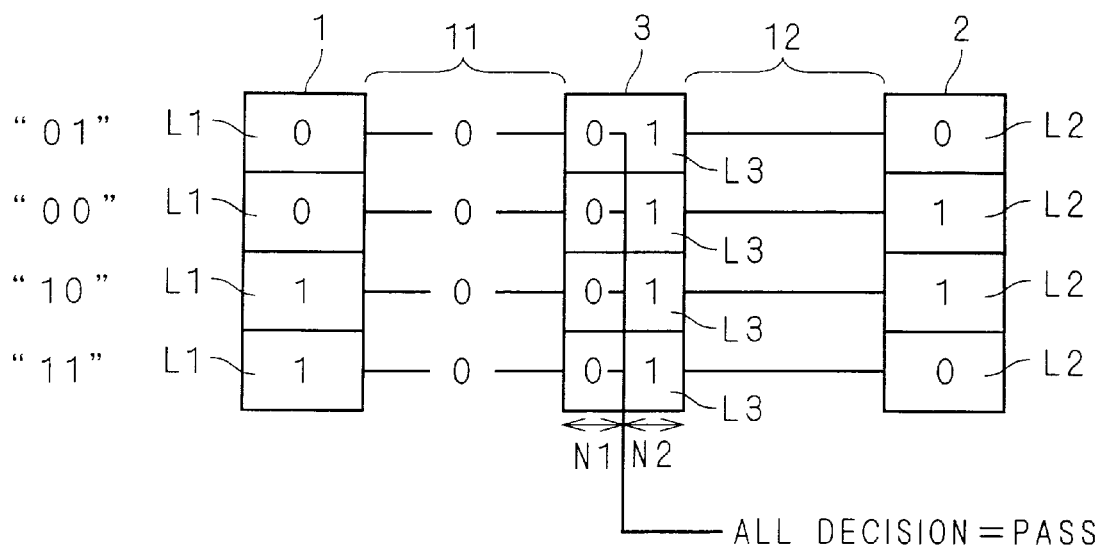
Figure 39:
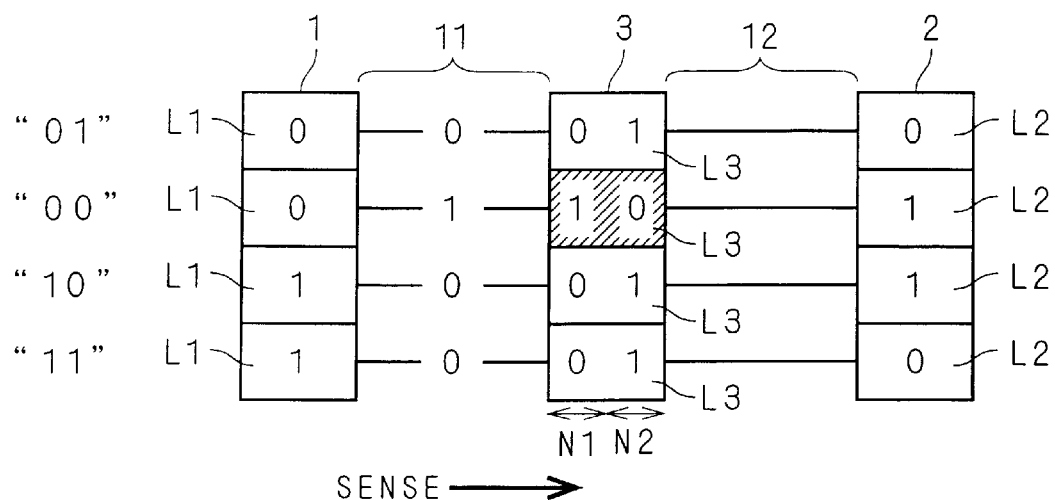

As shown in FIG. 36, thereafter, whether all the values of the node N1 of the latch L3 of the sense latch group 3 are "0" is decided based on the decision result ALL5B of the ALL deciding circuit 5B. Consequently, the read verify operation READ1-VERIFY0 to be read verify for the bits of the expectations "10" and "11" is completed.

Figure 40:
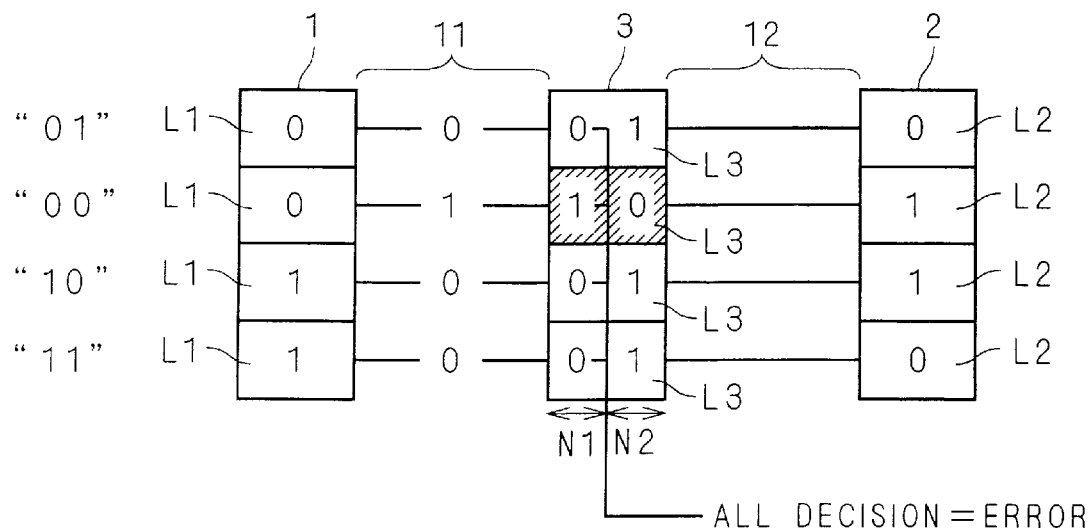
Figure 43:
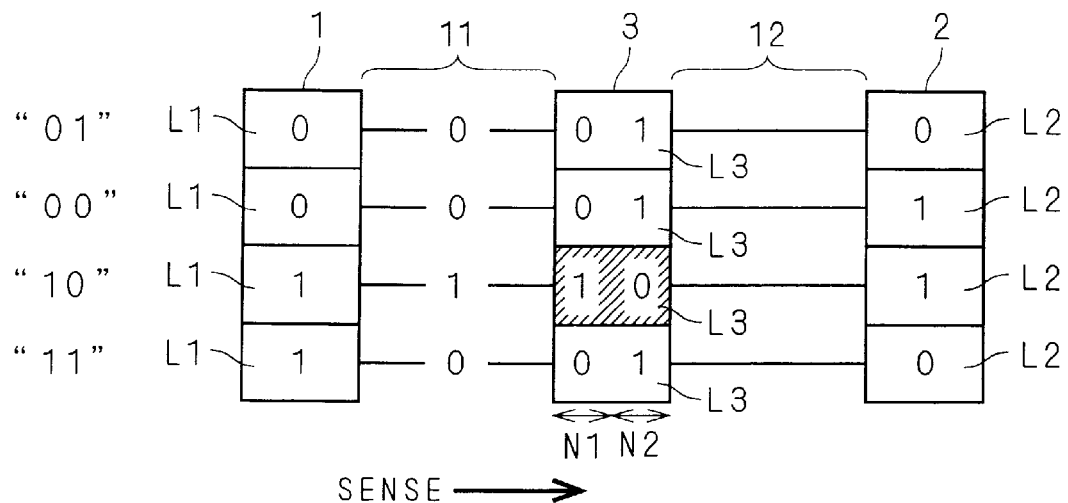

When 1-bit read data of the expectation "00" are erroneously latched as ("1", "0", "0", "0") onto the sense latch group 3 during the execution of the first read READ1 in the read verify operation READ1-VERIFY1, "1" is generated on a part (hatching portion) of the value of the node N1 of the latch L3 of the sense latch group 3 shown in FIG. 40 through processes illustrated in FIGS. 37 to 40. Therefore, it is possible to detect an error by the read verify operation READ1-VERIFY1.

Figure 44:
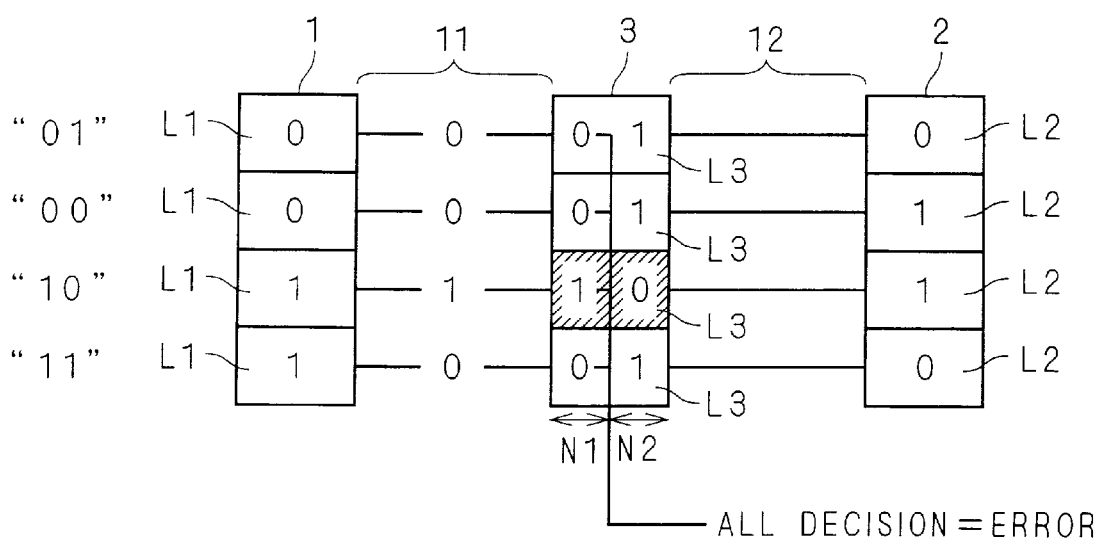
Figure 57:
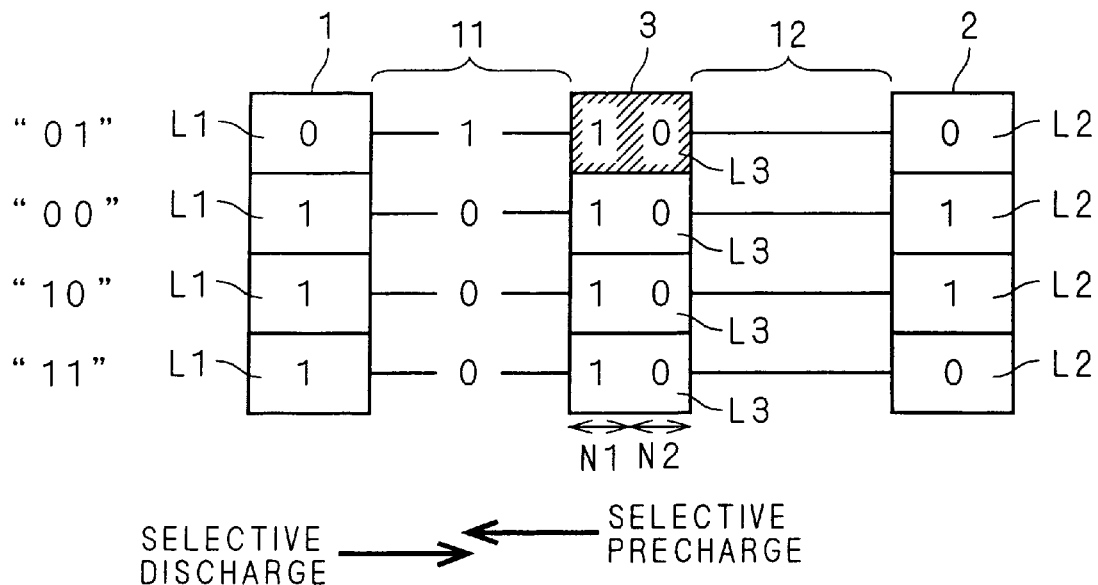
Figure 58:
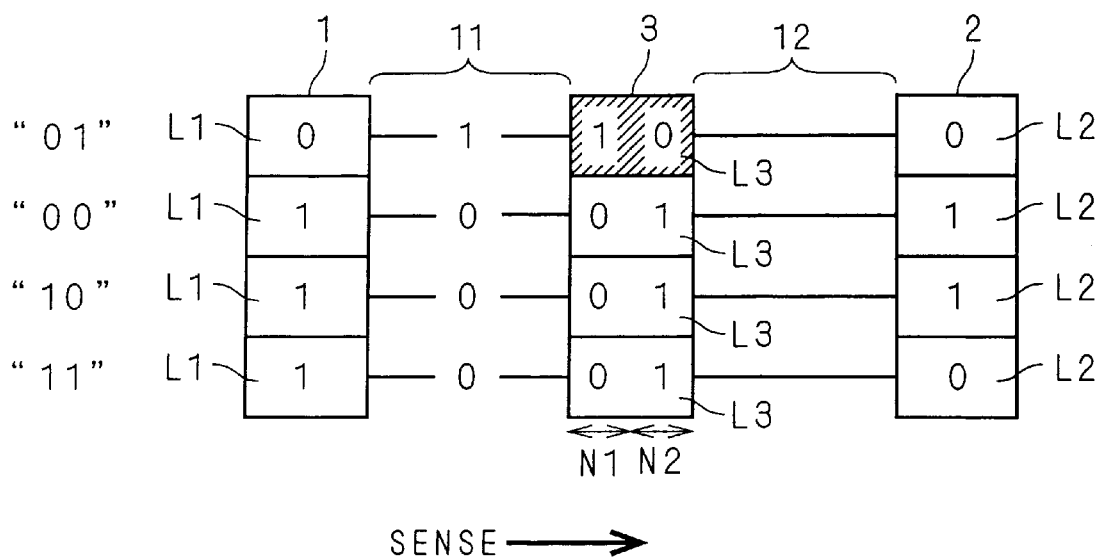
Figure 61:
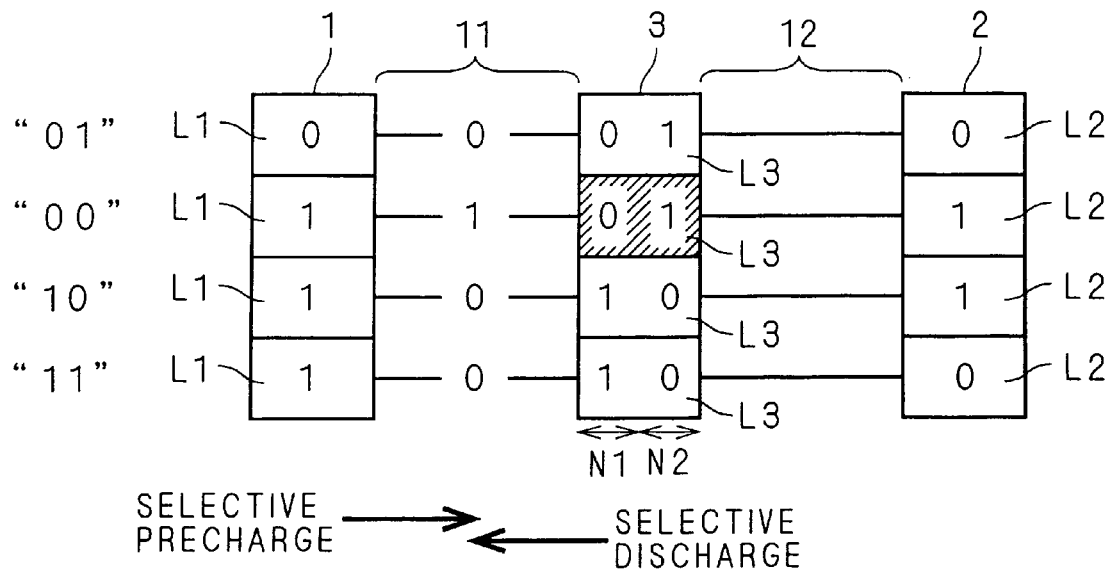
Figure 62:
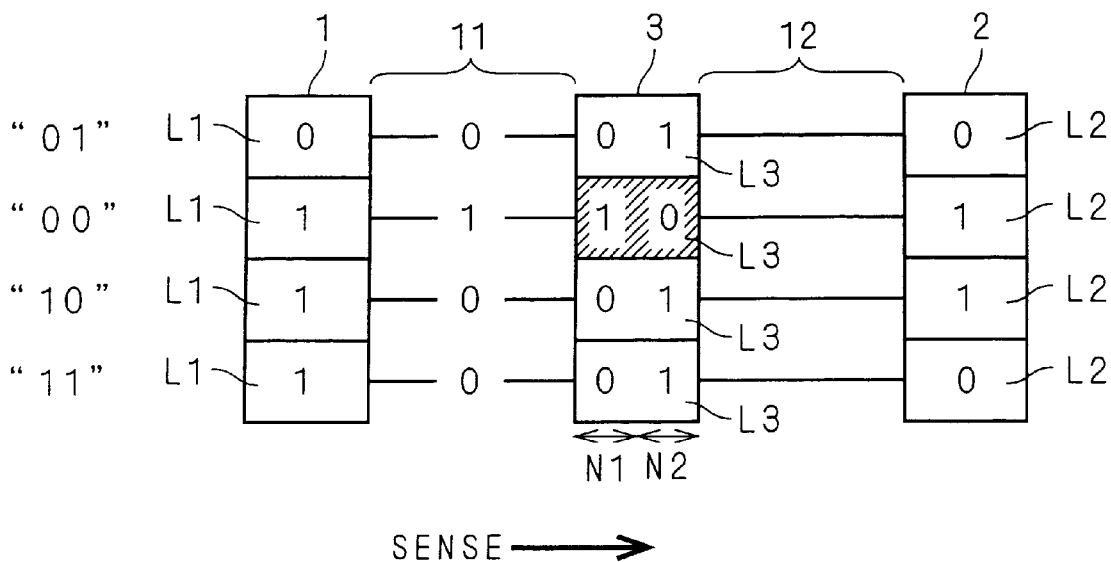

Similarly, when 1-bit read data of the expectation "10" are erroneously latched as ("1","1", "1", "0") onto the sense latch group 3 during the execution of the first read READ1 in the read verify operation READ1-VERIFY0, "1" is generated on a part (hatching portion) of the value of the node N1 of the latch L3 of the sense latch group 3 shown in FIG. 44 through processes illustrated in FIGS. 41 to 44.

Therefore, it is possible to detect an error by the read verify operation READ1-VERIFY0.

Next, in the case in which the read verify operation READ2-VERIFY1 and the read verify operation READ2-VERIFY0 which are related to the second read READ2 are to be executed, a preparing operation for changing the contents of the data latch group 1 is carried out. Since the preparing operation does not access a memory cell, an electrical potential of a word line is set optionally.

As shown in FIG. 45, all the bit lines of the memory cell array 12 are first precharged and a selective discharging operation is then carried out based on the latch data of the data latch group 2. Thereafter, the bit line of the memory cell array 12 is sensed by the sense latch group 3.

As shown in FIG. 46, subsequently, all the bit lines of the memory cell array 11 are discharged and a selective precharging operation is then carried out based on the latch data of the data latch group 1. Furthermore, the selective precharging operation is carried out based on the latch data of the sense latch group 3. The two selective precharging operations may be executed in any order.

As shown in FIG. 47, the contents of the bit line of the memory cell array 11 are sensed by the data latch group 1. Consequently, 1-bit expectation data having latch data corresponding to a bit line having the expectation "01" set to "0" and latch data corresponding to bit lines having the expectations "00", "10" and "11" set to "1" are latched onto the data latch group 1.

Next, the same processing as the read verify operation READ1-VERIFY1 is executed as shown in FIGS. 48 to 51. Consequently, the read verify operation READ2-VERIFY1 for carrying out the read verify of 1-bit read data of the expectation "01" obtained after the second read READ2 is executed.

Subsequently, the same processing as the read verify operation READ1-VERIFY0 is executed as shown in FIGS. 52 to 55. Consequently, the read verify operation READ2-VERIFY0 for carrying out the read verify of 1-bit read data of the expectations "00", "10" and "11" obtained after the second read READ2 is executed.

When 1-bit read data of the expectation "01" are erroneously latched as ("0", "0", "0", "0") onto the sense latch group 3 during the execution of the second read READ2 in the read verify operation READ2-VERIFY1, "1" is generated on a part (hatching portion) of the value of the node N1 of the latch L3 of the sense latch group 3 shown in FIG. 59 through processes illustrated in FIGS. 56 to 59. Therefore, it is possible to detect an error by the read verify operation READ2-VERIFY1.

Figure 63:
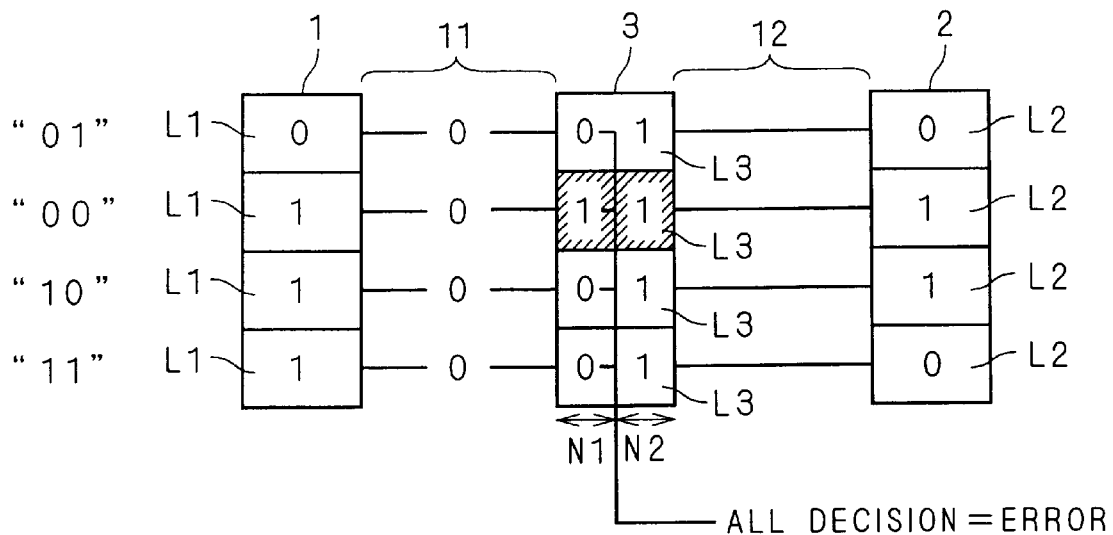

Similarly, when 1-bit read data of the expectation "00" are erroneously latched as ("1", "1", "0", "0") onto the sense latch group 3 during the execution of the first read READ1 in the read verify operation READ2-VERIFY0, "1" is generated on a part (hatching portion) of the value of the node N1 of the latch L3 of the sense latch group 3 shown in FIG. 63 through processes illustrated in FIGS. 60 to 63. Therefore, it is possible to detect an error by the read verify operation READ2-VERIFY0.

Subsequently, in the case in which the read verify operation READ3-VERIFY1 and the read verify operation READ3-VERIFY0 which are related to the third read READ3 are to be executed, a preparing operation for changing the contents of the data latch group 1 is carried out. Since the preparing operation does not access a memory cell, an electrical potential of a word line is set optionally.

Figure 64:
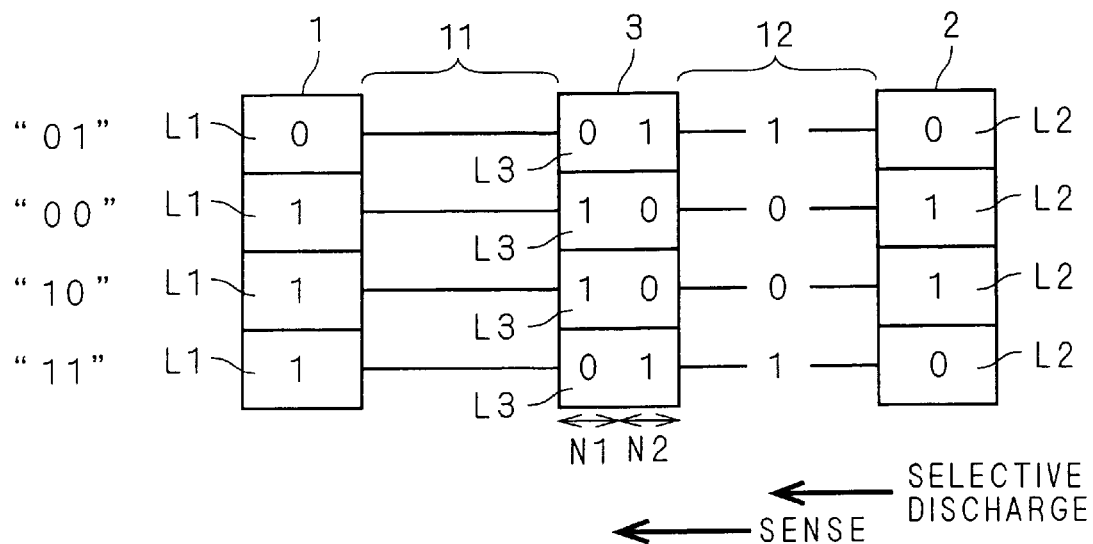

As shown in FIG. 64, all the bit lines of the memory cell array 12 are first precharged and a selective discharging operation is then carried out based on the latch data of the data latch group 2. Thereafter, the bit line of the memory cell array 12 is sensed by the sense latch group 3.

Figure 65:
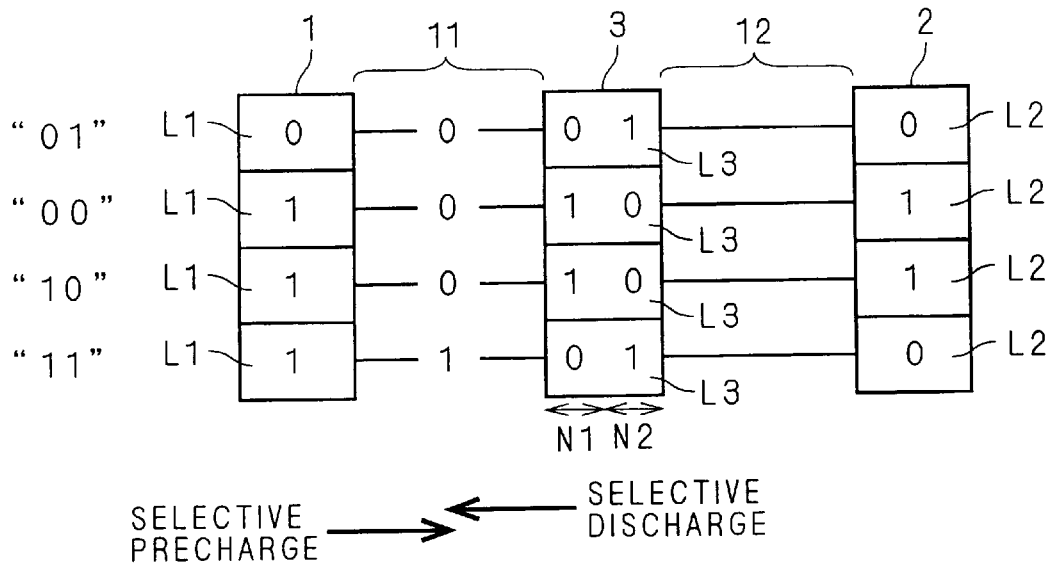

As shown in FIG. 65, all the bit lines of the memory cell array 11 are discharged and a selective precharging operation is then carried out based on the latch data of the data latch group 1. Thereafter, the selective discharging operation is carried out based on the latch data of the sense latch group 3.

Figure 66:
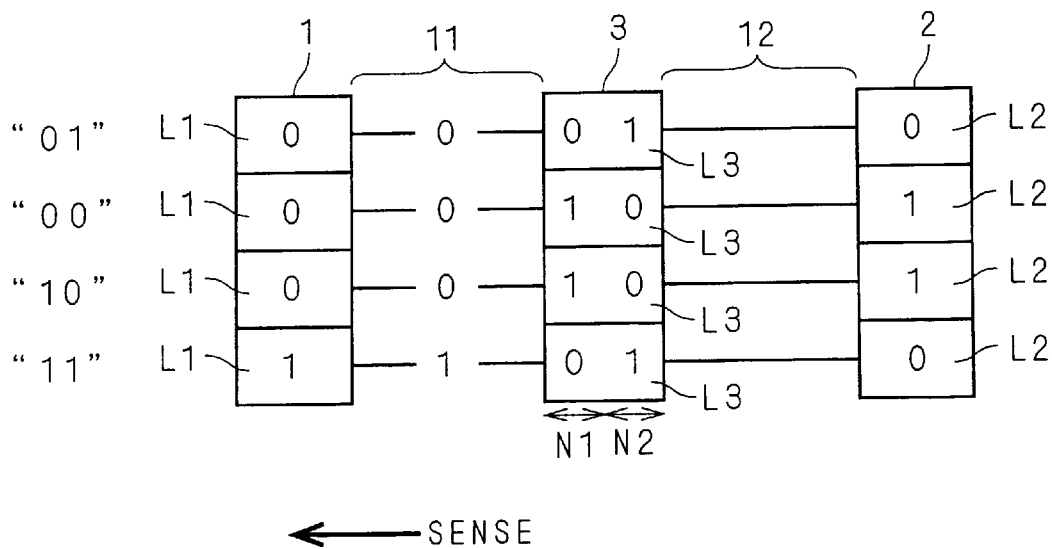
Figure 73:
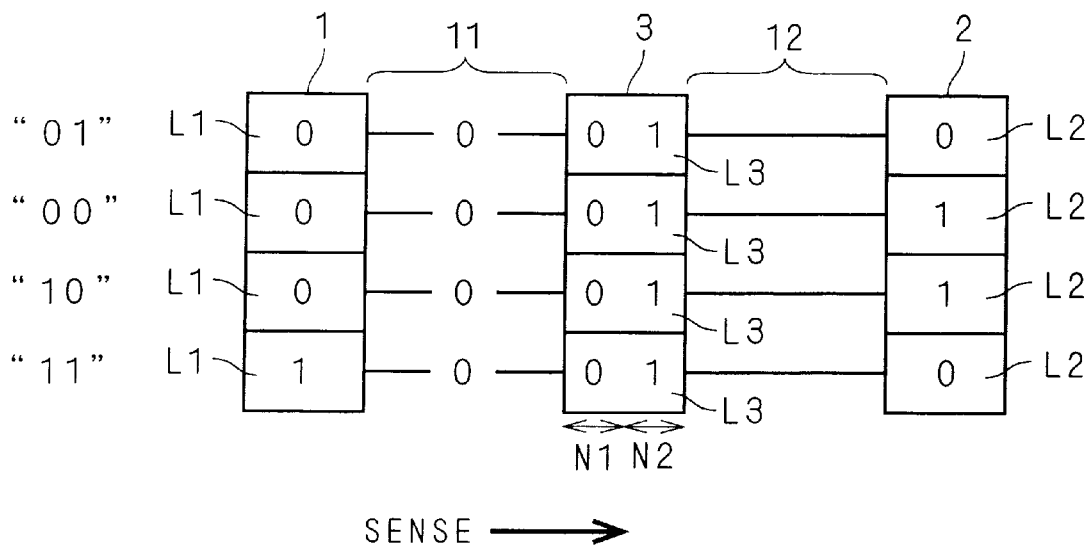
Figure 74:
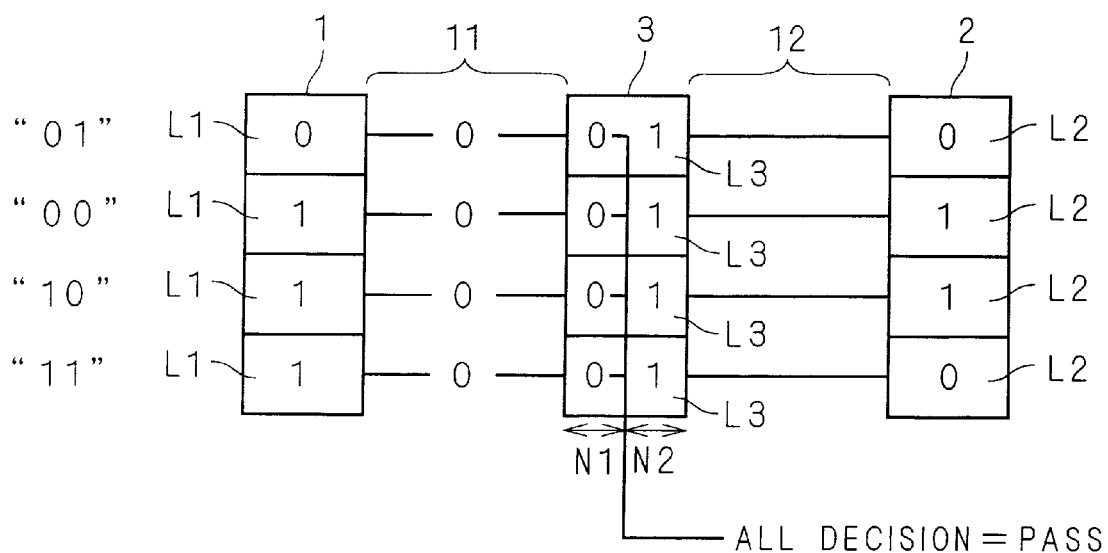
Figure 75:
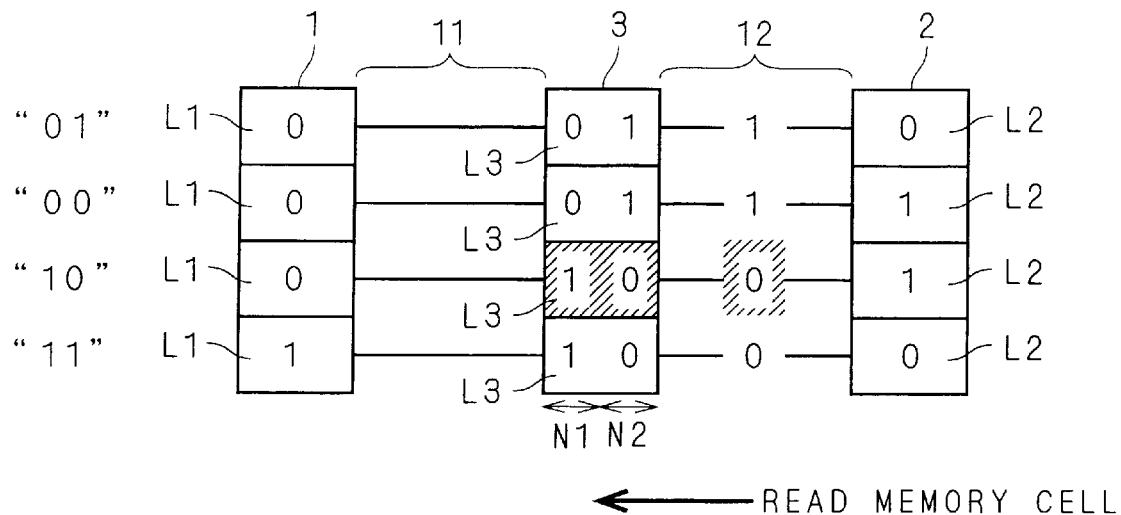
Figure 76:
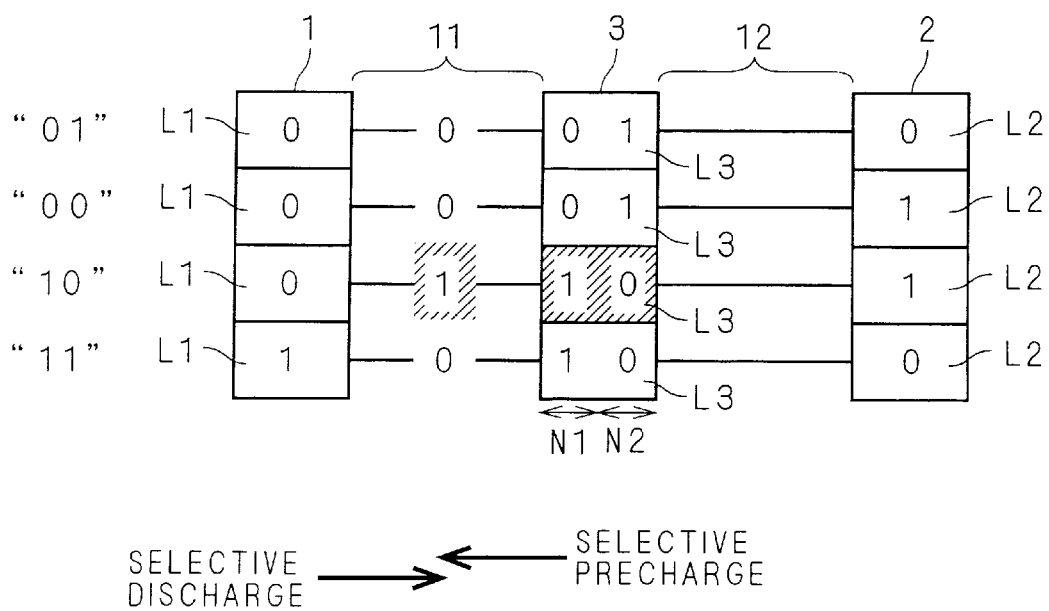
Figure 79:
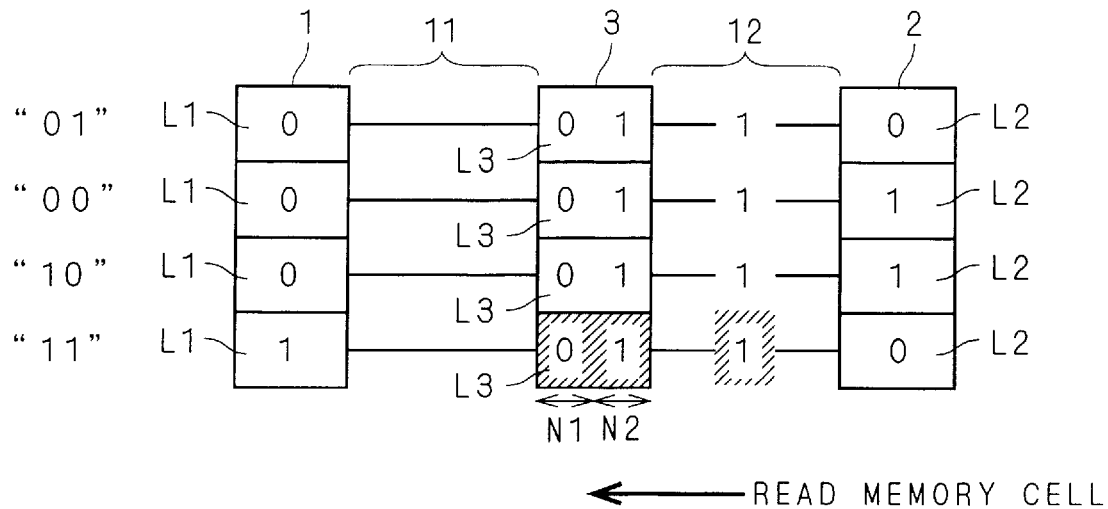
Figure 80:
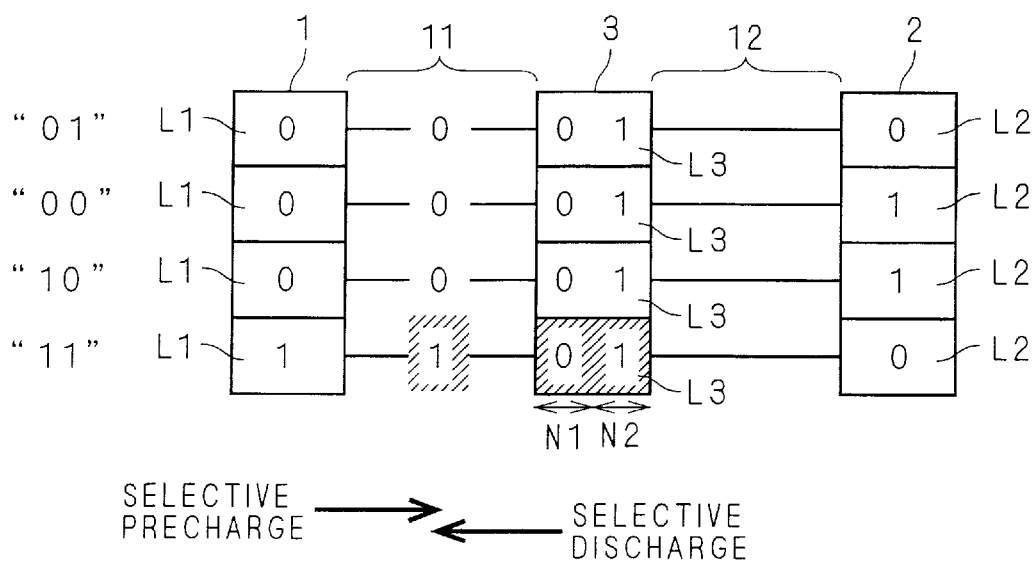

As shown in FIG. 66, the contents of the bit line of the memory cell array 11 are sensed by the data latch group 1. Consequently, 1-bit expectation data having latch data corresponding to bit lines having the expectations "01", "00" and "10" set to "0" and latch data corresponding to a bit line having the expectation "11" set to "1" are latched onto the data latch group 1.

Next, the same processing as the read verify operation READ1-VERIFY1 is executed as shown in FIGS. 67 to 70. Consequently, the read verify operation READ3-VERIFY1 for carrying out the read verify of 1-bit read data of the expectations "01", "00" and "10" obtained after the third read READ3 is executed.

Subsequently, the same processing as the read verify operation READ1-VERIFY0 is executed as shown in FIGS. 71 to 74. Consequently, the read verify operation READ3-VERIFY0 for carrying out the read verify of 1-bit read data of the expectation "11" obtained after the third read READ3 is executed.

When 1-bit read data of the expectation "10" are erroneously latched as ("1", "1", "0", "0") onto the sense latch group 3 during the execution of the third read READ3 in the read verify operation READ3-VERIFY1, "1" is generated on a part (hatching portion) of the value of the node N1 of the latch L3 of the sense latch group 3 shown in FIG. 78 through processes illustrated in FIGS. 75 to 78. Therefore, it is possible to detect an error by the read verify operation READ3-VERIFY1.

Similarly, when 1-bit read data of the expectation "11" are erroneously latched as ("1", "1", "1", "1") onto the sense latch group 3 during the execution of the first read READ1 in the read verify operation READ3-VERIFY0, "1" is generated on a part (hatching portion) of the value of the node N1 of the latch L3 of the sense latch group 3 shown in FIG. 82 through processes illustrated in FIGS. 79 to 82. Therefore, it is possible to detect an error by the read verify operation READ3-VERIFY0.

Finally, a read latch rewrite operation READ4-LATCHREWRITE is executed.

Figure 83:
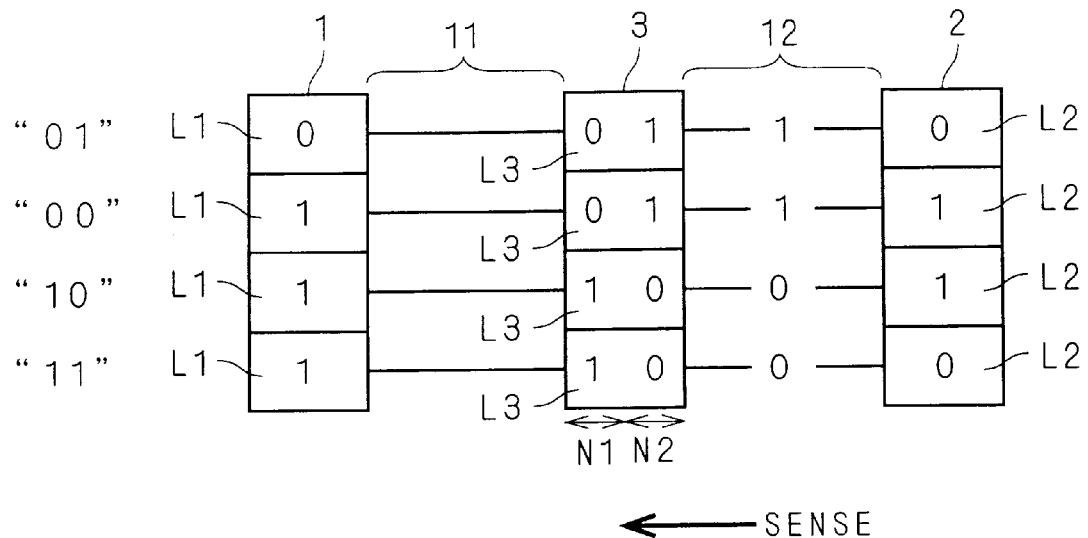

First of all, as shown in FIG. 83, the first read READ1 is executed to latch read data onto the sense latch group 3.

Figure 84:
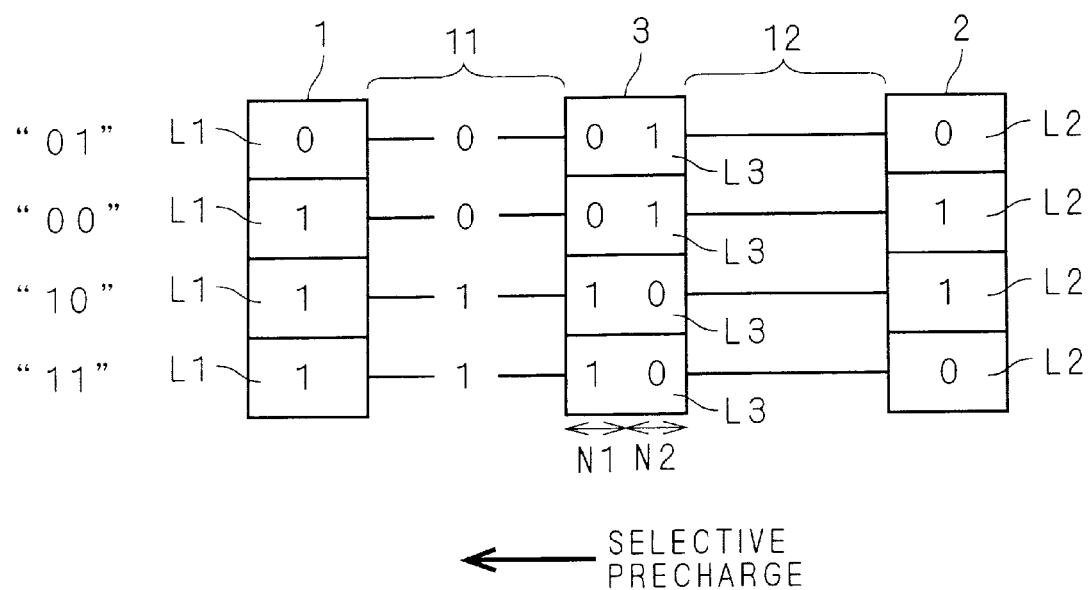

As shown in FIG. 84, all the bit lines of the memory cell array 11 are discharged and a selective precharging operation is then carried out based on the latch data of the data latch group 2.

As shown in FIG. 85, subsequently, the contents of the bit line of the memory cell array 11 are sensed by the data latch group 1 so that the latch data of the data latch group 1 can be returned to initial values ("0", "0", "1", "1").

In the reading operation for a test according to the second embodiment described above, it is necessary to prevent a chip (flash memory) from being defective when an error is detected and to input correct expectation data again when the reading operation for a test is to be carried out continuously.

Thus, the flash memory according to the second embodiment sets the expectation data to the data latch groups 1 and 2 in a sector unit before executing the kth (k=1 to 3) read READ to be a partial reading operation, then executes the kth read READk, and thereafter executes the read verify operations READk-VERIFY1, 0 to output the decision result ALL5B from the ALL deciding circuit 5B. Thus, the reading operation for a test is carried out.

In this case, the data read from the memory cell arrays 11 and 12 are sensed and latched by the sense latch group 3. Therefore, the decision precision of the ALL deciding circuit 5B can be enhanced. Moreover, it is sufficient that the ALL deciding circuit 5B is constituted by the selection transistor QS corresponding to the latch L3 of the sense latch group 3, the common signal line 23, the inverters I11 and I12 and the resistor R12. Therefore, the chip area of the flash memory is rarely increased due to the provision of the ALL deciding circuit 5B.

Figure 89:
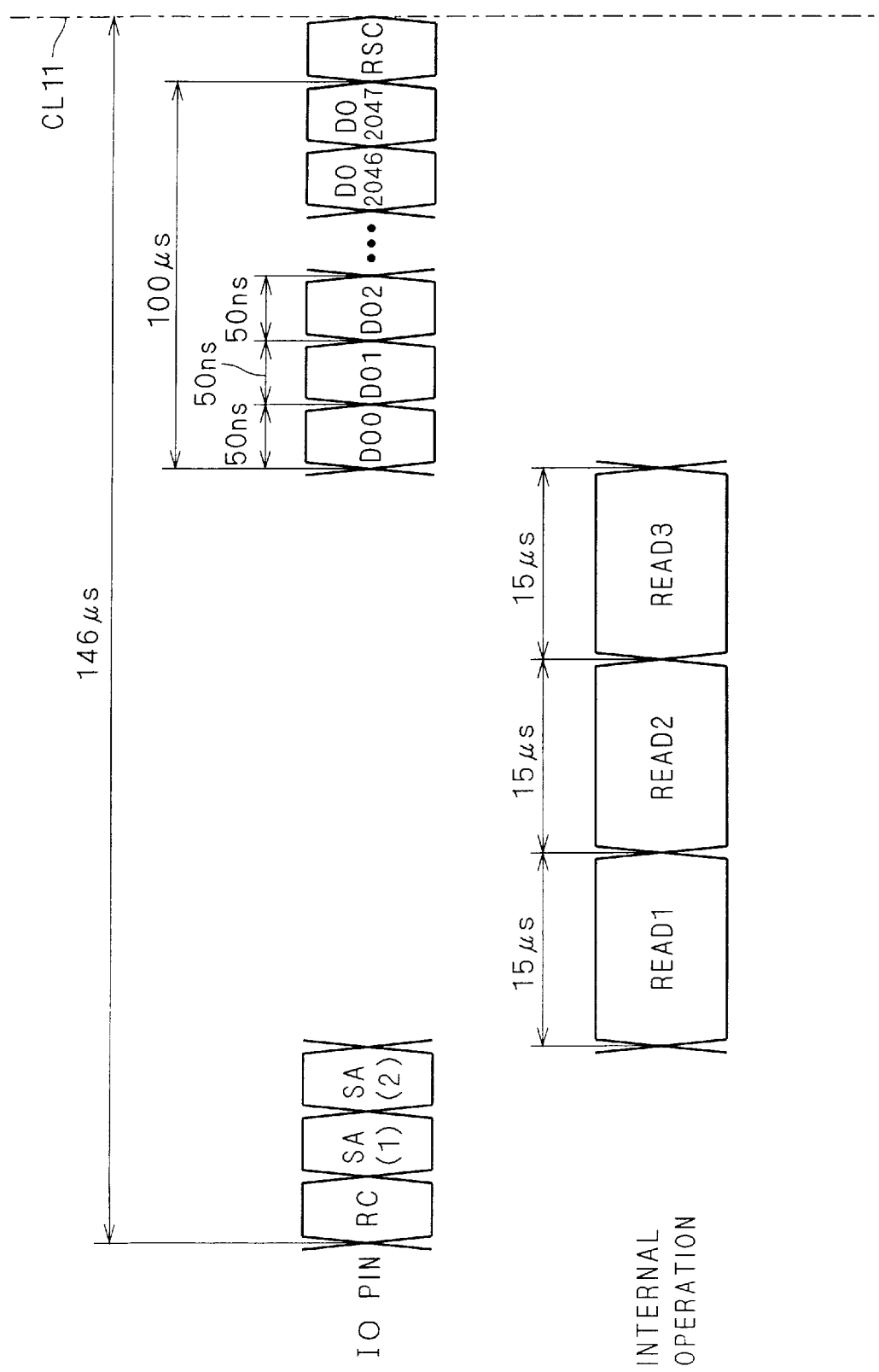
Figure 91:
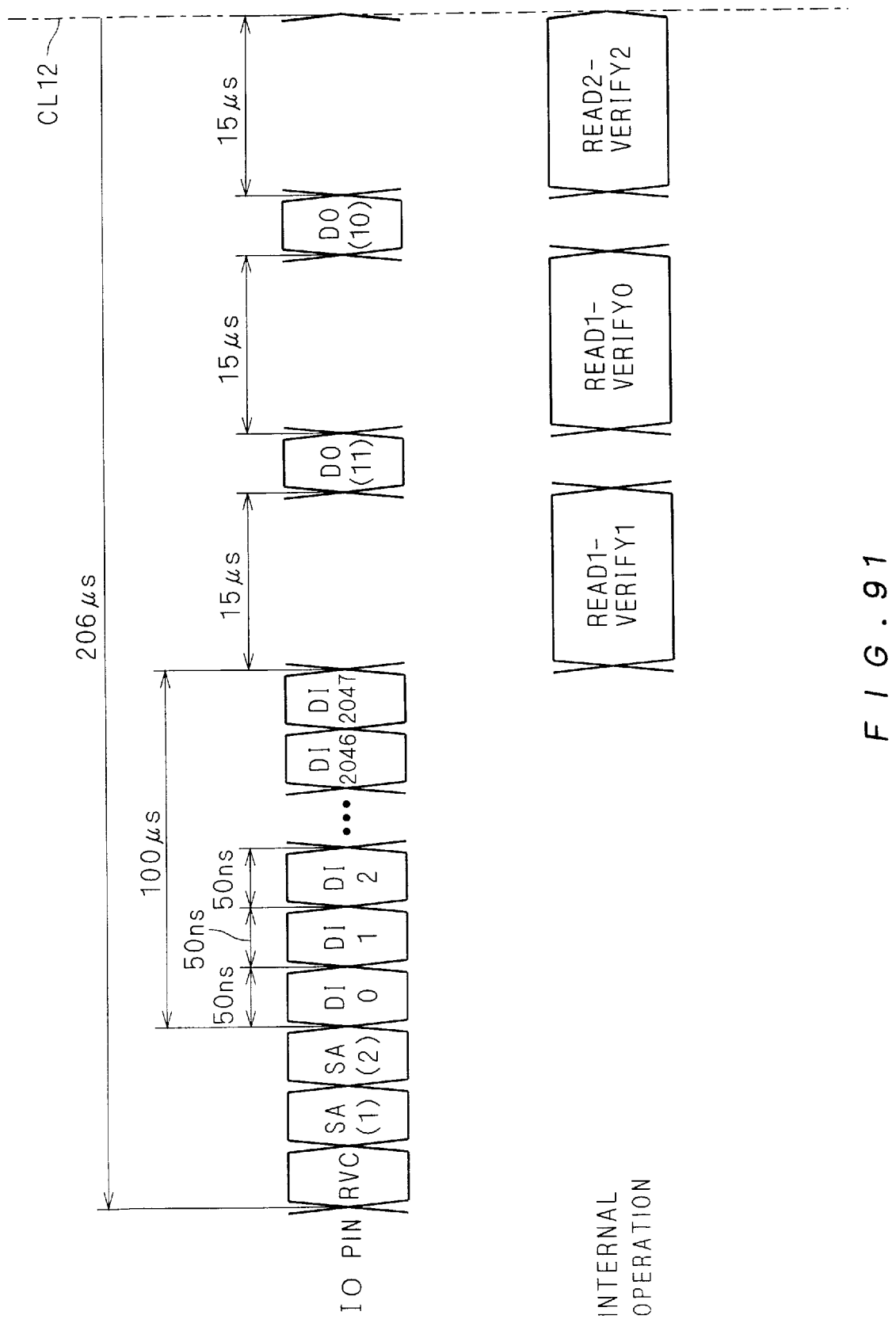
FIGS. 91 to 94 are timing charts showing the contents of the reading operation for a test according to the second embodiment.
Figure 92:
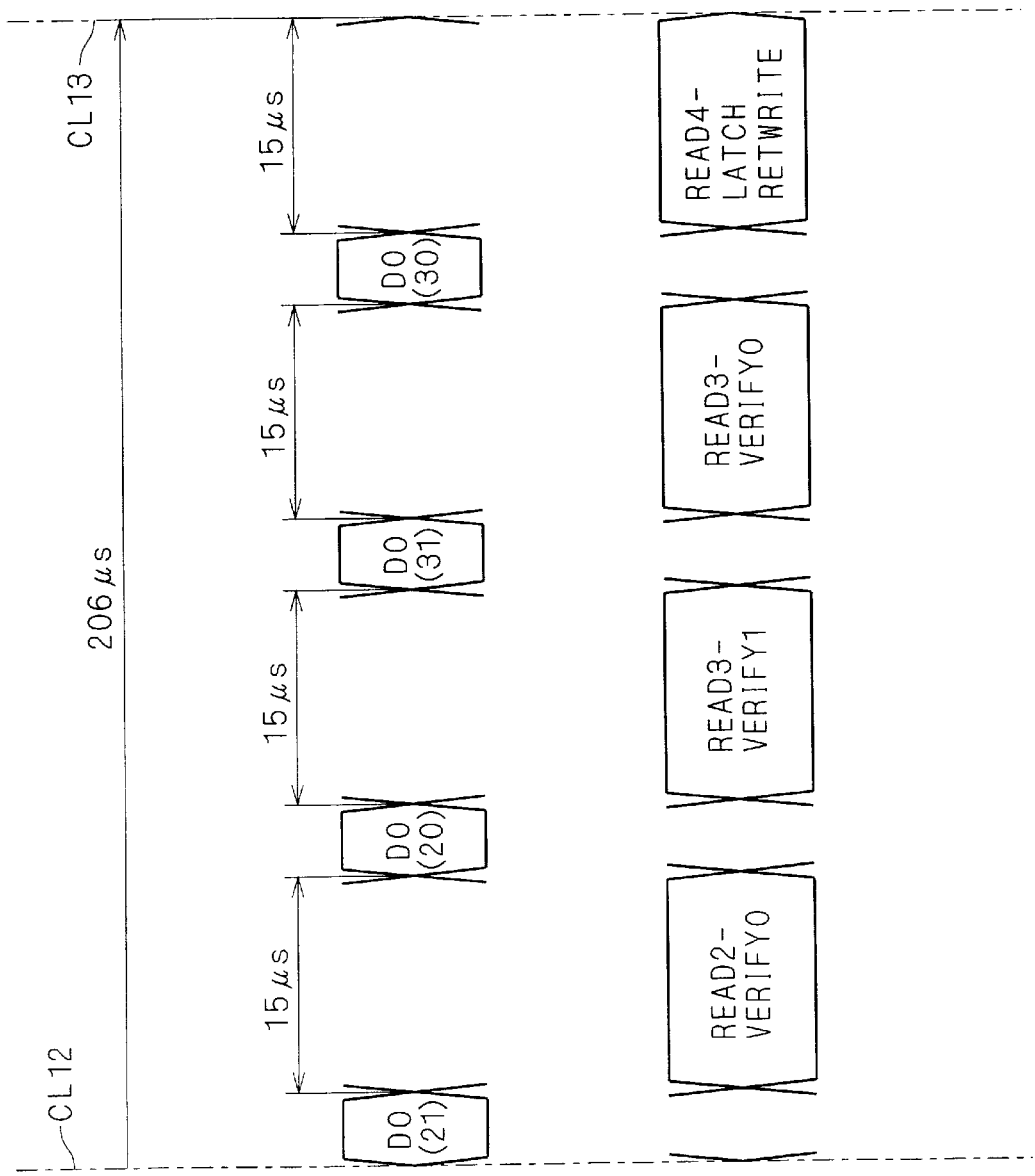
Figure 93:
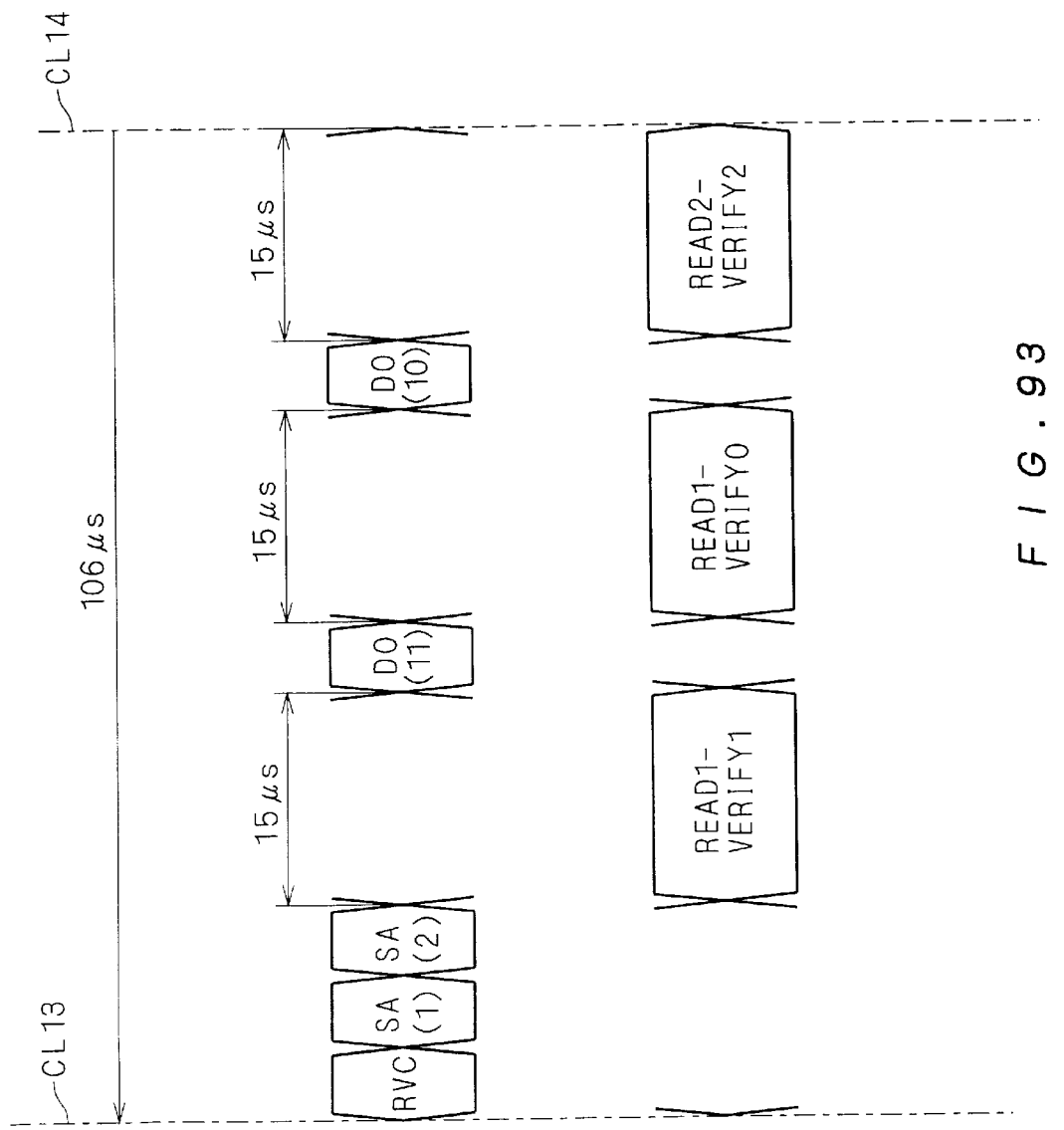
Figure 94:
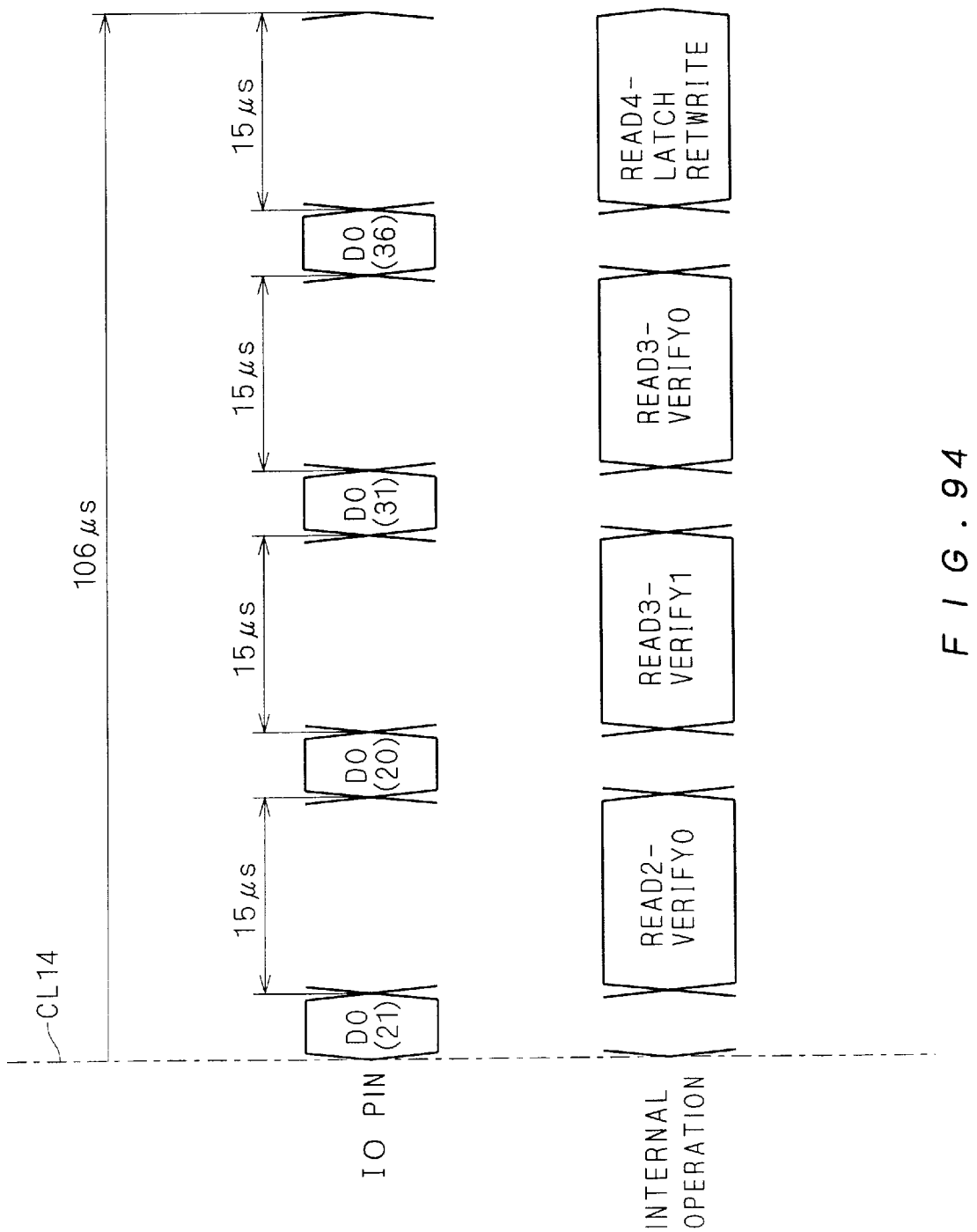
Figures 97, 98:
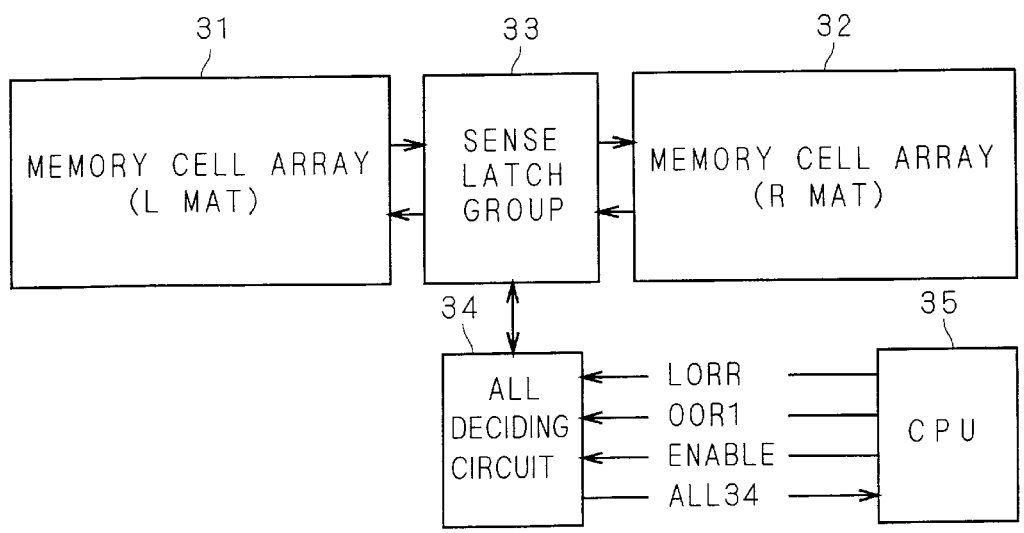
FIG. 97 is a diagram illustrating an octal-valued checker board pattern.
FIG. 98 is a block diagram schematically showing a conventional ALL deciding circuit and a periphery thereof.
Figure 99:
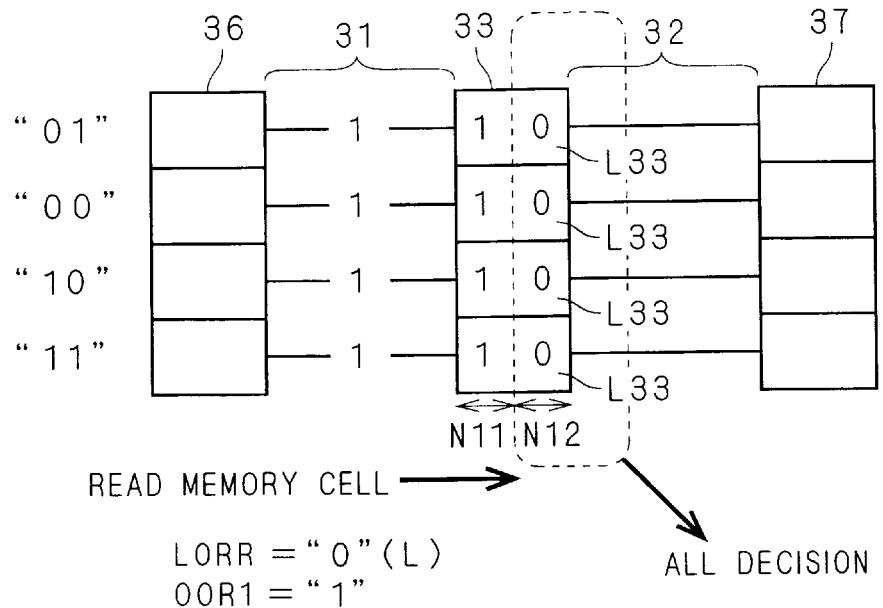
FIGS. 99 to 102 are diagrams showing an operation principle of the conventional ALL deciding circuit.
Figure 100:
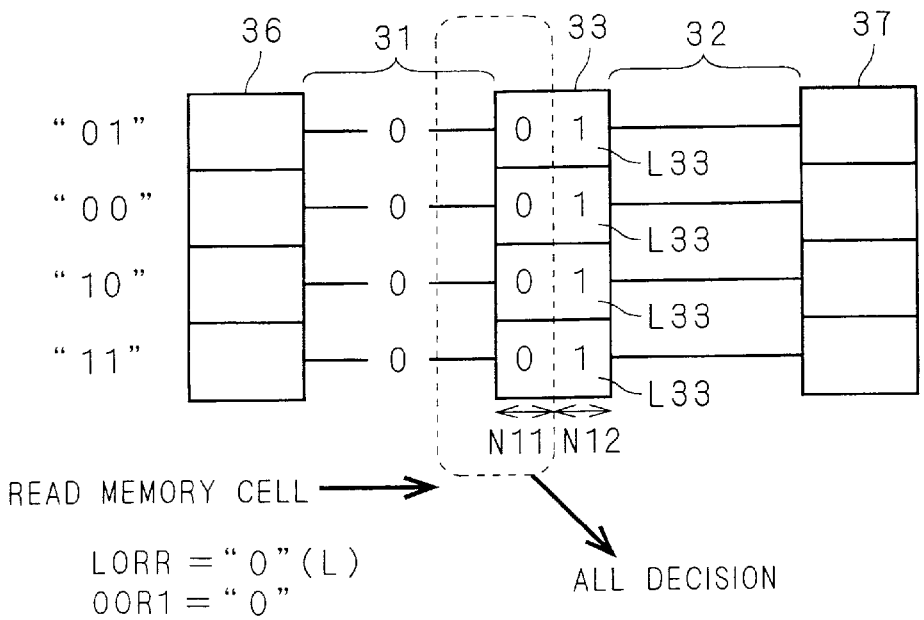
Figure 101:
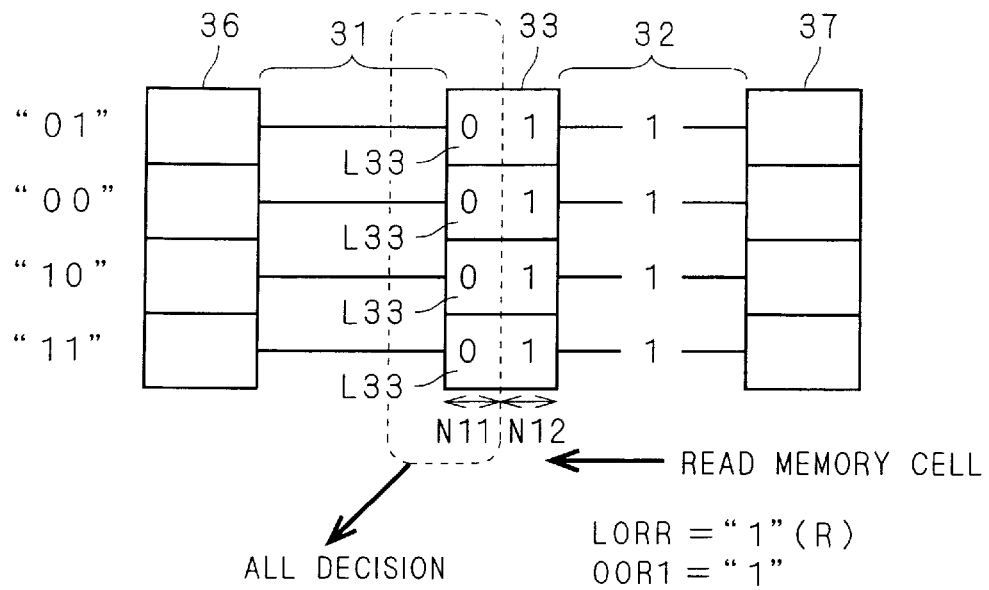
Figure 102:
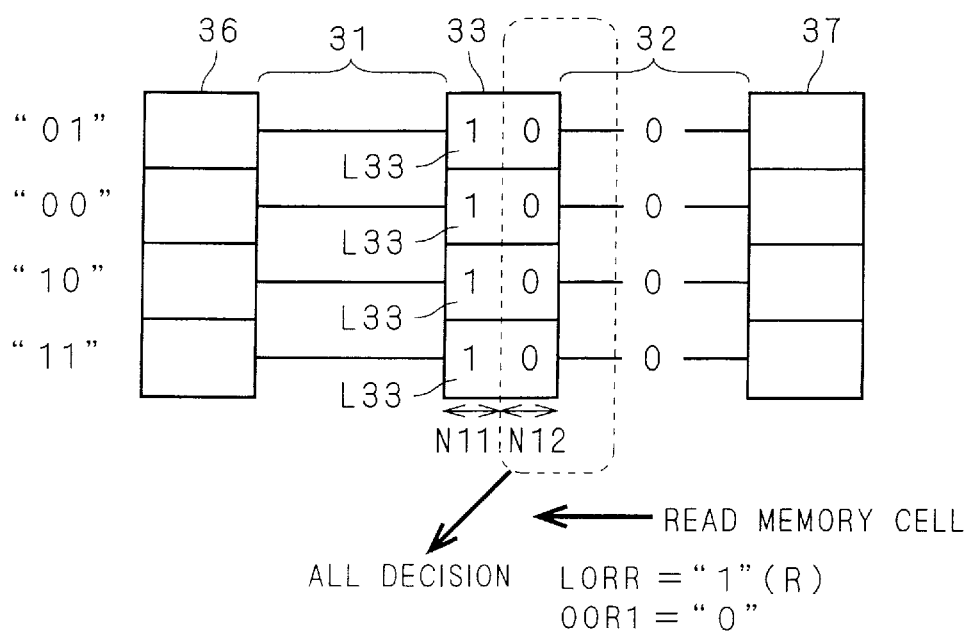

FIGS. 89 and 90 are timing charts showing the contents of a normal reading operation. FIGS. 91 to 94 are timing charts showing the contents of the reading operation for a test according to the second embodiment. As is apparent from the result of comparison of FIGS. 89 and 90 with FIGS. 91 to 94, a data output time (50 ns×2 Kbytes) is required for each sector in the normal reading operation, while a data input time (50 ns×2 Kbytes) for setting expectation data is required and the data input time for setting expectation data is not required for the sector to have the same expectation data as those of a first sector in the reading operation for a test according to the second embodiment. Therefore, in the case in which the expectation data are shared by a large number of sectors, it is possible to decide the presence of reading errors at a high speed through the decision in the normal reading operation.

The preparing operation for the second read READ2 shown in FIGS. 45 to 47 and the preparing operation for the third read READ3 shown in FIGS. 64 to 66 do not read data from the memory cell. Therefore, these preparing operations are omitted from FIGS. 91 to 94 based on the decision that they can be disregarded differently from other operations.

In FIGS. 89 and 90 and FIGS. 91 to 94, RC denotes a read command, RVC denotes a read verify command, SA(1) and SA(2) denote address inputs, DO0 to DO2047 denote data outputs for one sector (2 Kbytes), DI0 to DI2047 denote data inputs for one sector, DO (ij) (i=1 to 3, j=1, 0) denotes a data output obtained after a read verify operation READi-VERIFYj accompanied with ith read READi, and RSC denotes a reset command.

The reading operation for a test according to the first embodiment is superior to the reading operation for a test according to the second embodiment in that data for one sector do not need to be input when the test is started.

Although the expectation data in a sector unit can be set optionally in the second embodiment, all the memory cells corresponding to the latches wired-OR connected to the decision result line in common should be set to have the same data in the first embodiment. Thus, the second embodiment is superior to the first embodiment in that a test pattern can be more complicated.

While the flash memory is taken as an example in the first and second embodiments, the present invention can be applied to semiconductor memories for carrying out a read test other than the flash memory, for example, nonvolatile semiconductor memories and volatile semiconductor memories.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:
   a plurality of memory cells, each of which can store N-valued information with N having a value that is greater than or equal to 2;
   data reading means for reading a predetermined number of read data from a predetermined number of memory cells out of said plurality of memory cells during a reading operation for a test; and
   deciding means for classifying said predetermined number of read data into K groups with K having a value that is greater than or equal to 2, generating at least K decision result signals indicating whether all said read data in said respective K groups are identical concurrently, and outputting a decision result based on said at least K decision result signals during said reading operation for a test.

2. The semiconductor memory according to claim 1, wherein K is equal to or greater than N,
   said memory cells include memory cells arranged in a matrix defined by first and second directions,
   said predetermined number of memory cells include memory cells provided in the same position in said second direction and provided in series in said first direction, and
   said deciding means classifies said predetermined number of read data such that said predetermined number of memory cells are classified into the same groups at N intervals in said second direction.

3. The semiconductor memory according to claim 2, wherein
   said N-value includes a $2^m$-value with m having a value greater than or equal to 1.

4. The semiconductor memory according to claim 1, said deciding means, including:
   sense storing means for sensing and storing said predetermined number of read data; and
   decision result output means for deciding whether all said read data in said respective K groups are identical based on stored contents of said sense storing means and for outputting a result of said decision.

5. The semiconductor memory according to claim 1, wherein
   said N-value is greater than or equal to 3,
   said reading operation for a test includes first to Lth partial reading operations for a test which have different reading conditions and said read data include first to Lth 1-bit read data, where L has a value that is greater than or equal to 2,
   said data reading means reads said predetermined number of first to Lth 1-bit read data during execution of said first to Lth partial reading operations for a test,
   said result of decision includes first to Lth partial decision results, and
   said deciding means outputs an ith partial decision result based on whether all ith 1 bit read data in said respective K groups are identical during an ith partial reading operation for a test, where i has a value of from 1 to L.

6. The semiconductor memory according to claim 1, wherein
   said memory cells include a memory cell for carrying out nonvolatile storage.

7. The semiconductor memory according to claim 6, wherein said memory cells include a memory cell having a flash memory structure.

8. A semiconductor memory comprising:

a plurality of memory cells, each of which can store N-valued information, with N having a value greater than or equal to 2;

data reading means for reading a predetermined number of read data from a predetermined number of memory cells out of said plurality of memory cells during a reading operation for a test;

expectation storing means for storing a predetermined number of expectation data; and deciding means for outputting a result of decision based on a result of comparison of said predetermined number of read data with said predetermined number of expectation data during said reading operation for a test.

9. The semiconductor memory according to claim 8, said deciding means, including:

sense storing means for sensing and storing said predetermined number of read data; and decision result output means for outputting said result of decision based on a result of comparison of stored contents of said sense storing means with stored contents of said expectation storing means.

10. The semiconductor memory according to claim 9, wherein said N-value is greater than or equal to 3, said reading operation for a test includes first to Lth partial reading operations for a test which have different reading conditions, said read data include first to Lth 1-bit read data and said expectation data include first to Lth 1-bit expectation data, where L has a value greater than or equal to 2, said data reading means reads said predetermined number of first to Lth 1-bit read data every execution of said first to Lth partial reading operations for a test, respectively, said result of decision includes first to Lth partial decision results, said deciding means outputs an ith partial decision result based on a result of comparison of said predetermined number of ith 1-bit read data with said predetermined number of ith 1-bit expectation data during said ith partial reading operation for a test, where i has a value of from 1 to L, and said predetermined number of second to Lth 1-bit expectation data are obtained by changing said predetermined number of first to (L−1)th 1-bit expectation data based on the stored contents of said expectation storing means and said sense storing means, respectively.

11. The semiconductor memory according to claim 8, wherein said expectation storing means includes data storing means for temporarily storing data when transmitting and receiving data between said memory cells and an outside.

12. The semiconductor memory according to claim 8, wherein said memory cells include a memory cell for carrying out nonvolatile storage.

13. The semiconductor memory according to claim 12, wherein said memory cells include a memory cell having a flash memory structure.

* * * * *

UNITED STATES PATENT AND TRADEMARK OFFICE
CERTIFICATE OF CORRECTION

PATENT NO.    : 6,385,084 B1
DATED         : May 7, 2002
INVENTOR(S)   : Tamada et al.

It is certified that error appears in the above-identified patent and that said Letters Patent is hereby corrected as shown below:

<u>Title page,</u>
Item [30], Foreign Application Data is incorrect. Item [30] should read as follows:
-- [30]         Foreign Application Priority Data
Jun. 14, 2000    (JP) -------------------------------------------------- P2000-178288 --

Signed and Sealed this

Twenty-fourth Day of September, 2002

Attest:

Attesting Officer

JAMES E. ROGAN
*Director of the United States Patent and Trademark Office*